(12) United States Patent
Jang et al.

(10) Patent No.: US 12,284,864 B2
(45) Date of Patent: Apr. 22, 2025

(54) DISPLAY APPARATUS AND MULTI-SCREEN DISPLAY APPARATUS INCLUDING THE SAME

(71) Applicant: LG Display Co., Ltd., Seoul (KR)

(72) Inventors: YoungIn Jang, Paju-si (KR); KyungMin Kim, Paju-si (KR); EunJi Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 681 days.

(21) Appl. No.: 17/552,034

(22) Filed: Dec. 15, 2021

(65) Prior Publication Data

US 2022/0199952 A1     Jun. 23, 2022

(30) Foreign Application Priority Data

Dec. 17, 2020    (KR) ........................ 10-2020-0177154

(51) Int. Cl.
| | |
|---|---|
| *H01L 21/78* | (2006.01) |
| *H10K 50/844* | (2023.01) |
| *H10K 59/131* | (2023.01) |
| *H01L 25/10* | (2006.01) |
| *H10K 59/122* | (2023.01) |
| *H10K 59/124* | (2023.01) |

(52) U.S. Cl.
CPC ......... *H10K 50/844* (2023.02); *H10K 59/131* (2023.02); *H01L 25/105* (2013.01); *H10K 59/122* (2023.02); *H10K 59/124* (2023.02)

(58) Field of Classification Search
CPC .. H10K 50/844; H10K 59/131; H10K 59/122; H10K 59/124; H10K 59/18; H10K 59/12; H10K 59/1315; H10K 50/8426; H01L 25/105; G09G 3/3225
USPC .......................................................... 257/91
See application file for complete search history.

(56) References Cited

U.S. PATENT DOCUMENTS

| | | | |
|---|---|---|---|
| 9,129,923 B1 | 9/2015 | Han et al. | |
| 9,709,844 B2 * | 7/2017 | Yim | ........................ H01L 25/50 |
| 9,818,807 B2 * | 11/2017 | Park | ...................... H10K 59/122 |
| 9,954,043 B2 | 4/2018 | Park et al. | |
| 10,164,211 B2 | 12/2018 | Kim et al. | |
| 10,340,317 B2 * | 7/2019 | Oh | ......................... H10K 59/40 |
| 10,381,420 B2 * | 8/2019 | Liu | ........................ G06F 3/0445 |

(Continued)

FOREIGN PATENT DOCUMENTS

| | | |
|---|---|---|
| CN | 111462640 A | 7/2020 |
| EP | 3343273 A2 | 7/2018 |

(Continued)

*Primary Examiner* — Vu A Vu
(74) *Attorney, Agent, or Firm* — SEED IP LAW GROUP LLP

(57) ABSTRACT

A light emitting display apparatus may include a display portion including a plurality of pixel areas disposed on a substrate, a circuit layer including a plurality of pixel driving lines disposed in the plurality of pixel areas, a light emitting device layer including a light emitting layer disposed on the circuit layer in the plurality of pixel areas, an encapsulation layer disposed on the light emitting device layer, and a routing portion surrounding a front periphery portion and an outer surface of the substrate and including a plurality of routing lines which pass through the encapsulation layer disposed at the front periphery portion of the substrate to be connected to the plurality of pixel driving lines.

19 Claims, 29 Drawing Sheets

(56) References Cited

U.S. PATENT DOCUMENTS

| | | | |
|---|---|---|---|
| 11,217,575 B2* | 1/2022 | Zhai | H10K 59/873 |
| 11,239,122 B2* | 2/2022 | Jung | H01L 22/32 |
| 11,239,304 B2* | 2/2022 | Park | H10K 59/124 |
| 11,251,399 B2* | 2/2022 | Sun | H10K 59/131 |
| 11,462,605 B2* | 10/2022 | Han | H10K 50/844 |
| 11,527,588 B2* | 12/2022 | Choi | H04M 1/026 |
| 11,569,464 B2* | 1/2023 | Park | H10K 59/123 |
| 11,706,942 B2* | 7/2023 | Bang | H10K 50/844 |
| | | | 257/40 |
| 11,925,052 B2* | 3/2024 | Seo | H10K 59/65 |
| 2016/0276311 A1 | 9/2016 | Meyer et al. | |
| 2016/0307971 A1 | 10/2016 | Jeon | |
| 2018/0190631 A1 | 7/2018 | Kim et al. | |
| 2018/0329552 A1 | 11/2018 | Song et al. | |
| 2019/0131572 A1 | 5/2019 | Gwon et al. | |
| 2019/0189729 A1 | 6/2019 | Zhang et al. | |
| 2020/0013846 A1 | 1/2020 | Kwon et al. | |
| 2020/0051966 A1 | 2/2020 | Lee et al. | |
| 2020/0136069 A1 | 4/2020 | Paek et al. | |
| 2021/0225994 A1* | 7/2021 | Long | H10K 50/844 |

FOREIGN PATENT DOCUMENTS

| | | |
|---|---|---|
| EP | 3343274 A2 | 7/2018 |
| KR | 10-2015-0128038 A | 11/2015 |
| KR | 10-2017-0080779 A | 7/2017 |
| KR | 10-2018-0047535 A | 5/2018 |
| KR | 10-2019-0043799 A | 4/2019 |
| KR | 10-2020-0049329 A | 5/2020 |
| TW | 201843792 A | 12/2018 |

\* cited by examiner

410: 411, 413, 415, 417, 419   115: 115a, 115b, 115c, 115d
118: 118a, 118b, 118c, 118d, 118e

DISPLAY APPARATUS AND MULTI-SCREEN DISPLAY APPARATUS INCLUDING THE SAME

CROSS-REFERENCE TO RELATED APPLICATIONS

This application claims the benefit of the Korean Patent Application No. 10-2020-0177154, filed Dec. 17, 2020, which is hereby incorporated by reference as if fully set forth herein.

BACKGROUND

Technical Field

The present disclosure relates to a light emitting display apparatus and a multi-screen light emitting display apparatus including the same.

Description of the Related Art

Light emitting display apparatuses which are self-emitting light emitting display apparatuses, do not need a separate light source unlike liquid crystal display (LCD) apparatuses, and thus, they can be manufactured to be lightweight and thin. Also, light emitting display apparatuses are driven with a low voltage and thus is reduced in power consumption. Further, light emitting display apparatuses are good in color implementation, response time, viewing angle, and contrast ratio, and thus, are attracting much attention as the next-generation light emitting display apparatuses.

Light emitting display apparatuses display an image on the basis of the light emission of a light emitting device layer including a light emitting device disposed between two electrodes. In this case, light emitted by the light emitting device is discharged to the outside through an electrode and a substrate.

Light emitting display apparatuses include a display panel implemented to display an image. The display panel can include a display area, including a plurality of pixels for displaying an image, and a bezel area surrounding the display area.

A light emitting display apparatus of the related art needs a bezel or a mechanism for covering a bezel area disposed at a border (or a periphery portion) of a display panel. Further, the light emitting display apparatus of the related art has a large bezel width (e.g., a large width of the bezel) due to the presence of the bezel. Also, when the bezel width of the light emitting display apparatus is reduced below a certain limit, a light emitting device can be degraded by penetration of external, foreign materials such as water or moisture, and due to this, the reliability of the light emitting device can be reduced.

Recently, multi-screen light emitting display apparatuses have been commercialized where a large screen is implemented by arranging the light emitting display apparatuses as a lattice type.

BRIEF SUMMARY

The inventors of the present disclosure have appreciated that, in a multi-screen light emitting display apparatus of the related art, a boundary portion such as a seam is formed between adjacent light emitting display apparatuses due to the existence of a bezel area or a bezel of each of a plurality of light emitting display apparatuses. The inventors have recognized that the boundary portion can cause a sense of discontinuity (or non-continuously) of an image when a single image (or a stream of images) is being displayed on an assembled total screen of the multi-screen light emitting display apparatus. Further, due to this, the immersion of a viewer and the user experience of a viewer watching the image (or video) can be substantially reduced.

Accordingly, the inventors of the present disclosure provided one or more embodiments of a light emitting display apparatus and a multi-screen display apparatus including the same that substantially obviate one or more problems due to limitations and disadvantages of the related art. One or more embodiments as provided by the inventors also addresses other technical problems in the related art not set forth above.

An aspect of the present disclosure is directed to providing a light emitting display apparatus and a multi-screen display apparatus including the same, which prevent the reliability of a light emitting device from being reduced by the penetration of external, foreign materials such as water or moisture.

Another aspect of the present disclosure is directed to providing a light emitting display apparatus and a multi-screen display apparatus including the same, which include a zero bezel and prevent the reliability of a light emitting device from being reduced by the penetration of water or moisture. The term "zero bezel" or "air bezel" is used to indicate a display apparatus having a substantially small bezel or no bezel at all. For example, in some embodiments, a display apparatus with a zero bezel includes a display having a bezel with a selected width. However, the width of the bezel or the bezel width is below a threshold width so that when two or more displays are assembled together, the bezel width is not recognizable to the viewer to impact the immersion of the viewer or the viewer's user experience. The threshold width may vary depending on various factors including, but not limited to, the distance from the multi-screen display to one or more viewers, the viewer's perception, or the like. In other embodiments, a display apparatus with a zero bezel includes a display having no bezel at all or a display that has '0 (zero)' bezel width.

Another aspect of the present disclosure is directed to providing a light emitting display apparatus and a multi-screen display apparatus including the same, which display an image without a sense of discontinuity in a case which displays one image on a whole screen.

Additional advantages and features of the disclosure will be set forth in part in the description which follows and in part will become apparent to those having ordinary skill in the art upon examination of the following or may be learned from practice of the disclosure. The technical benefits of the disclosure may be realized and attained by the structure particularly pointed out in the written description and claims hereof as well as the appended drawings.

To achieve these and other advantages, as embodied and broadly described herein, there is provided a light emitting display apparatus includes a substrate, a display portion including a plurality of pixel areas disposed on the substrate, a circuit layer including a plurality of pixel driving lines disposed in the plurality of pixel areas, a light emitting device layer including a light emitting layer disposed on the circuit layer in the plurality of pixel areas, an encapsulation layer disposed on the light emitting device layer, and a routing portion surrounding a front periphery portion and an outer surface of the substrate and including a plurality of routing lines which pass through the encapsulation layer disposed at the front periphery portion of the substrate to be connected to the plurality of pixel driving lines.

A multi-light emitting display apparatus according to some embodiments of the present disclosure includes a plurality of display devices disposed along at least one direction of a first direction and a second direction crossing the first direction, each of the plurality of display devices comprises a light emitting display apparatus, the light emitting display apparatus includes a substrate, a display portion including a plurality of pixel areas disposed on the substrate, a circuit layer including a plurality of pixel driving lines disposed in the plurality of pixel areas, a light emitting device layer including a light emitting layer disposed on the circuit layer in the plurality of pixel areas, an encapsulation layer disposed on the light emitting device layer, and a routing portion surrounding a front periphery portion and an outer surface of the substrate and including a plurality of routing lines which pass through the encapsulation layer disposed at the front periphery portion of the substrate to be connected to the plurality of pixel driving lines.

An embodiment of the present disclosure may provide a light emitting display apparatus and a multi-screen display apparatus including the same, which prevent the reliability of a light emitting device from being reduced by the penetration of water or moisture.

An embodiment of the present disclosure may provide a light emitting display apparatus and a multi-screen display apparatus including the same, which include a zero bezel and prevent the reliability of a light emitting device from being reduced by the penetration of water or moisture.

According to some embodiments of the present disclosure, a light emitting display apparatus including no bezel and a multi-screen light emitting display apparatus including the light emitting display apparatus can be provided.

According to some embodiments of the present disclosure, a multi-screen light emitting display apparatus for displaying an image without a sense of discontinuity can be provided.

It is to be understood that both the foregoing general description and the following detailed description of the present disclosure are explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION

Figure 1:
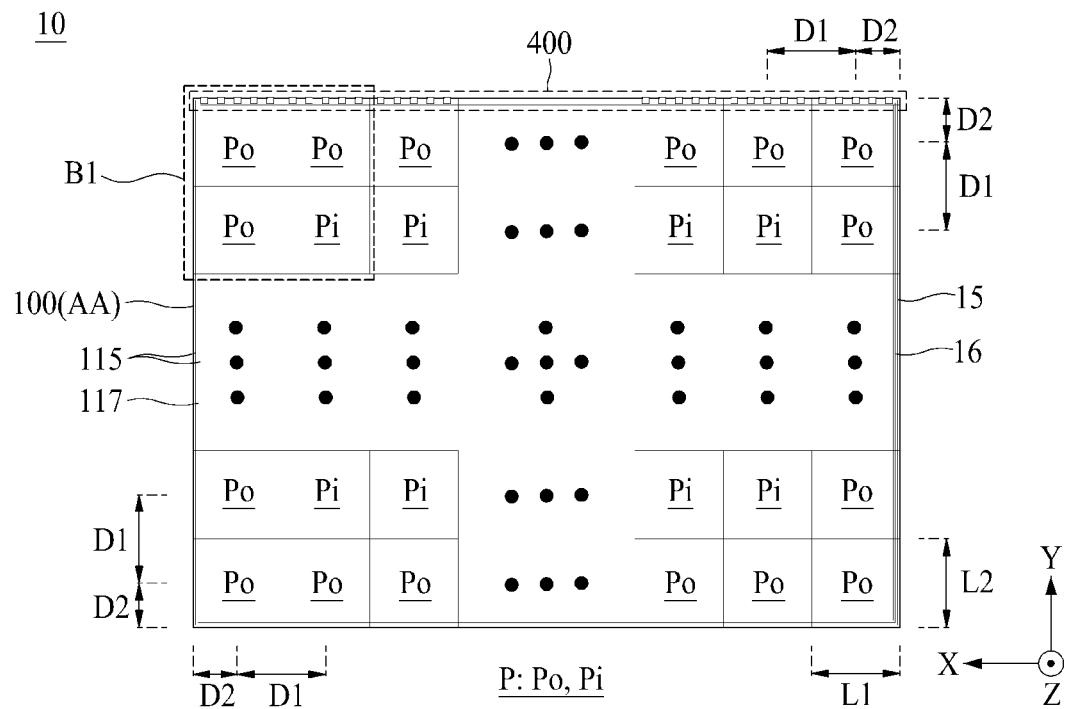
FIG. 1 is a plan view illustrating a light emitting display apparatus according to an embodiment of the present disclosure.

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Same reference numerals refer to same elements throughout. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

The term "surround" as used herein includes at least partially surrounding as well as entirely surrounding one or more of the associated elements. Similarly, the term "cover" as used herein includes at least partially covering as well as entirely covering one or more of the associated elements. For example, if an encapsulation layer surrounds a dam pattern, this may be construed as the encapsulation layer at least partially surrounding the dam pattern. However, in some embodiments, the encapsulation layer may entirely surround the dam pattern. The meaning in which the term "surround" is used herein can be further specified based on the associated drawings and embodiments. In the present disclosure, the terms "surround," "at least partially surround," "completely surround" or the like is used. In accordance with the definition of "surround" as set forth above, when only the term "surround" is used in an embodiment, it may mean either at least partially surrounding or entirely surrounding one or more of the associated elements. The same applies for the term "cover."

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

Figure 2:
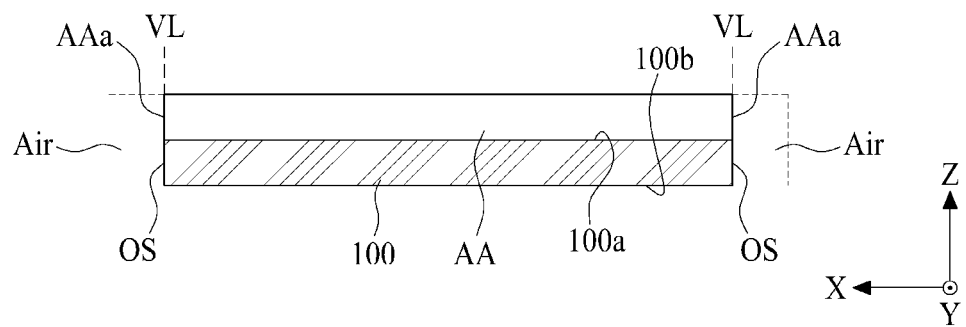
FIG. 2 is a side view schematically illustrating a light emitting display apparatus according to an embodiment of the present disclosure.

FIG. 1 is a plan view illustrating a light emitting display apparatus according to an embodiment of the present disclosure, and FIG. 2 is a side view schematically illustrating a light emitting display apparatus according to an embodiment of the present disclosure.

Referring to FIGS. 1 and 2, the light emitting display apparatus (or a light emitting display panel) 10 according to the present disclosure may include a substrate 100 including a display area AA and a plurality of pixels P in the display area AA of the substrate 100.

The substrate 100 may be referred to as a first substrate, a base substrate, or a pixel array substrate. For example, the substrate 100 may include a glass material or a plastic material. The substrate 100 may be a glass substrate, or may be a thin glass substrate or a plastic substrate, which is bendable or flexible.

The substrate 100 may include a first surface (adjacet to the edge) 100a, a second surface 100b, and an outer surface OS. The first surface 100a of the substrate 100 may be defined as a front surface, a top surface, or an upper surface facing a front surface (or a forward direction) of the light emitting display apparatus. The second surface 100b of the substrate 100 may be defined as a back surface, a rear surface, a bottom surface, or a lower surface facing a back surface (or a rearward direction) of the light emitting display apparatus. The outer surface OS of the substrate 100 may be defined as a side surface, a lateral surface, or a sidewall, which extends along an outer periphery between the first surface 100a and the second surface 100b, faces the lateral surface (or the lateral direction) of the light emitting display apparatus, and is exposed to ambient air.

The display area AA of the substrate 100 may be an area which displays an image and may be referred to as an active portion, an active area, a display portion, or a display part. A size of the display area AA may be the same as or substantially the same as the substrate 100 (or the light emitting display apparatus or the light emitting display panel). For example, a size of the display area AA may be the same as a total size of the first surface 100a of the substrate 100. Therefore, the display area AA may be implemented (or disposed) on the whole front surface of the substrate 100, and thus, the substrate 100 may not include an opaque non-display area which is provided along a periphery portion (or an edge portion) of the first surface 100a to surround all of the display area AA, the periphery portion being adjacent to outer surfaces of the substrate 100 and located wthin the display area AA. Accordingly, a whole front surface of the light emitting display apparatus may implement the display area AA.

An end (or an outermost portion or a lateral surface) AAa of the display area AA may overlap or may be substantially aligned with the outer surface OS of the substrate 100. For example, the end AAa of the display area AA may be substantially coplanar with the outer surface OS of the first substrate 100. For example, with respect to a thickness direction Z of the substrate 100, an end AAa of the display area AA and a vertical extension line VL vertically extending from the outer surface OS of the substrate 100 may overlap each other or may be aligned on substantially the same plane. That is, the end AAa of the display area AA may not be surrounded by a separate mechanism and may only be abutting ambient air. For example, all lateral surfaces of the display area AA may be provided in a structure which directly contacts air without being surrounded by a separate mechanism. Therefore, the outer surface OS of the substrate 100 corresponding to the end AAa of the display area AA may be surrounded by only air (or abutting ambient air), and thus, the light emitting display apparatus according to the present disclosure may have an air-bezel structure or a non-bezel structure where the end AAa of the display area AA (or the lateral surface of the display area AA) is surrounded by air instead of an opaque non-display area.

The plurality of pixels P may be arranged (or disposed) in the first interval D1 at the display area AA of the substrate 100. For example, the plurality of pixels P may be arranged (or disposed) at the display area AA of the substrate 100 to have the first interval D1 along a first direction X and a second direction Y. For example, the first direction X may traverse (or cross) to the second direction Y. The first direction X may be a widthwise direction, a horizontal direction, or a first length direction (for example, a widthwise length direction) of the substrate 100 or the light emitting display apparatus. The second direction Y may be a lengthwise direction, a vertical direction, or a second length direction (for example, a lengthwise length direction) of the substrate 100 or the light emitting display apparatus.

Each of the plurality of pixels P may be implemented on a plurality of pixel areas defined on the display area AA of the substrate 100. Each of the plurality of pixels P may have a first length L1 parallel to the first direction X and a second length L2 parallel to the second direction Y. The first length L1 may be the same as the second length L2 or the first interval D1. The first length L1 and the second length L2 may be the same as the first interval D1. Therefore, the plurality of pixels (or pixel areas) P may all have the same size. For example, the first length L1 can be referred to as a first width, a widthwise length, or a widthwise width. The second length L2 can be referred to as a second width, a lengthwise length, or a lengthwise width.

Two pixels P adjacent to each other along each of the first direction X and the second direction Y may have the same first interval D1 within an error range of a manufacturing process. The first interval D1 may be a pitch (or a pixel pitch) between two adjacent pixels P. For example, the first length L1 or the second length L2 of the pixel P may be referred to as the pixel pitch. For example, the first interval (or the pixel pitch) D1 may be a shortest distance (or a shortest length) between center portions of two adjacent pixels P.

Each of the plurality of pixels P may be include a circuit layer including a pixel circuit implemented in the pixel area on the substrate 100, and a light emitting device layer disposed on the circuit layer and connected to the pixel circuit. The pixel circuit outputs a data current corresponding to the data signal in response to the data signal and the scan signal supplied from the pixel driving lines disposed in the pixel area. The light emitting device layer may include a light emitting layer that emits light by the data current supplied from the pixel circuit. The pixel driving lines, the pixel circuit, and the light emitting device layer will be described below.

The plurality of pixels P may be divided (or classified) into outermost pixels Po and internal pixels (or inner pixels) Pi.

The outermost pixels Po may be pixels disposed closest to the outer surface OS of the substrate 100 among the plurality of pixels P. For example, the outermost pixels Po may be referred to as a first pixel P1.

A second interval D2 between a center portion of each of the outermost pixels Po and the outer surface OS of the substrate 100 may be half of the first interval D1, or less than hlaf of the first interval D1. For example, the second interval D2 may be a distance (or a length) between a center portion of the outermost pixel area PAo (see FIG. 4) and the outer surface OS of the substrate 100. For example, the second interval D2 may be a shortest distance (or a shortest length)

between a center portion of the outermost pixel area PAo and the outer surface OS of the substrate 100.

When the second interval D2 is greater than half of the first interval D1, the substrate 100 may have a greater size than the display area AA by a difference area between half of the first interval D1 and the second interval D2, and thus, an area between the end of the outermost pixel Po and the outer surface OS of the substrate 100 may be configured as a non-display area surrounding all of the display area AA. For example, when the second interval D2 is greater than half of the first interval D1, the substrate 100 may necessarily include a bezel area based on a non-display area surrounding all of the display area AA. On the other hand, when the second interval D2 is half or less of the first interval D1, the end of each of the outermost pixels Po may be aligned whin (or disposed on) the outer surface OS of the substrate 100, or the end AAa of the display area AA may be aligned whith (or disposed on) the outer surface OS of the substrate 100, and thus, the display area AA may be implemented (or disposed) on the whole front surface of the substrate 100.

The internal pixels Pi may be pixels other than the outermost pixels Po among the plurality of pixels P, or may be pixels surrounding by the outermost pixels Po among the plurality of pixels P. For example, the internal pixels Pi may be referred to as a second pixel P2. The internal pixels Pi (or the second pixel P2) may be implemented to have a configuration or a structure, which differs from the outermost pixels Po (or the first pixel P1).

The light emitting display apparatus 10 according to an embodiment of the present disclosure may further include a discontinuity portion 115. The discontinuity portion 115 may also be referred to as a discontinuity wall 115.

Figure 9:
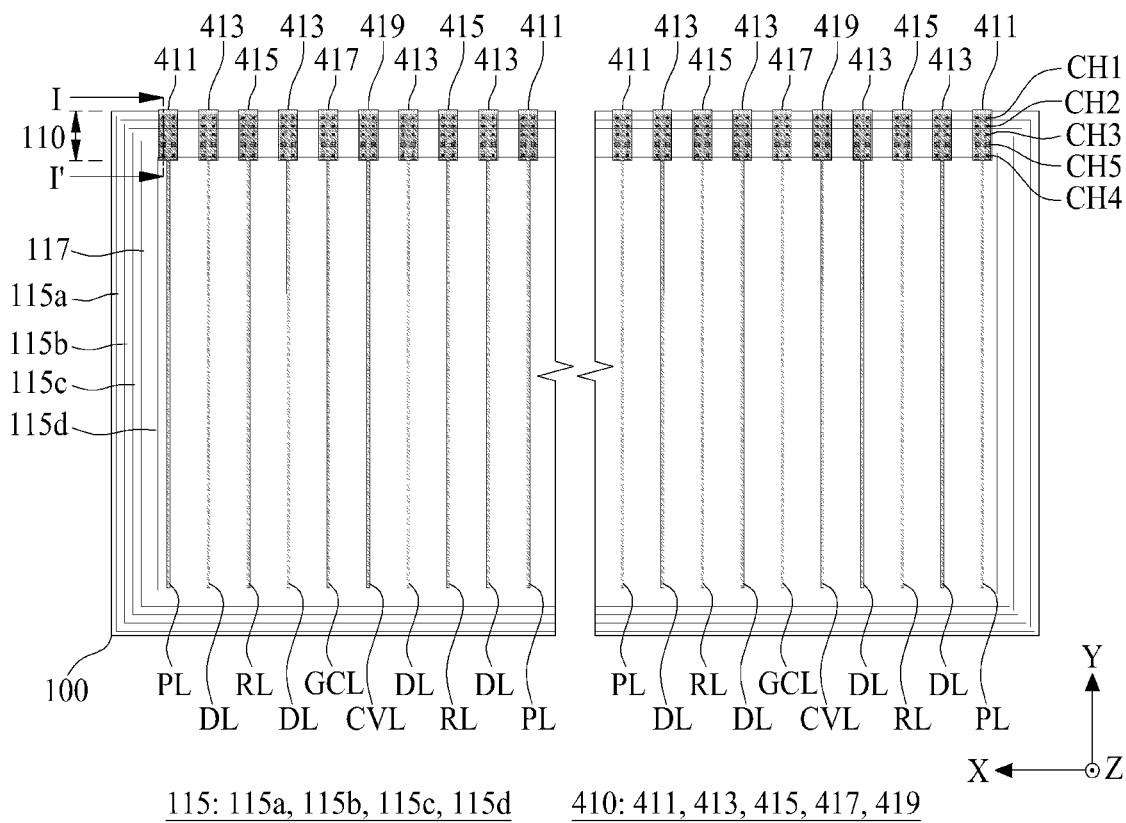
FIG. 9 is a diagram illustrating a connection structure of a pixel driving line and a routing portion according to an embodiment of the present disclosure.

The discontinuity portion 115 may be disposed along a periphery portion of the substrate 100. The discontinuity portion 115 may be implemented in a closed loop form at the periphery portion of the substrate 100. For example, FIG. 9 illustrates the discontinuity portion 115 as continuously surrounding the substrate 100 at the periphery portion of the substrate 100 in a closed loop manner. The discontinuity portion 115 may be included in outermost pixels Po, or may be disposed on periphery portions of the outermost pixels Po. For example, the discontinuity portion 115 may be disposed between center portions of the outermost pixels Po and an outer surface OS of the substrate 100, and thus, may be implemented to have a configuration or a structure which differs from that of an inner pixel Pi. The discontinuity portion 115 may be included or disposed in the outermost pixels Po, and thus, the light emitting display apparatus 10 according to an embodiment of the present disclosure may have a zero bezel structure (or an air bezel structure), whereby a whole front surface of the substrate 100 may be implemented as a display portion AA.

The discontinuity portion 115 may isolate, at least once, a light emitting layer formed at the periphery portion of the substrate 100, and thus, may block the penetration of water or moisture in a lateral direction of the substrate 100, thereby preventing the light emitting layer from being degraded or the reliability of the light emitting layer from being reduced by the penetration of water or moisture. The discontinuity portion 115 according to an embodiment of the present disclosure may include a plurality of discontinuity portions which are arranged in parallel. In some embodiments, the discontinuity portion 115 may also be referred to as a discontinuity wall. The discontinuity wall prevents any external, foreign materials such as moisture or water from permeating into light emitting layer. In one or more embodiments, there are a plurality of discontinuity walls to ensure that the light emitting layers are protected from external, foreign materials. In some instances, a dam or a dam portion 117 having a different height from the discontinuity wall may be arranged within the plurality of discontinuity walls. The dam may also function as a blocking wall for preventing any infiltration of external, foreign materials. The dam may have various heights and may have various numbers to protect the light emitting layers. The dam may have a higher height than the discontinuity wall. The discontinuity portion 115 and the dam portion 117 will be described below.

The light emitting display apparatus 10 according to an embodiment of the present disclosure may further include a dam portion 117 and an encapsulation layer disposed on the light emitting device layer and the dam portion 117.

The dam portion 117 may be disposed along the periphery portion of the substrate 100. The dam portion 117 may be implemented in a closed loop form at the periphery portion of the substrate 100. The dam portion 117 may be included in the outermost pixels Po, or may be disposed at periphery portions of the outermost pixels Po. For example, the dam portion 117 may be disposed between the center portions of the outermost pixels Po and the outer surface of the discontinuity portion 115. The dam portion 117 may be surrounded by the discontinuity portion 115. The outermost pixels Po may include the dam portion 117, and thus, may be implemented to have a configuration or a structure which differs from that of the inner pixel Pi. The discontinuity portion 115 and the dam portion 117 may be included or disposed in the outermost pixels Po, and thus, the light emitting display apparatus 10 according to an embodiment of the present disclosure may have the zero bezel structure (or the air bezel structure), whereby the whole front surface of the substrate 100 may be implemented as the display portion AA.

The encapsulation layer may be implemented to surround the light emitting device layer, and the encapsulation layer may be on the discontinuity portion 115. The encapsulation layer according to an embodiment of the present disclosure may include a first inorganic encapsulation layer (or a first encapsulation layer) disposed on the light emitting device layer and the dam portion 117, a second inorganic encapsulation layer (or a third encapsulation layer) disposed on the first inorganic encapsulation layer, and an organic encapsulation layer (or a second encapsulation layer) between the second encapsulation layer and the first encapsulation layer disposed on the light emitting device layer surrounded by the dam portion 117. The encapsulation layer will be described below.

The dam portion 117 may define or limit a disposition region (or a formation region) of the organic encapsulation layer covering a front surface (or a top surface) of the light emitting device layer. The dam portion 117 may block or prevent the overflow of the organic encapsulation layer.

The light emitting display apparatus 10 according to an embodiment of the present disclosure may further include a routing portion 400.

The routing portion 400 may be implemented to wound or surround one side periphery portion (or also referred to as a first periphery portion) of the periphery portion of the substrate 100 and one surface of the substrate 100. A periphery portion of a substrate may include an area that is adjacent to the outermost surfaces of the substrate. For example, a display apparatus having a rectangular shape will have four periphery portions as there will be four outermost surfaces (or at least four outermost surfaces) in the substrate of the display apparatus. The routing portion 400 is located in one of the periphery portions as illustrated in FIG. 1. In some embodiments, one side periphery portion refers to one side of the periphery portion. For example, the one side of the periphery portion may include the outer surface OS.

The routing portion 400 may be included in the outermost pixels Po disposed at the one side periphery portion of the substrate 100, or may be disposed at periphery portions of the outermost pixels Po disposed at the one side periphery portion of the substrate 100. The outermost pixels Po disposed at the one side periphery portion of the substrate 100 may include the routing portion 400, and thus, may be implemented to have a configuration or a structure which differs from that of the inner pixel Pi. The routing portion 400 may be referred to as a side routing portion or a printing line portion.

The routing portion 400 may pass through the encapsulation layer and a circuit layer disposed in the periphery portion of the substrate 100 and may be electrically connected to a plurality of pixel driving lines. The routing portion 400 according to an embodiment of the present disclosure may sequentially pass through the encapsulation layer, the discontinuity portion 115, and the circuit layer and may be electrically connected to the plurality of pixel driving lines. The routing portion 400 according to an embodiment of the present disclosure may sequentially pass through the encapsulation layer, the dam portion 117, and the circuit layer and may be electrically connected to the plurality of pixel driving lines. The routing portion 400 according to an embodiment of the present disclosure may sequentially pass through the encapsulation layer, the discontinuity portion 115, and the circuit layer and may be electrically connected to the plurality of pixel driving lines, and moreover, may sequentially pass through the encapsulation layer, the dam portion 117, and the circuit layer and may be electrically connected to the plurality of pixel driving lines. The routing portion 400 will be described below.

The discontinuity portion 115, the dam portion 117, and the routing portion 400 may be included or disposed in the outermost pixels Po, and thus, the light emitting display apparatus 10 according to an embodiment of the present disclosure may have the zero bezel structure (or the air bezel structure), whereby the whole front surface of the substrate 100 may be implemented as the display portion AA.

Figure 3A:
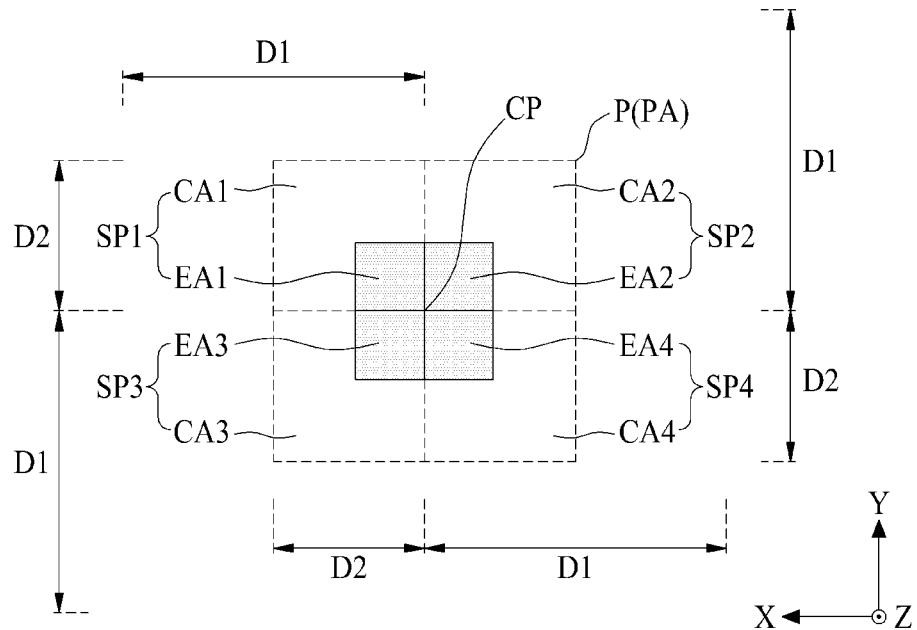
FIG. 3A is a diagram illustrating one pixel according to an embodiment of the present disclosure illustrated in FIG. 1.
Figure 3B:
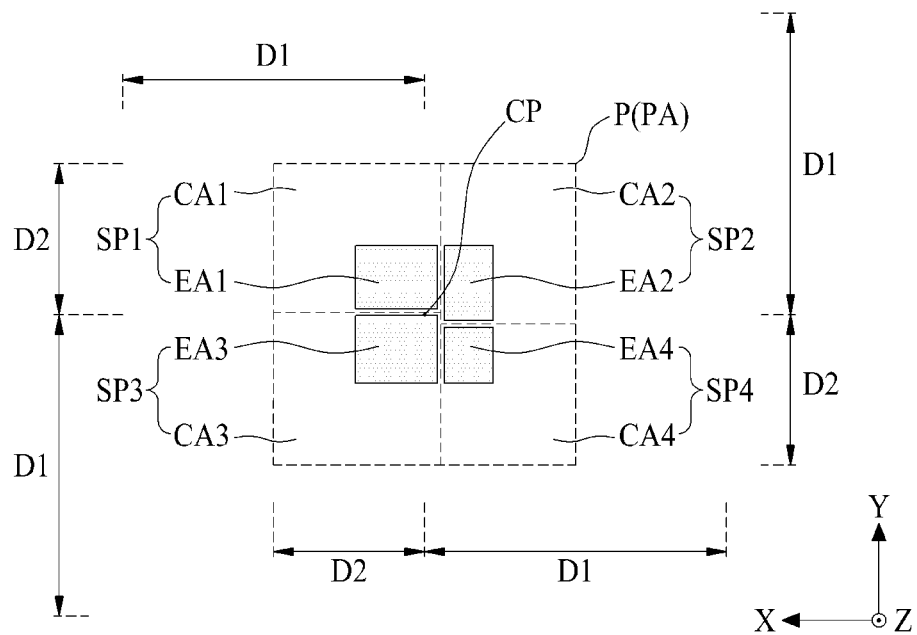
FIG. 3B is a diagram illustrating one pixel according to another embodiment of the present disclosure illustrated in FIG. 1.

FIG. 3A is a diagram illustrating one pixel according to an embodiment of the present disclosure illustrated in FIG. 1, and FIG. 3B is a diagram illustrating one pixel according to another embodiment of the present disclosure illustrated in FIG. 1.

Referring to FIGS. 1 and 3A, one pixel (or a unit pixel) P according to an embodiment of the present disclosure may include first to fourth subpixels SP1 to SP4.

The first subpixel SP1 may be disposed in a first subpixel area of the pixel area PA, the second subpixel SP2 may be disposed in a second subpixel area of the pixel area PA, the third subpixel SP3 may be disposed in a third subpixel area of the pixel area PA, and the fourth subpixel SP4 may be disposed in a fourth subpixel area of the pixel area PA.

As an embodiment of the present disclosure, the first subpixel SP1 may be implemented to emit light of a first color, the second subpixel SP2 may be implemented to emit light of a second color, the third subpixel SP3 may be implemented to emit light of a third color, and the fourth subpixel SP4 may be implemented to emit light of a fourth color. Each of the first to fourth colors may be different. For example, the first color may be red, the second color may be blue, the third color may be white, and the fourth color may be green.

As another embodiment of the present disclosure, some of the first to fourth colors can be the same. For example, the first color may be red, the second color may be first green, the third color may be second green, and the fourth color may be blue.

The first to fourth subpixels SP1 to SP4 may respectively include a plurality of emission areas EA1 to EA4 and a plurality of circuit areas CA1 to CA4.

The emission areas EA1 to EA4 may be disposed at the center portion CP of the pixel P, or may be disposed close to the central portion of the pixel P. The first to fourth subpixels SP1 to SP4 may be respectively referred to as an opening area, an opening portion, a light emitting portion, a light generating area, or a light generating portion.

The emission areas EA1 to EA4 of each of the first to fourth subpixels SP1 to SP4 according to an embodiment may be implemented to have the same size (or same area). For example, the emission areas EA1 to EA4 of each of the first to fourth subpixels SP1 to SP4 may have a uniform quad structure or a uniform stripe structure. For example, in the first to fourth subpixels SP1 to SP4 having a uniform quad structure (or a uniform stripe structure), each of the emission areas EA1 to EA4 may be disposed close to a center portion of the pixel P to have a size which is less than that of each of four equal division regions of the pixel P or may be disposed to be concentrated on the center portion of the pixel P.

Referring to FIGS. 1 and 3B, each of the first to fourth subpixels SP1 to SP4 according to another embodiment may have a non-uniform quad structure or a non-uniform stripe structure having different sizes. For example, each of the emission areas EA1 to EA4 of each of the first to fourth subpixels SP1 to SP4 may have a non-uniform quad structure or a non-uniform stripe structure. For example, the emission areas EA1 to EA4 of the first to fourth subpixels SP1 to SP4 may be implemented to have different sizes around (or near) the central portion of the pixel P.

A size of each of the emission areas EA1 to EA4 of each of the first to fourth subpixels SP1 to SP4 having a non-uniform quad structure (or a non-uniform stripe structure) may be set based on a resolution, emission efficiency, or image quality. When the emission areas EA1 to EA4 have a non-uniform quad structure (or a non-uniform stripe structure), among the emission areas EA1 to EA4 of the first to fourth subpixels SP1 to SP4, the emission area EA4 of the fourth subpixel SP4 may have a smallest size, and the emission area EA3 of the third subpixel SP3 may have a largest size. For example, each of the emission areas EA1 to EA4 of each of the first to fourth subpixels SP1 to SP4 having a non-uniform quad structure (or a non-uniform stripe structure) may be disposed to be concentrated around (or near) the center portion of the pixel P.

The circuit areas CA1 to CA4 of each of the first to fourth subpixels SP1 to SP4 may be disposed around (or near) a corresponding emission area among the emission areas EA1 to EA4. Each of the circuit areas CA1 to CA4 may include a circuit and pixel driving lines for emitting a corresponding subpixel among the first to fourth subpixels SP1 to SP4. For example, the circuit areas CA1 to CA4 may be referred to as a non-emission area, a non-opening area, a non-emission portion, a non-opening portion, or a periphery portion.

Alternatively, in order to increase an aperture ratio of the subpixels SP1 to SP4 corresponding to sizes of the emission areas EA1 to EA4 or decrease the pixel pitch D1 as a resolution of the pixel P is higher, the emission areas EA1 to EA4 of the first to fourth subpixels SP1 to SP4 may extend to the circuit areas CA1 to CA4 to overlap some or all of the circuit areas CA1 to CA4. For example, each of the emission areas EA1 to EA4 of the first to fourth subpixels SP1 to SP4 may be implemented on the substrate 100 to overlap a corresponding circuit area of the circuit areas CA1 to CA4. In this case, each of the emission areas EA1 to EA4 may have a size which is equal to or greater than that of the corresponding circuit areas CA1 to CA4.

Alternatively, each of the plurality of pixels P according to another embodiment of the present disclosure may include first to third subpixels SP1 to SP3.

The emission areas EA1 to EA3 of the first to third subpixels SP1 to SP3 may respectively have a rectangular shape which includes a short side parallel to the first direction X and a long side parallel to the second direction Y, and for example, may be disposed a 1×3 form or a 1×3 stripe form. For example, the first subpixel may be a red subpixel, the second subpixel may be a blue subpixel, and the third subpixel may be a green subpixel, but embodiments of the present disclosure are not limited thereto.

Figure 4:
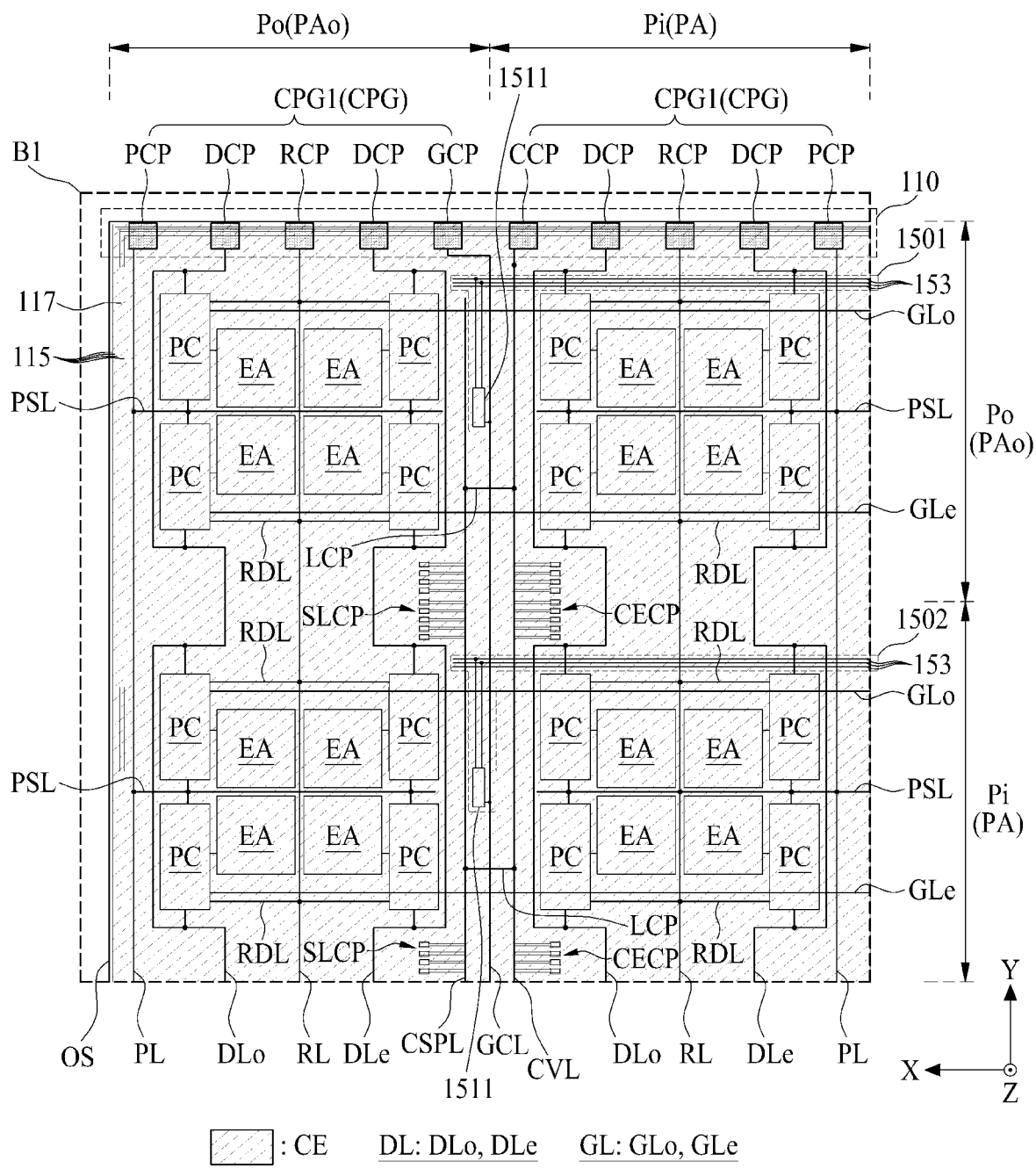
FIG. 4 is an enlarged view of a region B1 illustrated in FIG. 1.
Figure 5:
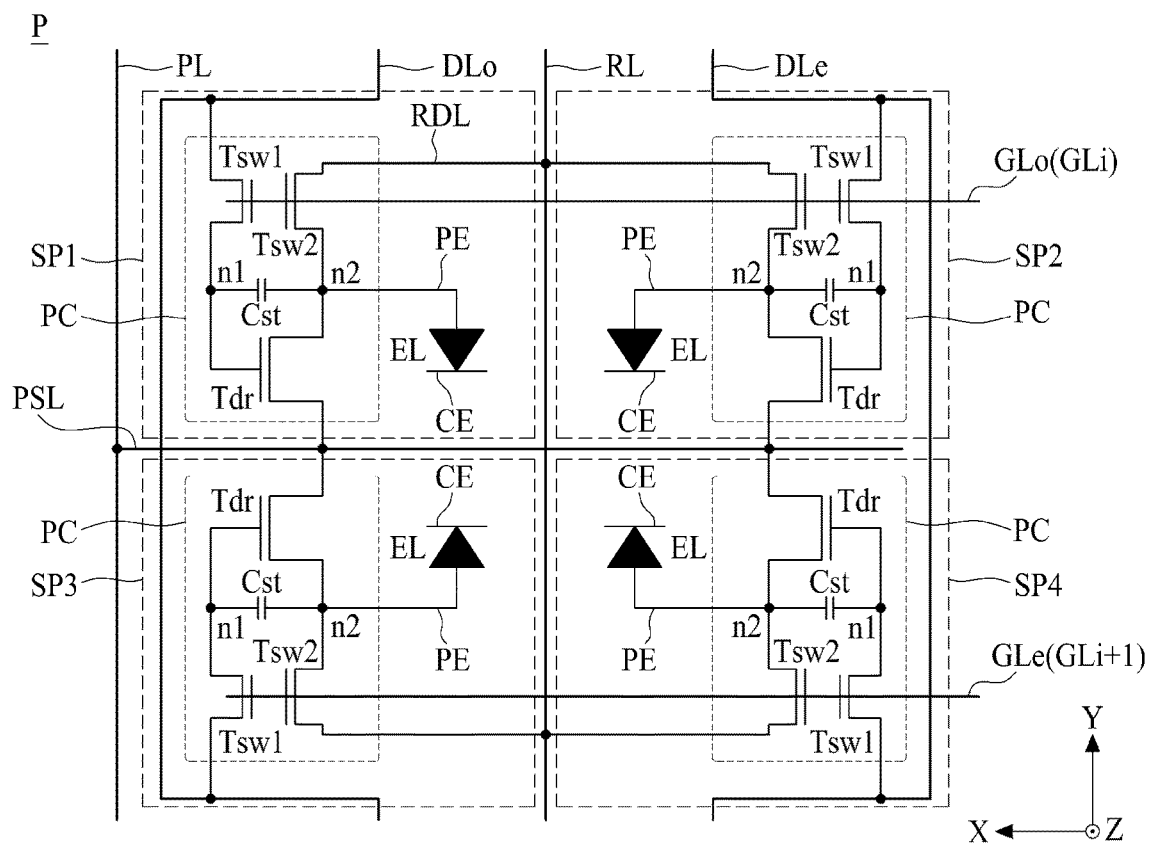
FIG. 5 is an equivalent circuit diagram of one pixel illustrated in FIGS. 1 and 4.

FIG. 4 is an enlarged view of a region B1 illustrated in FIG. 1, and FIG. 5 is an equivalent circuit diagram of one pixel illustrated in FIGS. 1 and 4.

Referring to FIGS. 1, 4, and 5, a substrate 100 according to an embodiment of the present disclosure may include pixel driving lines DL, GL, PL, CVL, RL, and GCL, a plurality of pixels P, a common electrode CE, a plurality of common electrode connection portions CECP, a contact pattern portion 110, and a discontinuity portion 115.

The pixel driving lines DL, GL, PL, CVL, RL, and GCL may include a plurality of data lines DL, a plurality of gate lines GL, a plurality of pixel driving power lines PL, a plurality of pixel common voltage lines CVL, a plurality of reference voltage lines RL, and a plurality of gate control lines GCL.

Each of the plurality of data lines DL may extend long in a second direction Y and may be disposed apart from one another by a predetermined (or selected) interval in a display area AA of the substrate 100 in the first direction X. For example, in the plurality of data lines DL, an odd-numbered data line DLo may be disposed at a first periphery portion of each of a plurality of pixel areas PA arranged on the substrate 100 in the second direction Y, and an even-numbered data line DLe may be disposed at a second periphery portion of each of the plurality of pixel areas PA arranged on the substrate 100 in the second direction Y, but embodiments of the present disclosure are not limited thereto.

Each of the plurality of gate lines GL may extend long in a first direction X and may be disposed apart from one another by a predetermined (or selected) interval in a display area AA of the substrate 100 in the second direction Y. For example, in the plurality of gate lines GL, an odd-numbered gate line GLo may be disposed at a third periphery portion of each of a plurality of pixel areas PA arranged on the substrate 100 in the first direction X, and an even-numbered gate line GLe may be disposed at a fourth periphery portion of each of the plurality of pixel areas PA arranged on the substrate 100 in the first direction X, but embodiments of the present disclosure are not limited thereto.

Each of the plurality of pixel driving power lines PL may extend long in a second direction Y and may be disposed apart from one another by a predetermined (or selected) interval in a display area AA of the substrate 100 in the first direction X. For example, in the plurality of pixel driving power lines PL, an odd-numbered pixel driving power line PL may be disposed at a first periphery portion of the odd-numbered pixel areas PA with respect to the first direction X, and an even-numbered pixel driving power lines PL may be disposed at a second periphery portion of the even-numbered pixel areas PA with respect to the first direction X, but embodiments of the present disclosure are not limited thereto.

Two adjacent pixel driving power lines PL of the plurality of pixel driving power lines PL may be connected to a plurality of power sharing lines PSL disposed in each of pixel areas PA arranged in the second direction Y. For example, the plurality of pixel driving power lines PL may be electrically connected to one another by the plurality of power sharing lines PSL, and thus, may have a ladder structure or a mesh structure. The plurality of pixel driving power lines PL may have a ladder structure or a mesh structure, and thus, the voltage drop (IR drop) of the pixel driving power caused by a line resistance of each of the plurality of pixel driving power lines PL may be prevented or minimized. Accordingly, the light emitting display apparatus 10 according to the present disclosure may prevent or reduce or minimize the degradation in image quality caused by a deviation of the pixel driving power supplied to each of the pixels P.

Each of the plurality of power sharing lines PSL may branch from an adjacent pixel driving power line PL in parallel with the first direction X and may be disposed in a middle region of each pixel area PA, but embodiments of the present disclosure are not limited thereto.

The plurality of pixel common voltage lines CVL may extend long in the second direction Y and may be disposed apart from one another by a predetermined (or selected) interval in the display area AA of the substrate 100 in the first direction X. For example, each of the plurality of pixel common voltage lines CVL may be disposed at a first periphery portion of an even-numbered pixel area PA with respect to the first direction X.

The plurality of reference voltage lines RL may extend long in the second direction Y and may be disposed apart from one another by a predetermined (or selected) interval in the display area AA of the substrate 100 in the direction X. Each of the plurality of reference voltage lines RL may be disposed in a center region of each of the pixel areas PA arranged in the second direction Y. For example, each of the plurality of reference power lines RL may be disposed between an odd-numbered data line DLo and an even-numbered data line DLe in each pixel area PA.

Each of the plurality of reference voltage lines RL may be shared by two adjacent subpixels ((SP1, SP2) (SP3, SP4)) along the first direction X in each pixel area PA. Accordingly, in some embodiments, each of the plurality of reference voltage lines RL may include a reference branch line RDL. The reference branch line RDL may branch (or protrude) toward the two adjacent subpixels ((SP1, SP2) (SP3, SP4)) along the first direction X in each pixel area PA and may be electrically connected to the two adjacent subpixels ((SP1, SP2) (SP3, SP4)).

The plurality of gate control lines GCL may extend long in the second direction Y and may be disposed apart from one another by a predetermined (or selected) interval in the display area AA of the substrate 100 in the direction X. For example, the plurality of gate control lines GCL may be respectively disposed at a portion between the plurality of pixel areas PA or at a boundary portion between the two adjacent subpixels ((SP1, SP2) (SP3, SP4)) with respect to the first direction X.

Each of the plurality of pixels P may include at least three subpixels. For example, each of the plurality of pixels P may include first to fourth subpixels SP1 to SP4.

The first to fourth subpixels SP1 to SP4 may respectively include a pixel circuit PC and a light emitting device layer.

The pixel circuit PC according to an embodiment of the present disclosure may be disposed in a circuit area CA of the pixel area PA and may be connected to gate lines GLo and GLe adjacent thereto, data lines DLo and DLe adjacent thereto, and the pixel driving power line PL. For example, a pixel circuit PC disposed in a first subpixel SP1 may be connected to an odd-numbered data line DLo and an odd-numbered gate line GLo, a pixel circuit PC disposed in a second subpixel SP2 may be connected to an even-numbered data line DLe and an odd-numbered gate line GLo, a pixel circuit PC disposed in a third subpixel SP3 may be connected to an odd-numbered data line DLo and an even-numbered gate line GLe, and a pixel circuit PC disposed in a fourth subpixel SP4 may be connected to an even-numbered data line DLe and an even-numbered gate line GLe.

The pixel circuit PC of each of the first to fourth subpixels SP1 to SP4 may sample a data signal supplied from corresponding data lines DLo and DLe in response to a scan signal supplied from corresponding gate lines GLo and GLe and may control a current flowing from the pixel driving power line PL to the light emitting device layer based on a sampled data signal. For example, the pixel circuit PC may sample a data signal by using at least two thin film transistors and at least one capacitor and may control a current flowing in the light emitting device layer based on the sampled data signal.

The pixel circuit PC according to an embodiment of the present disclosure may include a first switching thin film transistor Tsw1, a second switching thin film transistor Tsw2, a driving thin film transistor Tdr, and a storage capacitor Cst. In the following description, a thin film transistor may be referred to as a TFT.

The first switching TFT Tsw1 may include a gate electrode connected to the adjacent gate lines GLo and GLe, a first source/drain electrode connected to the adjacent data lines DLo and DLe, and a second source/drain electrode connected to a first node (or a gate electrode of the driving TFT Tdr) n1. The first switching TFT Tsw1 may be turned on by a scan signal supplied through corresponding gate lines GLo and GLe and may transfer a data signal, supplied through corresponding data lines DLo and DLe, to the first node n1 (e.g., the gate electrode n1 of the driving TFT Tdr). According to an embodiment of the present disclosure, the gate electrode of the first switching TFT Tsw1 disposed in the pixel circuit PC of each of the first subpixel SP1 and the second subpixel SP2 may be connected to an odd-numbered gate line GLo, and the gate electrode of the first switching TFT Tsw1 disposed in the pixel circuit PC of each of the third subpixel SP3 and the fourth subpixel SP4 may be connected to an even-numbered gate line GLe. The first source/drain electrode of the first switching TFT Tsw1 disposed in the pixel circuit PC of each of the first subpixel SP1 and the third subpixel SP3 may be connected to an odd-numbered data line DLo, and the first source/drain electrode of the first switching TFT Tsw1 disposed in the pixel circuit PC of each of the second subpixel SP2 and the fourth subpixel SP4 may be connected to an even-numbered data line DLe.

The second switching TFT Tsw2 may include a gate electrode connected to the adjacent gate lines GLo and GLe, a first source/drain electrode connected to an adjacent reference voltage line RL, and a second source/drain electrode connected to a second node (or a source electrode of the driving TFT Tdr) n2. The second switching TFT Tsw2 may be turned on by a scan signal supplied through corresponding gate lines GLo and GLe and may transfer a reference voltage, supplied through a corresponding reference branch line RDL and reference voltage line RL, to the source electrode n2 of the driving TFT Tdr. According to an embodiment of the present disclosure, the gate electrode of the second switching TFT Tsw2 disposed in the pixel circuit PC of each of the first subpixel SP1 and the second subpixel SP2 may be connected to an odd-numbered gate line GLo, and the gate electrode of the second switching TFT Tsw2 disposed in the pixel circuit PC of each of the third subpixel SP3 and the fourth subpixel SP4 may be connected to an even-numbered gate line GLe. The first source/drain electrode of the second switching TFT Tsw2 disposed in the pixel circuit PC of each of the first to fourth subpixels SP1 and SP4 may be connected to an adjacent reference voltage line RL in common through a corresponding reference branch line RDL.

The storage capacitor Cst may be provided in an overlap region between the gate electrode n1 and the source electrode n2 of the driving TFT Tdr. The storage capacitor Cst may include a first capacitor electrode connected to the gate electrode of the driving TFT Tdr, a second capacitor electrode connected to the source electrode of the driving TFT Tdr, and a dielectric layer formed in an overlap region between the first capacitor electrode and the second capacitor electrode. The storage capacitor Cst may be charged with a difference voltage between the gate electrode n1 and the source electrode n2 of the driving TFT Tdr, and then, may turn on or off the driving TFT Tdr on the basis of a charged voltage.

The driving TFT Tdr may include a gate electrode (or a gate node) n1 which is connected to the second source/drain electrode of the first switching TFT Tsw1 and the first capacitor electrode of the storage capacitor Cst, a source electrode (or a source node) which is connected to the second source/drain electrode of the second switching TFT Tsw2, the second capacitor electrode of the storage capacitor Cst, and a pixel electrode PE of the light emitting device layer in common, and a drain electrode (or a drain node) connected to an adjacent pixel driving power line PL. The driving TFT Tdr may be turned on based on a voltage of the storage capacitor Cst and may control the amount of current flowing from the pixel driving power line PL to the light emitting device layer.

The pixel circuit PC of each of the first to fourth subpixels SP1 to SP4 according to another embodiment may be implemented as a pixel driving chip through a semiconductor manufacturing process, disposed in a circuit area CA of a corresponding pixel area PA, and connected to gate lines GLo and GLe adjacent thereto, data lines DLo and DLe adjacent thereto, and the pixel driving power line PL. For example, the pixel driving chip may be a minimum-unit microchip or one chipset and may be a semiconductor packaging device which includes two or more transistors and one or more capacitors and has a fine size. Such a pixel driving chip may sample a data signal supplied from corresponding data lines DLo and DLe in response to a scan signal supplied from corresponding gate lines GLo and GLe and may control a current flowing from the pixel driving power line PL to the light emitting device layer on the basis of a sampled data signal.

The light emitting device layer may be disposed in an emission area EA of the pixel area PA, and electrically connected to the pixel circuit PC. The light emitting device layer according to an embodiment of the present disclosure may include a pixel electrode PE electrically connected to the pixel circuit PC, a common electrode CE electrically connected to the pixel common voltage line CVL, and a light emitting layer EL between the pixel electrode PE and the common electrode CE.

The light emitting layer EL according to another embodiment may include at least one organic light emitting layer. The light emitting layer EL may further include a hole functional layer providing holes to the organic light emitting layer and an electron functional layer providing electrons to the organic light emitting layer. The light emitting layer EL may emit light having luminance corresponding to the data current by emitting light based on a data current supplied from the pixel circuit PC.

The common electrode CE may be disposed in the display area AA of the substrate 100 and may be electrically connected to each of the plurality of pixels P. For example, the common electrode CE may be disposed in the display area AA of substrate 100 except for the contact pattern portion 110 disposed in the substrate 100.

Each of the plurality of common electrode connection portions CECP may be disposed between the plurality of pixels P respectively overlapping the plurality of pixel common voltage lines CVL and may electrically connect the common electrode CE to each of the plurality of pixel common voltage lines CVL. With respect to the second direction Y, each of the plurality of common electrode connection portions CECP according to an embodiment of the present disclosure may be electrically connected to a corresponding pixel common voltage line CVL among the plurality of pixel common voltage lines CVL at a portion between the plurality of pixels P or at a boundary portion between the plurality of pixels P and may be electrically connected to a portion of the common electrode CE, and thus, may electrically connect the common electrode CE to a corresponding pixel common voltage line CVL among the plurality of pixel common voltage lines CVL.

Each of the plurality of common electrode connection portions CECP may be disposed between at least two pixels among the plurality of pixels P to electrically connect the common electrode CE to each of the plurality of pixel common voltage lines CVL, and thus, may prevent or minimize the voltage drop (IR drop) of the pixel common voltage caused by a surface resistance of the common electrode CE. Accordingly, the light emitting display apparatus according to the present disclosure may prevent or minimize the degradation in image quality caused by a deviation of the pixel common voltage supplied to each of the pixels P arranged in the display area AA.

According to an embodiment of the present disclosure, each of the plurality of common electrode connection portions CECP may be formed along with a pixel electrode PE having at least two-layer structure so as to be electrically connected to each of the plurality of pixel common voltage lines CVL. Each of the plurality of common electrode connection portions CECP may be connected to the common electrode CE through a side contact structure having a "("-shaped cross-sectional structure or a "<"-shaped cross-sectional structure. For example, when each of the plurality of common electrode connection portions CECP is formed of first and second metal layers, each of the plurality of common electrode connection portions CECP may include a side contact structure corresponding to an undercut structure or a tapered structure formed on the lateral surface of the first metal layer by an etching speed difference between the first metal layer and the second metal layer. For example, when each of the plurality of common electrode connection portions CECP is formed of first to third metal layers, each of the plurality of common electrode connection portions CECP may include a side contact structure corresponding to an undercut structure or a tapered structure formed on the lateral surface of the first metal layer and the second metal layer by an etching speed difference between the first to third metal layers.

The contact pattern portion 110 may be disposed at a first periphery portion (or one side periphery portion) among a first surface of the substrate 100 parallel to a first direction X. The contact pattern portions 110 may be included (or disposed) inside outermost pixel areas PAo disposed at the first periphery portion of the substrate 100, and thus, a non-display area (or a bezel area) based on the contact pattern portion 110 may not be formed or provided on the substrate 100. For example, the contact pattern portion 110 may be disposed at third periphery portions of the outermost pixel areas PAo disposed at the first periphery portion of the substrate 100.

The contact pattern portion 110 may include a plurality of contact patterns PCP, DCP, RCP, GCP, and CCP which are disposed in the circuit layer 111 (see FIG. 10) and are connected to the pixel driving lines DL, GL, PL, CVL, RL, and GCL. The contact pattern portion 110 may include the plurality of contact patterns PCP, DCP, RCP, GCP, and CCP which are disposed in parallel with the circuit layer 111 along the first direction X on the first periphery portion of the substrate 100. The contact pattern portion 110 according to an embodiment of the present disclosure may include five kinds of contact patterns PCP, DCP, RCP, GCP, and CCP. The contact pattern portion 110 may include a plurality of data contact patterns DCP, a plurality of pixel driving power contact patterns PCP, a plurality of pixel common voltage contact patterns CCP, a plurality of reference voltage contact patterns RCP, and a plurality of gate contact patterns GCP, but are not limited thereto.

The data contact patterns DCP may be for receiving a data signal and may be a first contact pattern. Each of the data contact patterns DCP according to an embodiment of the present disclosure may be disposed on the same layer as the data lines DL and may extend (or enlarge) from an end of each of the data lines DL, disposed at one side periphery portion of the substrate 100, to the outer surface OS of the substrate 100 to have a relatively wide width. According to another embodiment of the present disclosure, each of the data contact patterns DCP may be disposed under layer of the data lines DL to have a relatively wide width so as to overlap the end of each of the data lines DL disposed at the one side periphery portion of the substrate 100 and may be electrically connected to the end of each of the data lines DL through an inner contact hole.

The pixel driving power contact patterns PCP may be for receiving a pixel driving power and may be a second contact pattern. Each of the pixel driving power contact patterns PCP according to an embodiment of the present disclosure may be disposed on the same layer as the pixel driving power lines PL and may extend (or enlarge) from an end of each of the pixel driving power lines PL, disposed at the one side periphery portion of the substrate 100, to the outer surface OS of the substrate 100 to have a relatively wide width. According to another embodiment of the present disclosure, each of the pixel driving power contact patterns PCP may be disposed under layer of the pixel driving power lines PL to have a relatively wide width so as to overlap the end of each of the pixel driving power lines PL disposed at the one side periphery portion of the substrate 100 and may be electrically connected to the end of each of the pixel driving power lines PL through an inner contact hole.

The pixel common voltage contact patterns CCP may be for receiving a pixel common voltage and may be a third contact pattern. Each of the pixel common voltage contact patterns CCP according to an embodiment of the present disclosure may be disposed on the same layer as the pixel common voltage lines CVL and may extend (or enlarge) from an end of each of the pixel common voltage lines CVL, disposed at the one side periphery portion of the substrate 100, to the outer surface OS of the substrate 100 to have a relatively wide width. According to another embodiment of the present disclosure, each of the pixel common voltage contact patterns CCP may be disposed under layer of the pixel common voltage lines CVL to have a relatively wide width so as to overlap the end of each of the pixel common voltage lines CVL disposed at the one side periphery portion of the substrate 100 and may be electrically connected to the end of each of the pixel common voltage lines CVL through an inner contact hole.

The reference voltage contact patterns RCP may be for receiving a reference voltage and may be a fourth contact pattern. Each of the reference voltage contact patterns RCP according to an embodiment of the present disclosure may be disposed on the same layer as the reference voltage lines RL and may extend (or enlarge) from an end of each of the reference voltage lines RL, disposed at the one side periphery portion of the substrate 100, to the outer surface OS of the substrate 100 to have a relatively wide width. According to another embodiment of the present disclosure, each of the reference voltage contact patterns RCP may be disposed under layer of the reference voltage lines RL to have a relatively wide width so as to overlap the end of each of the reference voltage lines RL disposed at the one side periphery portion of the substrate 100 and may be electrically connected to the end of each of the reference voltage lines RL through an inner contact hole.

The gate contact patterns GCP may be for receiving a gate control signal and may be a fifth contact pattern. Each of the gate contact patterns GCP according to an embodiment of the present disclosure may be disposed on the same layer as the gate control lines GCL and may extend (or enlarge) from an end of each of the gate control lines GCL, disposed at the one side periphery portion of the substrate 100, to the outer surface OS of the substrate 100 to have a relatively wide width. According to another embodiment of the present disclosure, each of the gate contact patterns GCP may be disposed under layer of the gate control lines GCL to have a relatively wide width so as to overlap the end of each of the gate control lines GCL disposed at the one side periphery portion of the substrate 100 and may be electrically connected to the end of each of the gate control lines GCL through an inner contact hole.

The contact pattern portion 110 according to an embodiment of the present disclosure may include a plurality of contact pattern group CPG. At least two or more contact pattern group CPG among the plurality of contact pattern group CPG may include at least one data contact pattern and at least one gate contact pattern.

According to an embodiment of the present disclosure, the contact pattern portion 110 may include a first contact pattern group CPG1 and a second contact pattern group CPG2.

The first contact pattern group CPG1 may be disposed in an odd-numbered outermost pixels Po among the outermost pixels Po disposed along the first direction X. For example, the first contact pattern group CPG1 may include one pixel driving power contact pattern PCP, two data contact pattern DCP, one reference voltage contact pattern RCP, and one gate contact pattern GCP. For example, the contact patterns PCP, DCP, RCP, and GCP included in the first contact pattern group CPG1 may be (continuously) disposed (or arranged) in the order of the pixel driving power contact pattern PCP, the data contact pattern DCP, the reference voltage contact pattern RCP, the data contact pattern DCP, and the gate contact pattern GCP along the first direction X, but embodiments of the present disclosure are not limited thereto.

The second contact pattern group CPG2 may be disposed in an even-numbered outermost pixels Po among the outermost pixels Po disposed along the first direction X. For example, the second contact pattern group CPG2 may include one pixel driving power contact pattern PCP, two data contact pattern DCP, one reference voltage contact pattern RCP, and one pixel common voltage contact pattern CCP. For example, the contact patterns PCP, DCP, RCP, and CCP included in the second contact pattern group CPG2 may be (continuously) disposed (or arranged) in the order of the pixel driving power contact pattern PCP, the data contact pattern DCP, the reference voltage contact pattern RCP, the data contact pattern DCP, and the pixel common voltage contact pattern CCP along the first direction X, but embodiments of the present disclosure are not limited thereto.

The substrate 100 according to an embodiment of the present disclosure may further include a plurality of pixel common power secondary lines CSPL and a plurality of pixel common power secondary line connection portions SLCP.

Each of the plurality of pixel common power secondary lines CSPL may extend long in the second direction Y and may be disposed adjacent to a corresponding pixel common voltage line CVL among the plurality of pixel common voltage lines CVL. Each of the plurality of pixel common power secondary lines CSPL may be electrically connected to an adjacent pixel common voltage line CVL without being electrically connected to the pixel common voltage contact pattern CCP and may be supplied with a pixel common voltage through the adjacent pixel common voltage line CVL. Accordingly, in some embodiments, the substrate 100 according to an embodiment of the present disclosure may further include a plurality of line connection patterns LCP which electrically connect a pixel common voltage line CVL and a pixel common power secondary line CSPL adjacent to each other.

Each of the plurality of line connection patterns LCP may be disposed on the substrate 100 so that the line connection pattern LCP and a pixel common voltage line CVL and a pixel common power secondary line CSPL adjacent to each other overlap with each other and may electrically connect a pixel common voltage line CVL and a pixel common power secondary line CSPL adjacent to each other by using a line jumping structure. For example, one side of each of the plurality of line connection patterns LCP may be electrically connected to a portion of the pixel common power secondary line CSPL through a first line contact hole formed in an insulation layer on the pixel common power secondary line CSPL, and the other side of each of the plurality of line connection patterns LCP may be electrically connected to a portion of the pixel common voltage line CVL through a second line contact hole formed in an insulation layer on the pixel common voltage line CVL.

Each of the plurality of pixel common power secondary line connection portions SLCP may be disposed between the plurality of pixels P respectively overlapping the plurality of pixel common power secondary line CSPL and may electrically connect the common electrode CE to each of the plurality of pixel common power secondary line CSPL. With respect to the second direction Y, each of the plurality of pixel common power secondary line connection portions SLCP according to an embodiment of the present disclosure may be electrically connected to each of the plurality of pixel common power secondary line CSPL at a portion between the plurality of pixels P or a boundary portion between the plurality of pixels P and may be electrically connected to a portion of the common electrode CE, and thus, may electrically connect the common electrode CE to each of the plurality of pixel common power secondary line CSPL. Therefore, the common electrode CE may be additionally connected to each of the plurality of pixel common power secondary line CSPL through the pixel common power secondary line connection portions SLCP. Accordingly, the light emitting display apparatus according to the present disclosure may prevent or minimize the degradation in image quality caused by a deviation of the pixel common power supplied to each of the pixels P arranged in the display area AA. Also, in the light emitting display apparatus according to the present disclosure, although the pixel common voltage contact pattern CCP connected to each of the plurality of pixel common power secondary line CSPL is not additionally disposed (or formed), the pixel common voltage may be supplied to each of the plurality of pixel common power secondary line CSPL through each of the pixel common voltage line CVL and the plurality of line connection patterns LCP. For example, each of the plurality of pixel common power secondary line connection portions SLCP may electrically connect a corresponding pixel common power secondary line CSPL among the plurality of pixel common power secondary line CSPL to the common electrode CE through a side contact structure having a "("-shaped cross-sectional structure or a "<"-shaped cross-sectional structure, like each of the plurality of common electrode connection portions CECP.

The discontinuity portion 115 may be disposed in a second region surrounding a first region of the substrate 100. For example, the second region of the substrate 100 may be a periphery portion of the substrate 100 or a periphery portion of each of the outermost pixels Po. The first region of the substrate 100 may be a portion other than the second region. The discontinuity portion 115 may be implemented in a closed loop form at the periphery portion of the substrate 100. According to an embodiment of the present disclosure, the discontinuity portion 115 may be disposed on the contact pattern portion 110. For example, the discontinuity portion 115 may be disposed to cross the contact patterns PCP, DCP, RCP, GCP, and CCP of the contact pattern portion 110 along the first direction X.

The discontinuity portion 115 may be implemented to disconnect (or isolate), at least once, the light emitting layer EL inside the outermost pixels Po disposed along the periphery portion of the substrate 100. The discontinuity portion 115 may disconnect (or isolate), at least once, the light emitting layer EL disposed at the periphery portion of the substrate 100 and may block the side transmission of water or moisture penetrating in the lateral direction of the substrate 100 to prevent the light emitting layer from being degraded or the reliability of the light emitting layer from being reduced by the side transmission of water or moisture. The discontinuity portion 115 according to an embodiment of the present disclosure may include a plurality of discontinuity pattern portions which are arranged in parallel. For example, the discontinuity portion 115 may include at least three discontinuity pattern portions which are arranged in parallel.

The substrate 100 according to an embodiment of the present disclosure may further include a dam portion 117.

The dam portion 117 may be disposed along the periphery portion of the substrate 100. The dam portion 117 may be implemented in the periphery portion of the substrate 100 to have a closed loop shape (or a closed loop line shape). The dam portion 117 may be included in the outmost pixels Po or disposed at a periphery portion of the outmost pixels Po. For example, the dam portion 117 may be disposed between a center portion of the outmost pixels Po and the outer surface OS of the substrate 100. The dam portion 117 may be surrounded by the discontinuity portion 115. For example, the dam portion 117 may be implemented to be surround the isolation pattern portion disposed closest to the internal pixel Pi among the plurality of isolation pattern portions. According to an embodiment of the present disclosure, the dam portion 117 may be disposed on the contact pattern portion 110. For example, the dam portion 117 may be disposed to transverse (or cross) the contact patterns PCP, DCP, RCP, GCP, and CCP of the contact pattern portion 110 along the first direction X.

Figure 6:
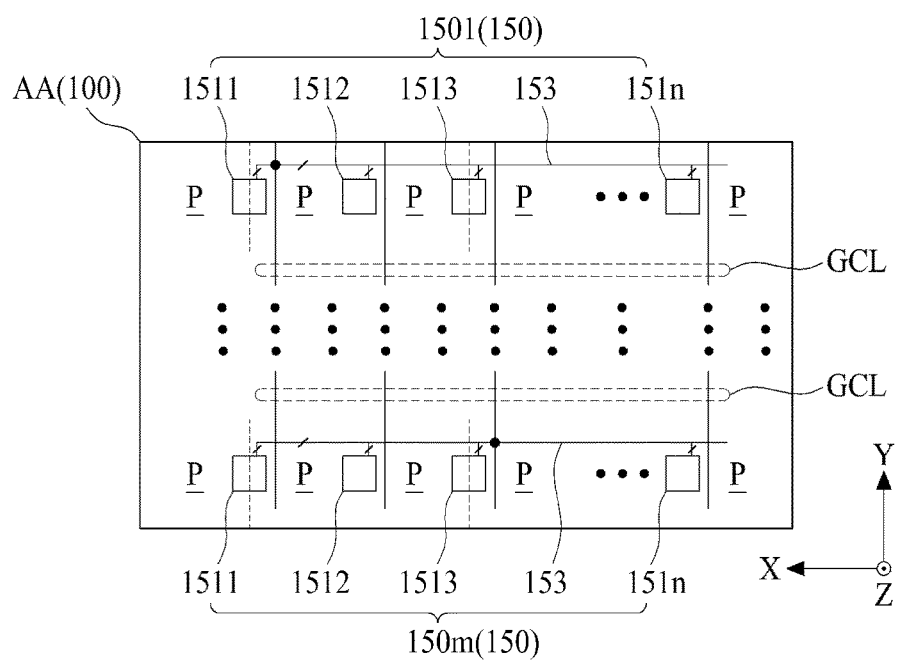
FIG. 6 is a diagram illustrating a gate driving circuit implemented in a display area illustrated in FIG. 4.

FIG. 6 is a diagram illustrating a gate driving circuit implemented in a display area illustrated in FIG. 4.

The substrate 100 according to an embodiment of the present disclosure may further include a gate driving circuit 150 which is disposed in the display area AA of the substrate 100.

The gate driving circuit 150 may be implemented (or embedded) in the display area AA of the substrate 100, generate a scan signal based on a gate control signal supplied through the contact pattern portion 110 and the gate control lines GCL, and sequentially supply the scan signal to the plurality of gate lines GL.

The gate control lines GCL according to an embodiment of the present disclosure may include a start signal line, a plurality of shift clock lines, at least one gate driving voltage line, and at least one gate common voltage line. The gate control lines GCL may extend long in a second direction Y and may be disposed apart from one another by a predetermined (or selected) interval in a display area AA of the substrate 100 in the first direction X. For example, the gate control lines GCL may be disposed between at least one or more pixels P along the first direction X.

The gate driving circuit 150 according to an embodiment of the present disclosure may be implemented in a shift register including a plurality of stage circuit portions 1501 to 150m, where m is an integer of 2 or more.

Each of the plurality of stage circuit portions 1501 to 150m may be disposed apart from one another in each horizontal line of a first surface 100a of the substrate 100 along the first direction X and may be dependently connected to one another in the second direction Y. Each of the plurality of stage circuit portions 1501 to 150m may generate a scan signal in a predetermined (or selected) order in response to a gate control signal supplied through the contact pattern portion 110 and the gate control lines GCL and may supply the scan signal to a corresponding gate line GL.

Each of the plurality of stage circuit portions 1501 to 150m according to an embodiment may include a plurality of branch circuits 1511 to 151n and a branch network 153.

The plurality of branch circuits 1511 to 151n may be selectively connected to the corresponding gate control lines of the gate control lines GCL through the branch network 153 and may be electrically connected to one another through the branch network 153. Each of the plurality of branch circuits 1511 to 151n may generate the scan signal based on a gate control signal supplied through the gate control lines GCL and a voltage of the branch network 153, and may supply the scan signal to a corresponding gate line GL.

Each of the plurality of branch circuits 1511 to 151n may include at least one TFT among a plurality of TFTs configuring one of the stage circuit portions 1501 to 150m. Any one branch circuit among the plurality of branch circuits 1511 to 151n may include a pull-up TFT connected to the gate line GL. The other branch circuit among the plurality of branch circuits 1511 to 151n may include a pull-down TFT connected to the gate line GL.

Each of the plurality of branch circuits 1511 to 151n according to an embodiment of the present disclosure may be disposed in a circuit area between two adjacent pixels P or in a circuit area between at least two adjacent pixels P, in each horizontal line of the substrate 100, but embodiments of the present disclosure are not limited thereto. For example, each of the plurality of branch circuits 1511 to 151n may be disposed in a circuit area (or a boundary portion) between one or more adjacent pixels P according to the number of TFTs configuring each of the stage circuit portions 1501 to 150m and the number of pixels P disposed one horizontal line.

The branch network 153 may be disposed in each horizontal line of the substrate 100 and may electrically connect the plurality of branch circuits 1511 to 151n to each other. The branch network 153 according to an embodiment of the present disclosure may include a plurality of control nodes and a plurality of network line.

The plurality of control nodes may be disposed in each horizontal line of the substrate 100 and may be selectively connected to the plurality of branch circuits 1511 to 151n in one horizontal line. For example, the plurality of control nodes may be disposed in an upper edge region (or a lower edge region) among pixel areas arranged in each horizontal line of the substrate 100.

The plurality of network line may be selectively connected to the gate control lines GCL disposed in the substrate 100 and may be selectively connected to the plurality of branch circuits 1511 to 151n. For example, the plurality of network line may transfer the gate control signal supplied from the gate control lines GCL to corresponding branch circuits 1511 to 151n and may transfer a signal between the plurality of branch circuits 1511 to 151n.

Each of the plurality of stage circuit portions 1501 to 150m according to an embodiment of the present disclosure may include a first control node, a second control node, a node control circuit, an inverter circuit, and an output buffer circuit. The node control circuit may be configured to control the voltage of each of the first and second control nodes. The inverter circuit may be configured to control the voltage of the second control node based on the voltage of the first control node. The output buffer circuit may be configured to output a scan signal corresponding to the scan clock and a carry signal corresponding to the carry clock based on the voltage of the first control node, and a scan signal and a carry signal corresponding to the gate-off voltage level based on the voltage of the second control node. For example, the node control circuit, the inverter circuit, and the output buffer circuit may respectively include two or more among the plurality of branch circuits 1511 to 151n. For example, the plurality of branch circuits 1511 to 151n may be divided (or classified) into the node control circuit, the inverter circuit, and the output buffer circuit, respectively.

As described above, according to the present embodiment, because the gate driving circuit 150 is disposed in the display area AA of the substrate 100, a second interval D2 between a center portion of the outermost pixel area PAo and the outer surfaces OS of the substrate 100 may be equal to or less than half of a first interval (or a pixel pitch) D1 between adjacent pixel areas PA. For example, when the gate driving circuit 150 is not disposed in the display area AA of the substrate 100 and is disposed at a periphery portion of the substrate 100, the second interval D2 may not be equal to or less than half of the first interval D1. Accordingly, in the light emitting display apparatus according to an embodiment of the present disclosure, the gate driving circuit 150 may be disposed in the display area AA of the substrate 100, and thus, the second interval D2 may be implemented to be equal to half of the first interval D1 or less than half of the first interval D1.

Figure 7:
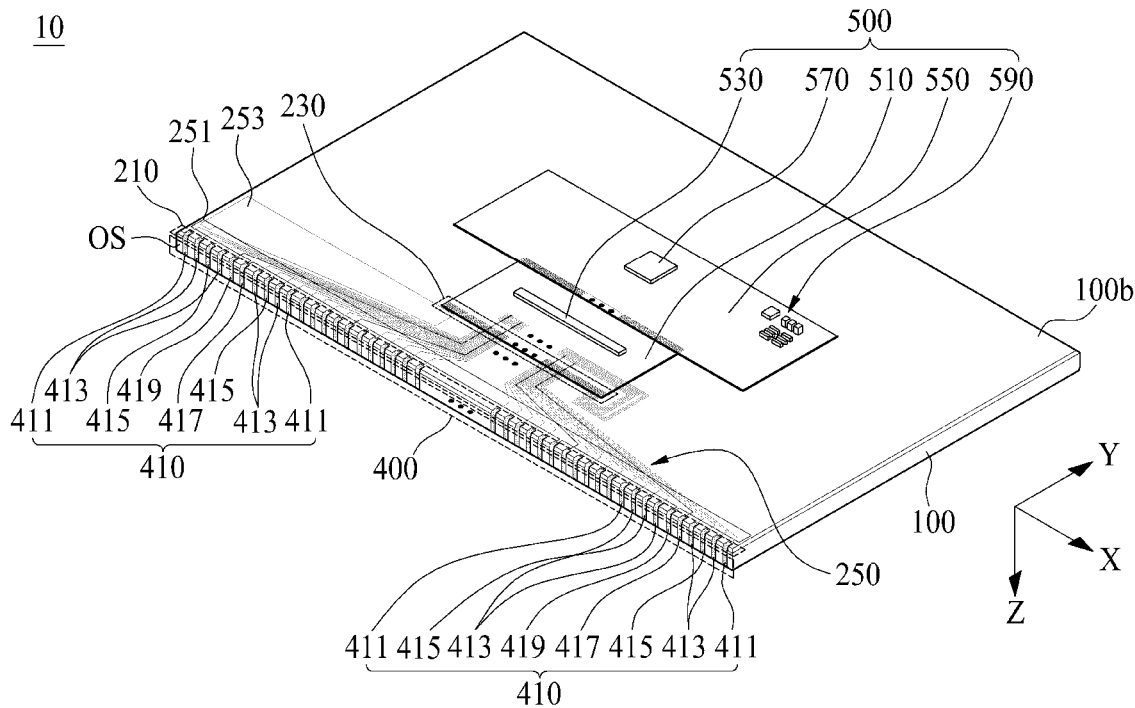
FIG. 7 is a rear perspective view illustrating a light emitting display apparatus according to an embodiment of the present disclosure.

FIG. 7 is a rear perspective view illustrating a light emitting display apparatus according to an embodiment of the present disclosure.

Referring to FIGS. 1, 4, and 7, the light emitting display apparatus according to an embodiment of the present disclosure may further include a first pad portion 210 disposed in a rear surface 100b of the substrate 100.

The first pad portion 210 may be disposed at a first periphery portion (or a first rear periphery portion) among a rear surface 100b of the substrate 100 overlapping the contact pattern portion 110 disposed on a front surface 100a of the substrate 100.

The first pad portion 210 may include a plurality of first pads (or routing pads) which are disposed at a certain interval along the first direction X to respectively overlap the contact patterns of the contact pattern portion 110.

The first pad portion 210 according to an embodiment of the present disclosure may include a plurality of first pixel driving power pads overlapping each of the plurality of pixel driving power contact patterns PCP, a plurality of first data pads overlapping each of the plurality of data contact patterns DCP, a plurality of first reference voltage contact pads overlapping each of the plurality of reference voltage contact patterns RCP, a plurality of first gate pads overlapping each of the plurality of gate contact patterns GCP, and a plurality of first pixel common voltage pads overlapping each of the plurality of pixel common voltage contact patterns CCP.

The light emitting display apparatus according to an embodiment of the present disclosure may further include a second pad portion 230 and a link line portion 250 which are disposed in a rear surface 100b of the substrate 100.

The second pad portion (or an input pad portion) 230 may be disposed in a rear surface 100b of the substrate 100. For example, the second pad portion 230 may be disposed at a middle portion adjacent to the first periphery portion among the rear surface 100b of the substrate 100. The second pad portion 230 according to an embodiment of the present disclosure may include a plurality of second pads (or input pads) which are spaced apart from one another by a certain interval. For example, the second pad portion 230 may include second pixel driving power pads, second data pads, second reference voltage pads, second gate pads, and second pixel common voltage pads.

The link line portion 250 may include a plurality of link lines which are disposed between the first pad portion 210 and the second pad portion 230.

The link line portion 250 according to an embodiment of the present disclosure may include a plurality of pixel driving power link lines which individually (or respectively or a one-to-one relationship) connect the plurality of first pixel driving power pads to the plurality of second pixel driving power pads, a plurality of data link lines which individually (or respectively or a one-to-one relationship) connect the plurality of first data pads to the plurality of second data pads, a plurality of reference voltage link lines which individually (or respectively or a one-to-one relationship) connect the plurality of first reference voltage pads to the plurality of second reference voltage pads, a plurality of gate link lines which individually (or respectively or a one-to-one relationship) connect the plurality of first gate pads to the plurality of second gate pads, and a plurality of pixel common voltage link lines which individually (or respectively or a one-to-one relationship) connect the plurality of first pixel common voltage pads to the plurality of second pixel common voltage pads.

Each of the plurality of pixel common voltage link lines may include a first common link line 251 and a second common link line 253. The first common link line 251 may be disposed between the first pad portion 210 and the second pad portion 230 and commonly connected to the plurality of first pixel common voltage pads. The second common link line 253 may be commonly connected to the plurality of second pixel common voltage pads and electrically connected to the first common link line 251. The second common link line 253 may be disposed on a different layer from the first common link line 251 and may be electrically connected to the first common link line 251 through a via hole. A size of the second common link line 253 may progressively increase in a direction from the second pad portion 230 to the periphery portion of the substrate 100 in order to reduce (or minimize) the voltage drop of the pixel common voltage.

The routing portion 400 may be disposed to surround the contact pattern portion 110, the outer surface OS, and the first pad portion 210 of the substrate 100. The routing portion 400 according to an embodiment of the present disclosure may include a plurality of routing lines 410 extending to the periphery portion of the substrate 100 and at least partially covering the outermost surface of the substrate 100. At least one of the plurality of routing lines 410 may be on and contacting the outer surface of the substrate 100. Each of the plurality of routing lines 410 may be disposed at a certain interval along the first direction X to surround the contact pattern portion 110, the outer surface OS, and the first pad portion 210 of the substrate 100, and electrically connected to the contact pattern portion 110 and the first pad portion 210 in a one-to-one relationship. According to an embodiment of the present disclosure, each of the plurality of routing lines 410 may be formed by a printing process using a conductive paste. According to another embodiment, each of the plurality of routing lines 410 may be formed by a transfer process that transfers the conductive paste pattern to a transfer pad made of a flexible material and transfers the conductive paste pattern transferred to the transfer pad to the routing portion 400. For example, the conductive paste may be an Ag paste, but embodiments of the present disclosure are not limited thereto.

Each of the plurality of routing lines 410 may be electrically connected to the contact patterns PCP, DCP, RCP, GCP, and CCP of the contact pattern portion 110 through the encapsulation layer disposed in the periphery portion of the substrate 100. Also, each of the plurality of routing lines 410 may be electrically connected to the pads disposed in the first pad portion 210.

The plurality of routing lines 410 according to an embodiment of the present disclosure may be divided (classified) into a plurality of pixel power routing lines 411, a plurality of data routing lines 413, a plurality of reference voltage routing lines 415, a plurality of gate routing lines 417, and a plurality of pixel common voltage routing lines 419.

The plurality of pixel power routing lines 411 may be formed to surround the contact pattern portion 110, the outer surface OS and the first pad portion 210 of the substrate 100, and electrically connected to the plurality of pixel driving power contact patterns PCP of the contact pattern portion 110 and the plurality of first pixel driving power pads of the first pad portion 210 in a one-to-one relationship.

The plurality of data routing lines 413 may be formed to surround the contact pattern portion 110, the outer surface OS and the first pad portion 210 of the substrate 100, and electrically connected to the plurality of data contact patterns DCP of the contact pattern portion 110 and the plurality of first data pads of the first pad portion 210 in a one-to-one relationship.

The plurality of reference voltage routing lines 415 may be formed to surround the contact pattern portion 110, the outer surface OS and the first pad portion 210 of the substrate 100, and electrically connected to the plurality of reference voltage contact patterns RCP of the contact pattern portion 110 and the plurality of first reference voltage pads of the first pad portion 210 in a one-to-one relationship.

The plurality of gate routing lines 417 may be formed to surround the contact pattern portion 110, the outer surface OS and the first pad portion 210 of the substrate 100, and electrically connected to the plurality of gate contact patterns GCP of the contact pattern portion 110 and the plurality of first gate pads of the first pad portion 210 in a one-to-one relationship.

The plurality of pixel common voltage routing lines 419 may be formed to surround the contact pattern portion 110, the outer surface OS and the first pad portion 210 of the substrate 100, and electrically connected to the plurality of pixel common voltage contact patterns CCP of the contact pattern portion 110 and the plurality of first pixel common voltage pads of the first pad portion 210 in a one-to-one relationship.

The light emitting display apparatus according to an embodiment of the present disclosure may further include a driving circuit unit 500 (or a driving circuit 500).

The driving circuit unit 500 may drive (or emit light) the pixels P disposed on the substrate 100 based on digital video data and a timing synchronization signal supplied from a display driving system to allow the display area AA to display an image corresponding to image data. The driving circuit unit 500 may be connected to the second pad portion 230 disposed on the rear surface 100b of the substrate 100 and may output, to the second pad portion 230, a data signal, a gate control signal, and a driving power for driving (or emitting light) the pixels P disposed on the substrate 100.

The driving circuit unit 500 according to an embodiment of the present disclosure may include a flexible circuit film 510, a driving integrated circuit (IC) 530, a printed circuit board (PCB) 550, a timing controller 570, and a power circuit unit 590.

The flexible circuit film 510 may be connected to the second pad portion 230 disposed on the rear surface 100b of the substrate 100.

The driving IC 530 may be mounted on the flexible circuit film 510. The driving IC 530 may receive subpixel data and a data control signal provided from the timing controller 570, and convert the subpixel data into an analog data signal on the basis of the data control signal to supply the analog data signal to a corresponding data line DL. The data signal may be supplied to a corresponding third data pads disposed at the second pad portion 230 through the flexible circuit film 510.

The driving IC 530 may sense a characteristic value of a driving TFT disposed in the subpixel SP through the plurality of reference voltage lines RL disposed on the substrate 100, generate sensing raw data corresponding to a sensing value for each subpixel, and provide the sensing raw data for each subpixel to the timing controller 570. For example, the light emitting display apparatus according to an embodiment of the present disclosure may sense a characteristic value of a driving TFT disposed in the subpixel SP through a sensing mode disclosed in Korean Patent Publication No. 10-2016-0093179, 10-2017-0054654, or 10-2018-0002099, but embodiments of the present disclosure are not limited thereto.

The PCB 550 may be connected to the other side periphery portion of the flexible circuit film 510. The PCB 550 may transfer a signal and power between elements of the driving circuit unit 500.

The timing controller 570 may be mounted on the PCB 550 and may receive the digital video data and the timing synchronization signal provided from the display driving system through a user connector disposed on the PCB 550. Alternatively, the timing controller 570 may not be mounted on the PCB 550 and may be implemented in the display driving system or may be mounted on a separate control board connected between the PCB 550 and the display driving system.

The timing controller 570 may align the digital video data on the basis of the timing synchronization signal to generate pixel data matching a pixel arrangement structure disposed in the display area AA and may provide the generated pixel data to the driving IC 530.

The timing controller 570 may generate each of the data control signal and the gate control signal on the basis of the timing synchronization signal, control a driving timing of the driving IC 530 on the basis of the data control signal, and control a driving timing of the gate driving circuit 150 on the basis of the gate control signal.

The data control signal according to an embodiment of the present disclosure may include a source start pulse, a source shift clock, and a source output signal. The gate control signal according to an embodiment of the present disclosure may include a start signal (or a gate start pulse), a plurality of shift clocks, a forward driving signal, and a reverse driving signal. The gate control signal may be supplied to a corresponding third gate pads disposed at the second pad portion 230 through the flexible circuit film 510.

The power circuit unit 590 may be mounted on the PCB 550 and may generate various source voltages for displaying an image on the pixels P by using an input power supplied from the outside to provide the generated source voltage to a corresponding circuit. For example, the power circuit unit 590 may generate and output a logic source voltage for driving of each of the timing controller 570 and the driving IC 530, the plurality of reference gamma voltages provided to the driving IC 530, and at least one gate driving power and at least one gate common power for driving of the gate driving circuit 150. Also, the power circuit unit 590 may generate and output the pixel driving power and the pixel common voltage, but embodiments of the present disclosure are not limited thereto. For example, the driving IC 530 may generate and output the pixel driving power and the pixel common voltage based on the plurality of reference gamma voltages.

Figure 8:
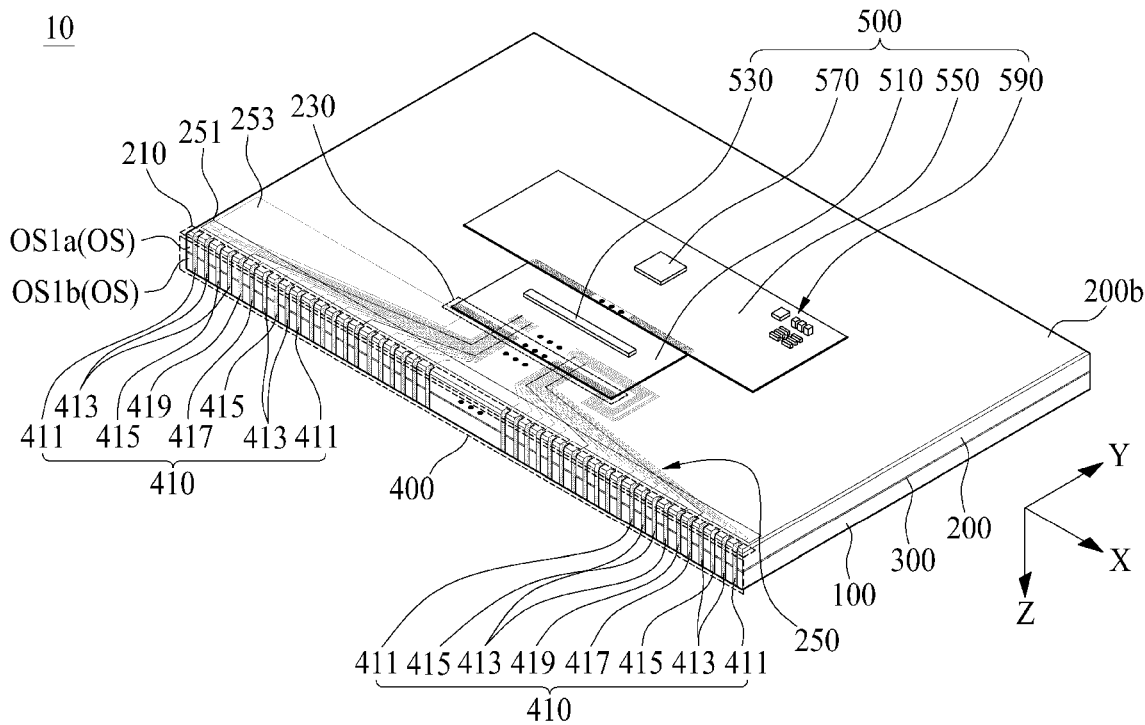
FIG. 8 is a rear perspective view illustrating a light emitting display apparatus according to another embodiment of the present disclosure.

FIG. 8 is a rear perspective view illustrating a light emitting display apparatus according to another embodiment of the present disclosure, and illustrates an embodiment where a wiring substrate is additionally provided in the light emitting display apparatus illustrated in FIGS. 1 and 7.

Referring to FIG. 8, the light emitting display apparatus according to another embodiment of the present disclosure may include a first substrate 100, a second substrate 200, a coupling member 300, and a routing portion 400.

The first substrate 100 may be referred to as a display substrate, a pixel array substrate, an upper substrate, a front substrate, or a base substrate. The first substrate 100 may be a glass substrate, or may be a thin glass substrate or a plastic substrate, which is bendable or flexible. The plurality of pixels on the first substrate 100 may define a display area AA which extends to the edge of the first substrate 100.

The first substrate 100 may be substantially the same as the substrate 100 of the light emitting display apparatus illustrated in FIGS. 1 to 7, and thus, like reference numerals refer to like elements and their repetitive descriptions may be omitted.

The second substrate 200 may be referred to as a wiring substrate, a line substrate, a link substrate, a lower substrate, a rear substrate, or link glass. The second substrate 200 may be a glass substrate, or may be a thin glass substrate or a plastic substrate, which is bendable or flexible. For example, the second substrate 200 may include the same material as that of the first substrate 100. A size of the second substrate 200 may be the same as or substantially the same as that of the first substrate 100, but embodiments of the present disclosure are not limited thereto, the size of the second substrate 200 may be smaller than that of the first substrate 100. For example, the second substrate 200 may be configured to have the same size as that of the first substrate 100 in order to maintain or secure the stiffness of the first substrate 100.

The second substrate 200 may include a first pad portion 210, a second pad portion 230, and a link line portion 250. Except for that the first pad portion 210, the second pad portion 230, and the link line portion 250 are disposed at a rear surface 200b of the second substrate 200, each of the first pad portion 210, the second pad portion 230, and the link line portion 250 may substantially the same as that of each of the first pad portion 210, the second pad portion 230, and the link line portion 250 illustrated in FIG. 7, and thus, like reference numerals refer to like elements and their repetitive descriptions may be omitted.

The second substrate 200 may be coupled (or connected) to a second surface 100b of the first substrate 100 by using the coupling member 300. The coupling member 300 may be interposed between the first substrate 100 and the second substrate 200. Thus, the first substrate 100 and the second substrate 200 may be opposite-bonded to each other by the coupling member 300.

The routing portion 400 may be referred to as a side routing portion, a side wiring portion, a printing wiring portion, or a printing line portion. The routing portion 400 may be configured to be disposed to surround the outer surface OS of the first substrate 100 and the outer surface OS of the second substrate 200. The routing portion 400 according to an embodiment of the present disclosure may include a plurality of routing lines which are disposed on each of the first outer surface (or one surface) OS1a among the outer surface OS of the first substrate 100 and the first outer surface (or one surface) OS1*b* among the outer surface OS of the second substrate 200. Each of the plurality of routing lines may be configured to be formed to surround each of the first outer surface OS1*a* of the first substrate 100 and the first outer surface OS1*b* of the second substrate 200. Except for that the plurality of routing lines is disposed to surround the contact pattern portion 110 and the first outer surface OS1*a* of the first substrate 100 and the first pad portion 210 and the first outer surface OS1*b* of the second substrate 200, the routing portion 400 may substantially the same as that of the routing portion 400 illustrated in FIG. 7, and thus, like reference numerals refer to like elements and their repetitive descriptions may be omitted.

The light emitting display apparatus according to another embodiment of the present disclosure may further include a driving circuit unit 500.

The driving circuit unit 500 may include a flexible circuit film 510, a driving integrated circuit (IC) 530, a printed circuit board (PCB) 550, a timing controller 570, and a power circuit unit 590. Except for that the flexible circuit film 510 is connected to the second pad portion 230 disposed at the rear surface of the second substrate 200, the driving circuit unit 500 having such a configuration may be substantially the same as the driving circuit unit 500 illustrated in FIG. 7, and thus, like reference numerals refer to like elements and their repetitive descriptions may be omitted.

Figure 10:
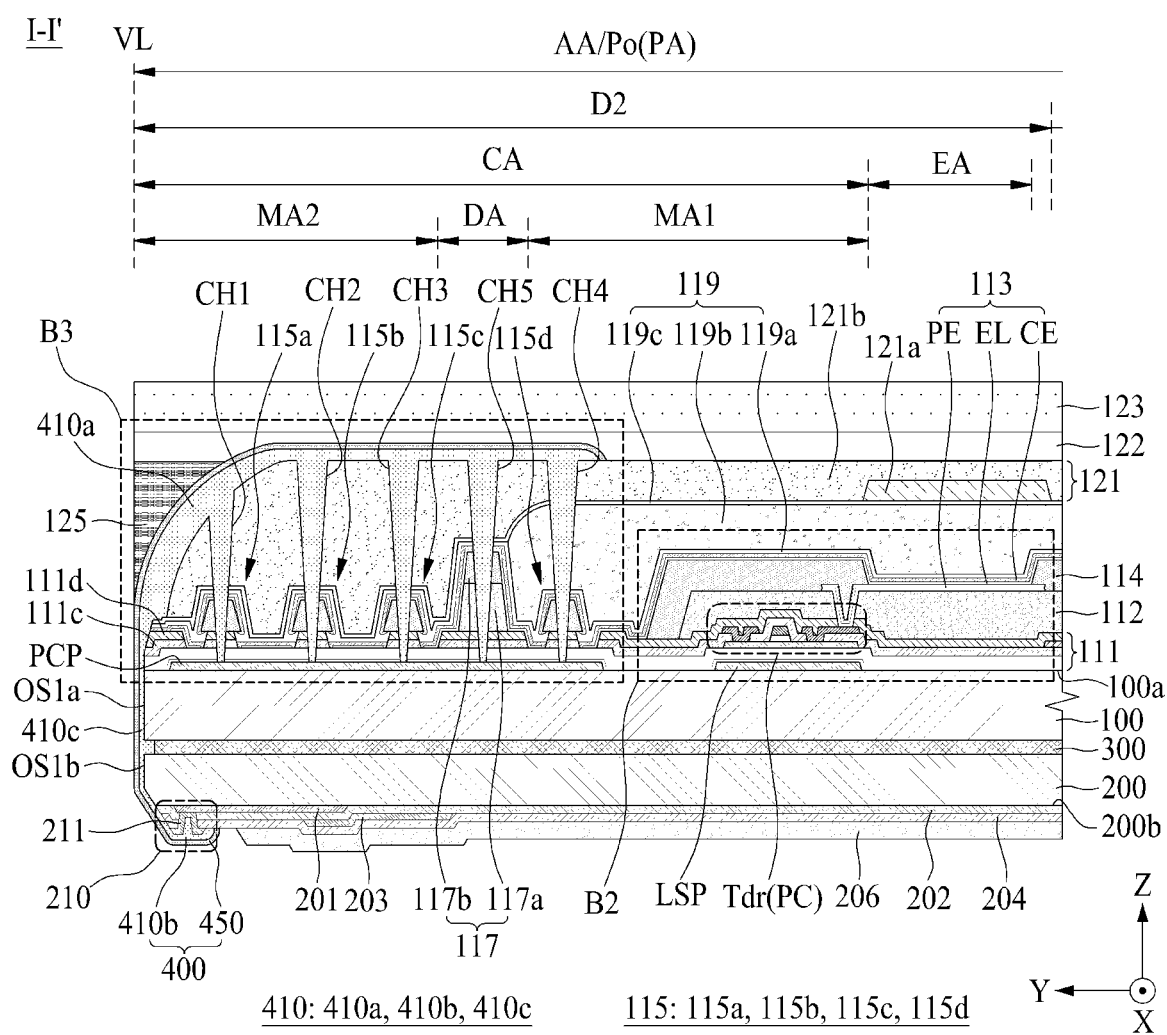
FIG. 10 is a cross-sectional view taken along line I-I' illustrated in FIG. 9.
Figure 11:
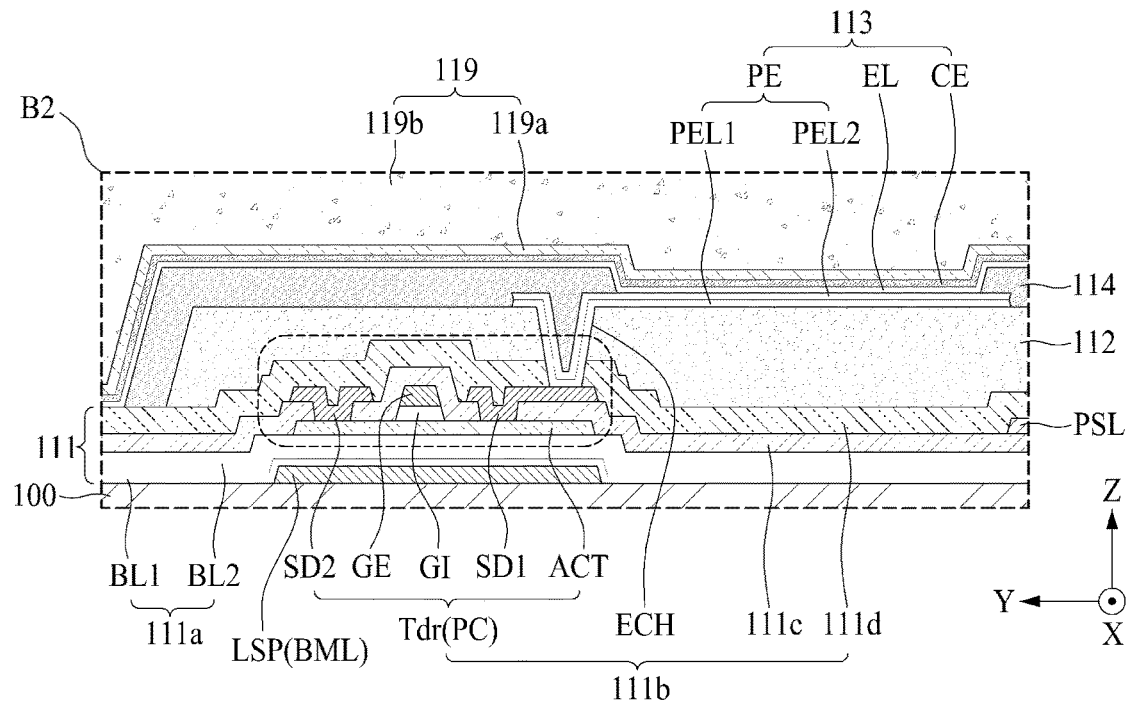
FIG. 11 is an enlarged view of a region B2 illustrated in FIG. 10.
Figure 12:
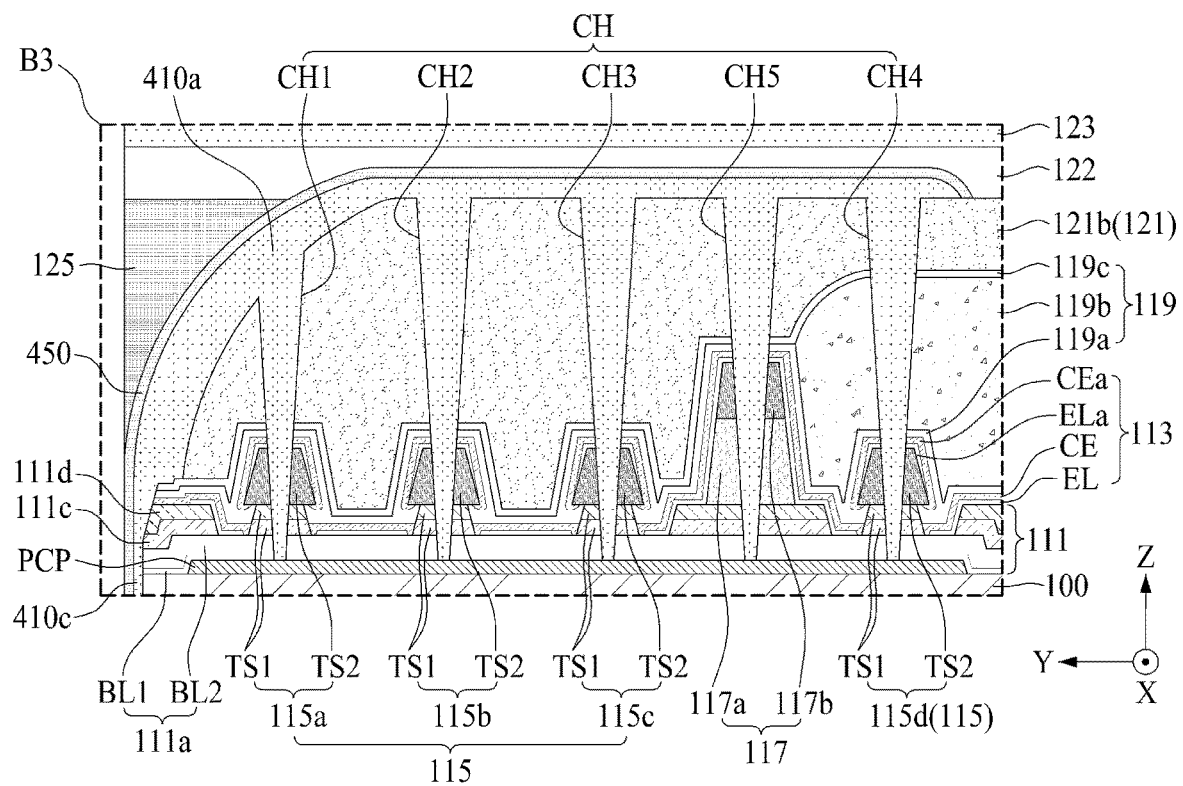
FIG. 12 is an enlarged view of a region B3 illustrated in FIG. 10.

FIG. 9 is a diagram illustrating a connection structure of a pixel driving line and a routing portion according to an embodiment of the present disclosure, FIG. 10 is a cross-sectional view taken along line I-I' illustrated in FIG. 9, FIG. 11 is an enlarged view of a region B2 illustrated in FIG. 10, and FIG. 12 is an enlarged view of a region B3 illustrated in FIG. 10. Region B3 includes a periphery portion of the substrate which is also adjacent to the outer surfaces (or outermost surfaces) of the substrate. FIG. 10 illustrates that the periphery portion is adjacent to the first outer surface OS1*a* of the first substrate 100. In descripting of FIGS. 9 to 12, elements which are the same as or correspond to the elements of FIGS. 1 to 8 are referred to by like reference numerals, and their repetitive descriptions are omitted or will be briefly given.

Referring to FIGS. 4, and 9 to 11, a light emitting display apparatus according to an embodiment of the present disclosure may include a first substrate 100.

The first substrate 100 may include a display area AA including a first region and a second region surrounding the first region. The second region of the first substrate 100 may be a periphery portion (or an edge portion) of the first substrate 100 or a periphery portion (or an edge portion) of outermost pixels. The first region of the first substrate 100 may be a portion other than the second region of the first substrate 100.

The first substrate 100 according to an embodiment of the present disclosure may include a circuit layer 111, a planarization layer 112, a light emitting device layer 113, a bank 114, a discontinuity portion 115, a dam portion 117, and an encapsulation layer 119.

The circuit layer 111 may be disposed on a first surface 100*a* of the first substrate 100. The circuit layer 111 may be referred to as a pixel array layer or a TFT array layer.

The circuit layer 111 according to an embodiment of the present disclosure may include a buffer layer 111*a* and a circuit array layer 111*b*.

The buffer layer 111*a* may prevent materials, such as hydrogen included in the first substrate 100, from being diffused to the circuit array layer 111*b* in a high temperature process of a process of manufacturing a TFT. Also, the buffer layer 111*a* may prevent external water or moisture from penetrating into the light emitting device layer 113. The buffer layer 111*a* according to an embodiment of the present disclosure may include a first buffer layer BL1 which includes silicon nitride (SiNx) and is disposed on the first substrate 100 and a second buffer layer BL2 which includes silicon oxide (SiOx), and is disposed on the first buffer layer BL1. The buffer layer 111*a* may be covered by at least one insulation layer.

The circuit array layer 111*b* may include a pixel circuit PC which includes a driving TFT Tdr disposed in each of a plurality of pixel areas PA on the buffer layer 111*a*.

The driving TFT Tdr disposed in each pixel area PA may include an active layer ACT, a gate insulation layer GI, a gate electrode GE, an interlayer insulation layer 111*c*, a first source/drain electrode SD1, a second source/drain electrode SD2, and a passivation layer 111*d*.

The active layer ACT may be disposed on the buffer layer 111*a* in each pixel area PA. The active layer ACT may include a channel area, overlapping the gate electrode GE, and a first source/drain area and a second source/drain area parallel to each other whith the channel area interposed therebetween. The active layer ACT may have conductivity in a conductivity process, and thus, may be used as a bridge line of a jumping structure which directly connects lines in the display area AA or electrically connects lines disposed on different layers.

The gate insulation layer GI may be disposed in the channel area of the active layer ACT. The gate insulation layer GI may insulate the active layer ACT from the gate electrode GE.

The gate electrode GE may be disposed on the gate insulation layer GI and connected to the gate line. The gate electrode GE may overlap the channel area of the active layer ACT with the gate insulation layer GI therebetween.

The interlayer insulation layer 111*c* may be disposed on the first substrate 100 to cover the gate electrode GE and the active layer ACT. The interlayer insulation layer 111*c* may electrically insulate (or isolate) the gate electrode GE and the source/drain electrodes SD1 and SD2. For example, the interlayer insulation layer 111*c* may be referred to as an insulation layer or a first insulation layer, but embodiments of the present disclosure are not limited thereto.

The first source/drain electrode SD1 may be disposed on the interlayer insulation layer 111*c* overlapping the first source/drain area of the active layer ACT and may be electrically connected to the first source/drain area of the active layer ACT through a first source/drain contact hole disposed in the interlayer insulation layer 111*c*. For example, the first source/drain electrode SD1 may be a source electrode of the driving TFT Tdr, and the first source/drain area of the active layer ACT may be a source area.

The second source/drain electrode SD2 may be disposed on the interlayer insulation layer 111*c* overlapping the second source/drain area of the active layer ACT and may be electrically connected to the second source/drain area of the active layer ACT through a second source/drain contact hole disposed in the interlayer insulation layer 111*c*. For example, the second source/drain electrode SD2 may be a drain electrode of the driving TFT Tdr, and the second source/drain area of the active layer ACT may be a drain area.

An electrode material of the source/drain electrodes SD1 and SD2 according to an embodiment of the present disclosure may be used as a signal line extending long on the first substrate 100 along the first direction X. The source/drain electrodes SD1 and SD2 may be implemented together with the gate line GL.

The passivation layer 111d may be disposed on the first substrate 100 to cover the pixel circuit PC including the driving TFT Tdr. For example, when the interlayer insulation layer 111c is not disposed at the periphery portion of the first substrate 100, the passivation layer 111d disposed at the periphery portion of the first substrate 100 may directly contact the buffer layer 111a. The passivation layer 111d may be referred to as a protection layer or a second insulation layer, but embodiments of the present disclosure are not limited thereto.

Each of first and second switching TFT Tsw1 and Tsw2 configuring the pixel circuit PC may be formed together with the driving TFT Tdr, and thus, their repetitive descriptions are omitted or may be brief.

The circuit layer 111 according to an embodiment of the present disclosure may further include a lower metal layer BML which is disposed between the first substrate 100 and the buffer layer 111a.

The lower metal layer BML may further include a light blocking pattern (or a light blocking layer) LSP which is disposed under (or below) the active layer ACT of each of the TFTs Tdr, Tsw1, and Tsw2 configuring the pixel circuit PC.

The light blocking pattern LSP may be disposed in an island shape between the first substrate 100 and the active layer ACT. The light blocking pattern LSP may block light which is incident on the active layer ACT through the first substrate 100, thereby preventing or minimizing a threshold voltage variation of each TFT caused by external light. Optionally, the light blocking pattern LSP may be electrically connected to the first source/drain electrode SD1 of a corresponding TFT and thus may act as a lower gate electrode of the corresponding TFT, and in this case, a characteristic variation of each TFT caused by light and a threshold voltage variation of each TFT caused by a bias voltage may be minimized or prevented.

The lower metal layer BML may be used as a metal layer implementing the pixel driving lines PL, DL, RL, GCL, and CVL which are spaced apart from each other along the first direction X and extended long along the second direction Y on the first substrate 100. Also, the lower metal layer BML may be used as a metal layer which implements a plurality of contact patterns PCP, DCP, RCP, GCP, and CCP of the contact pattern portion 110.

According to an embodiment of the present disclosure, the lower metal layer BML may be deposited on the whole front surface 100a of the first substrate 100, and then, may be patterned as the light blocking pattern LSP, the pixel driving power lines PL, the plurality of data lines DL, the pixel common voltage lines CVL, and the contact patterns PCP, DCP, RCP, GCP, and CCP, respectively, by using a patterning process.

The planarization layer 112 may be disposed on the first substrate 100 and may provide a flat surface on the circuit layer 111. The planarization layer 112 may cover the circuit layer 111 including the driving TFT Tdr disposed in each of the plurality of pixel areas PA. The planarization layer 112 according to an embodiment of the present disclosure may include acrylic resin, epoxy resin, phenolic resin, polyamides resin, or polyimides resin, but embodiments of the present disclosure are not limited thereto.

The planarization layer 112 according to an embodiment of the present disclosure may be formed to cover the circuit layer 111 except a periphery portion of the first substrate 100. Therefore, the passivation layer 111d of the circuit layer 111 disposed at the periphery portion of the first substrate 100 may be exposed without being covered by the planarization layer 112.

The light emitting device layer 113 may be on each of the plurality of pixels and the edge of the first substrate 100, and may be disposed on the planarization layer 112. The light emitting device layer 113 according to an embodiment of the present disclosure may include a pixel electrode PE, a light emitting layer EL, and a common electrode CE.

The pixel electrode PE may be referred to as an anode electrode, a reflective electrode, a lower electrode, or a first electrode.

The pixel electrode PE may be disposed on the planarization layer 112 overlapping an emission area EA of each of the plurality of pixel areas PA. The pixel electrode PE may be patterned and disposed in an island shape in each pixel area PA and may be electrically connected to the first source/drain electrode SD1 of the driving TFT Tdr of a corresponding pixel circuit PC. One side of the pixel electrode PE may extend from the first source/drain electrode SD1 of the driving TFT Tdr and may be electrically connected to the first source/drain electrode SD1 of the driving TFT Tdr through an electrode contact hole ECH provided in the planarization layer 112.

The pixel electrode PE may include a metal material which is low in work function and is good in reflective efficiency.

The pixel electrode PE according to an embodiment of the present disclosure may have a two-layer structure including a first pixel electrode layer (or a first metal layer) PEL1 and a second pixel electrode layer (or a second metal layer) PEL2. The first and second pixel electrode layers PEL1 and PEL2 may be sequentially deposited on the planarization layer 112 and then simultaneously patterned.

The first pixel electrode layer PEL1 may disposed on the planarization layer 112. The second pixel electrode layer PEL2 may disposed (or stacked) on the first pixel electrode layer PEL1. For example, the first pixel electrode layer PEL1 may act as an adhesive layer corresponding to the planarization layer 112 and may act as a secondary electrode of the light emitting layer EL, and moreover, may include indium tin oxide (ITO) or indium zinc oxide (IZO), but embodiments of the present disclosure are not limited thereto. For example, the second pixel electrode layer PEL2 may act as a reflector and may perform a function of decreasing a resistance of the pixel electrode PE, and moreover, may include one or more material of aluminum (Al), silver (Ag), molybdenum (Mo), titanium (Ti), and a Mo—Ti alloy (MoTi), but embodiments of the present disclosure are not limited thereto. For example, the pixel electrode PE according to an embodiment of the present disclosure may be formed in a two-layer structure of ITO/MoTi or IZO/MoTi.

The pixel electrode PE according to another embodiment may have a three-layer structure including a first pixel electrode layer PEL1, a second pixel electrode layer PEL2 on the first pixel electrode layer PEL1, and a third pixel electrode layer (or a third metal layer). The third pixel electrode layer may act as an electrode of the light emitting layer EL and may include ITO or IZO. For example, the pixel electrode PE according to another embodiment may be formed in a three-layer structure of IZO/MoTi/ITO or ITO/MoTi/ITO.

The pixel electrode PE according to another embodiment may have a four-layer structure including a first pixel electrode layer PEL1, a second pixel electrode layer PEL2 on the first pixel electrode layer PEL1, a third pixel electrode layer (or a third metal layer) on the second pixel electrode layer PEL2, a fourth pixel electrode layer (or a fourth metal layer) on the third pixel electrode layer.

In the pixel electrode PE of the four-layer structure, the first pixel electrode layer may act as the adhesive layer corresponding to the planarization layer 112 and may act as the secondary electrode of the light emitting layer EL, and moreover, may include one or more material of ITO, Mo, and Mo—Ti. The second pixel electrode layer may perform a function of decreasing a resistance of the pixel electrode PE and may include Cu. The third pixel electrode layer may act as a reflector and may include one or more material of Al, Ag, Mo, Ti, and MoTi. The fourth pixel electrode layer may act as an electrode of the light emitting layer EL and may include ITO or IZO. For example, the pixel electrode PE according to another embodiment may be formed in a four-layer structure of ITO/Cu/MoTi/ITO.

The pixel electrode PE according to another embodiment may have a five-layer structure including a first pixel electrode layer made of ITO, a second pixel electrode layer made of MoTi, a third pixel electrode layer made of ITO, a fourth pixel electrode layer made of Ag, and a fifth pixel electrode layer made of ITO.

The light emitting layer EL may be disposed on the first region of the first substrate 100 and disposed at at least portion of the second region of the first substrate 100. The light emitting layer EL may be formed on the pixel electrode PE and may directly contact the pixel electrode PE. The pixel electrode PE may be disposed under (or below) the light emitting layer EL. For example, the pixel electrode PE may be disposed between the planarization layer 112 and the light emitting layer EL.

The light emitting layer EL according to another embodiment may be a common layer which is formed in common in each of a plurality of subpixels SP so as not to be distinguished by subpixel SP units. The light emitting layer EL may react on a current flowing between the pixel electrode PE and the common electrode CE to emit white light (or blue light). The light emitting device ED according to an embodiment of the present disclosure may include an organic light emitting layer, or may include a stacked or combination structure of an organic light emitting layer and a quantum dot light emitting layer.

An organic light emitting layer EL according to an embodiment of the present disclosure may include two or more organic light emitting layers for emitting white light. For example, the organic light emitting layer EL may include a first organic light emitting layer and a second organic light emitting layer for emitting white light on the basis of a combination of first light and second light. For example, the first organic light emitting layer may include at least one of a blue light emitting layer, a green light emitting layer, a red light emitting layer, a yellow light emitting layer, and a yellow-green light emitting layer. The second organic light emitting layer may include at least one of a blue light emitting layer, a green light emitting layer, a red light emitting layer, a yellow light emitting layer, and a yellow-green light emitting layer for emitting second light which is combined with first light to generate white light.

The organic light emitting layer according to an embodiment of the present disclosure may further include one or more function layers for enhancing emission efficiency and/or lifetime. For example, the function layer may be interposed between the hole functional layer and the electron functional layer.

The common electrode CE may be referred to as a cathode electrode, a transparent electrode, an upper electrode, or a second electrode. The common electrode CE may be formed on the light emitting layer EL and may directly contact the light emitting layer EL or may electrically and directly contact the light emitting layer EL. The common electrode CE may include a transparent conductive material which transmits light emitted from the light emitting layer EL.

The common electrode CE according to an embodiment of the present disclosure may be formed in a single-layer structure or a multi-layer structure, which includes at least one material of graphene and a transparent conductive material which is relatively high in work function. For example, the common electrode CE may include metal oxide such as ITO or IZO, or may include a combination of oxide and metal such as ZnO:Al or $SnO_2$:Sb.

Additionally, the light emitting device layer 113 may further include a capping layer disposed on the common electrode CE. The capping layer may improve the emission efficiency of light by adjusting a refractive index of light emitted from the light emitting layer EL.

The bank 114 may be disposed on the planarization layer 112 to define the pixel areas PA on the first substrate 100. The bank 114 may be disposed on the planarization layer 112 to cover a periphery portion of the pixel electrode PE. The bank 114 may define the emission area EA (or an opening portion) of each of the plurality of subpixels SP and may electrically isolate pixel electrodes PE disposed in adjacent subpixels SP. The bank 114 may be formed to cover the electrode contact hole ECH disposed in each of the plurality of pixel areas PA. The bank 114 may be covered by the light emitting layer EL. For example, the light emitting layer EL may be disposed on the bank 114 as well as on the pixel electrode PE of each of the plurality of subpixels SP.

The bank 114 according to an embodiment of the present disclosure may be a transparent bank including a transparent material or a black bank (or an opaque bank) including a black pigment.

Referring to FIGS. 4, 9, 10, and 12, the discontinuity portion 115 according to an embodiment of the present disclosure may be disposed in a second region of the first substrate 100. The discontinuity portion 115 may be disposed at a periphery portion of the first substrate 100 or a periphery portion of each of the outermost pixels Po to have a closed loop form (or a closed loop line form) surrounding the display portion AA one-dimensionally. The discontinuity portion 115 may be implemented on the buffer layer 111a or the interlayer insulation layer 111c at the periphery portion of the first substrate 100. For example, the interlayer insulation layer 111c may be disposed at a portion other than the periphery portion of the first substrate 100, and in this case, the discontinuity portion 115 may be implemented on the buffer layer 111a.

The discontinuity portion 115 according to an embodiment of the present disclosure may be implemented to disconnect (or isolate), at least once, the light emitting device layer 113 disposed in the second region of the first substrate 100. Therefore, the discontinuity portion 115 may be referred to as an isolation portion, an isolation line portion, a cutting portion, a cutting line portion, a cut-off portion, a cut-off line portion, a disconnection portion, or a disconnection line portion, but embodiments of the present disclosure are not limited thereto.

The discontinuity portion 115 according to an embodiment of the present disclosure may include at least one discontinuity structures 115a to 115d having a closed loop line form. For example, when the discontinuity portion 115 includes a plurality of discontinuity structures 115a to 115d, the discontinuity portion 115 may include an outer discontinuity portion disposed at an outer periphery of the dam portion 117 and an inner discontinuity portion disposed at an inner periphery of the dam portion 117. According to an embodiment of the present disclosure, the discontinuity portion 115 may include first to fourth discontinuity structures 115*a* to 115*d*, and in this case, the outer discontinuity portion may include the first to third discontinuity structures 115*a*, 115*b*, and 115*c*, and the inner discontinuity portion may include the fourth discontinuity structure 115*d*. For example, the first to third discontinuity structures 115*a*, 115*b*, and 115*c* may be referred to as a plurality of outer discontinuity structures, and the fourth discontinuity structure 115*d* may be referred to as at least one inner discontinuity structure, but embodiments of the present disclosure are not limited thereto.

Each of the first to fourth discontinuity structures 115*a* to 115*d* according to an embodiment of the present disclosure may include a first strip structure TS1 and a second strip structure TS2.

The first strip structure TS1 according to an embodiment of the present disclosure may be implemented in a stack structure of the interlayer insulation layer 111*c* and the passivation layer 111*d*. The first strip structure TS1 may be formed by a patterning and etching process performed on the interlayer insulation layer 111*c* and the passivation layer 111*d* disposed in the second region of the first substrate 100. For example, in some embodiments, the first strip structure TS1 may also be referred to as the term such as a first structure, a first isolation structure, a first taper structure, or a lower structure, but embodiments of the present disclosure are not limited thereto.

A side surface of the first strip structure TS1 according to an embodiment of the present disclosure may be implemented in an inclined structure or a forward tapered structure. A bottom surface of the first strip structure TS1 may directly contact a top surface (or a surface) of the buffer layer 111*a*, and a top surface of the first strip structure TS1 may be disposed on the bottom surface of the first strip structure TS1 and may have a width which is narrower than that of the bottom surface of the first strip structure TS1. A side surface of the first strip structure TS1 may be formed to be inclined between the top surface and the bottom surface of the first strip structure TS1. In the first strip structure TS1, an included angle between the bottom surface and the side surface may be an acute angle, and an included angle between the top surface and the side surface may be an obtuse angle. For example, a cross-sectional surface of the first strip structure TS1 taken along a width direction may have a cross-sectional structure having a trapezoid shape where the top surface is narrower than the bottom surface.

According to another embodiment of the present disclosure, when the interlayer insulation layer 111*c* is not disposed at the periphery portion of the first substrate 100, the first strip structure TS1 may be implemented with only the passivation layer 111*d*. The first strip structure TS1 may be formed by a patterning process performed at the passivation layer 111*d* disposed in the second region of the first substrate 100.

The second strip structure TS2 may be disposed on the first strip structure TS1. For example, in some embodiments, the second strip structure TS2 may also be referred to as the term such as a second structure, a second isolation structure, a second tapered structure, or an upper structure, but embodiments of the present disclosure are not limited thereto.

The second strip structure TS2 may have a width which is wider than that of the top surface of the first strip structure TS1. The second strip structure TS2 may have a width which is wider than or equal to that of the bottom surface of the first strip structure TS1. For example, a side surface of the second strip structure TS2 may be implemented in an inclined structure or a forward tapered structure. For example, a cross-sectional surface of the second strip structure TS2 taken along a width direction may have a cross-sectional structure having the same trapezoid shape as that of the first strip structure TS1. With respect to the width direction, each of one side periphery portion and the other side periphery portion of the second strip structure TS2 may protrude to the outside of the side surface of the first strip structure TS1.

The second strip structure TS2 may include an organic material. The second strip structure TS2 according to an embodiment of the present disclosure may include the same material as that of the bank 114, but embodiments of the present disclosure are not limited thereto. For example, the second strip structure TS2 may not be patterned (or removed) in performing a patterning process on a bank material and may be implemented with a bank material remaining in the first strip structure TS1. The second strip structure TS2 may be implemented to have the same height (or thickness) as that of the bank 114.

The side surface of the first strip structure TS1 may have an undercut structure with respect to the second strip structure TS2. For example, the discontinuity portion 115 may include a boundary portion between the first strip structure TS1 and the second strip structure TS2 or an undercut region disposed on an upper side surface of the first strip structure TS1. The second strip structure TS2 may protrude to the outside of the side surface of the first strip structure TS1 on the basis of the undercut structure of the first strip structure TS1, and thus, may cover the side surface of the first strip structure TS1. Accordingly, the second strip structure TS2 may have an eaves structure with respect to the first strip structure TS1.

The discontinuity portion 115 including the first to fourth discontinuity structures 115*a* to 115*d* according to an embodiment of the present disclosure may disconnect (or isolate) the light emitting layer EL, or may disconnect (or isolate) the light emitting layer EL and the common electrode CE. For example, the light emitting layer EL formed (or deposited) on the discontinuity portion 115 may be automatically disconnected (or isolated) in performing a deposition process on the basis of the undercut structure (or the eaves structure) of each of the first to fourth discontinuity structures 115*a* to 115*d* without a separate isolation process. Therefore, the light emitting layer EL disposed on the first substrate 100 may be disconnected (or isolated) four times in the second region of the first substrate 100 and may include four discontinuity regions (or isolation regions). For example, a deposition material of the light emitting layer EL may have linearity, and thus, may not be deposited on the side surface of the first strip structure TS1 covered by the second strip structure TS2 on the basis of the undercut structure (or the eaves structure) of each of the first to fourth discontinuity structures 115*a* to 115*d*. Therefore, the light emitting layer EL formed (or deposited) on the first to fourth discontinuity structures 115*a* to 115*d* may be disconnected (or isolated) between the first strip structure TS1 and the second strip structure TS2. Accordingly, the light emitting layer EL may be automatically disconnected (or isolated) by the first to fourth discontinuity structures 115*a* to 115*d* of the discontinuity portion 115 in performing a deposition process, which will have a secondary benefit and result of preventing moisture and acting also like a secondary dam. Thus, a separate patterning process of disconnecting (or isolating) the light emitting layer EL disposed at the periphery portion of the first substrate 100 for preventing the side transmission of water or moisture may be omitted. Namely, the discontinuity portion 115 performs the function of disconnecting parts of the common electrode CE from other parts and based on its structure and location also acts to perform a blocking of moisture and other debris from reaching the main array, acting as a secondary dam to assist in the function performed by dam portion 117. This permits the display panel to be constructed without a dedicated separated dam from dam portion 117 since the discontinuity structure serves to assist in this function as well.

Optionally, the common electrode CE disposed on the light emitting layer EL may be automatically disconnected (or isolated) by the first to fourth discontinuity structures 115a to 115d of the discontinuity portion 115 in performing a deposition process based on deposition, or may be deposited on a side surface of the first strip structure TS1 covered by the second strip structure TS2 and may be continuously formed without a discontinuity region.

The dam portion 117 may be disposed on the circuit layer 111 at the second region of the first substrate 100 to have a closed loop shape or a closed loop line shape. For example, the dam portion 117 according to an embodiment of the present disclosure may be disposed on a passivation layer 111d of the circuit layer 111. For example, the dam portion 117 may be surrounded by the discontinuity portion 115. For example, the dam portion 117 may be disposed between the third discontinuity structure 115c and the fourth discontinuity structure 115d. The dam portion 117 may be surrounded by the third discontinuity structure 115c and may surround the fourth discontinuity structure 115d. The dam portion 117 may prevent the spread or overflow of the encapsulation layer 119.

The dam portion 117 according to an embodiment of the present disclosure may include the same material and be formed together with the planarization layer 112. The dam portion 117 may have the same height (or thickness) as that of the planarization layer 112, or may have a height which is higher than the planarization layer 112. For example, a height (or thickness) of the dam portion 117 may be twice a height (or thickness) of the planarization layer 112.

According to another embodiment, the dam portion 117 may include a first dam (or a lower dam) 117a which is formed of the same material and be formed together with the planarization layer 112, and a second dam (or an upper dam) 117b which is stacked on the first dam 117a and includes the same material as that of the bank 114. The first dam 117a may have the same height (or thickness) as that of the planarization layer 112, or may have a height which is higher than the planarization layer 112. For example, a height (or thickness) of the first dam 117a may be twice a height (or thickness) of the planarization layer 112.

The encapsulation layer 119 may be disposed on the light emitting device layer 113, and the encapsulation layer 119 and at least one of the plurality of routing lines 410 may overlap with each other at the periphery portion of the first substrate 100. For example, the encapsulation layer 119 may be implemented to surround all of a front surface and lateral surfaces of the light emitting device layer 113.

The encapsulation layer 119 according to an embodiment of the present disclosure may include first to third encapsulation layer 119a, 119b, and 119c.

The first encapsulation layer 119a may be implemented to prevent oxygen or water from penetrating into the light emitting device layer 113. The first encapsulation layer 119a may be disposed on the common electrode CE to surround the light emitting device layer 113. For example, the first encapsulation layer 119a may be implemented in a conformal shape based on a surface shape of the common electrode CE, and thus, may surround the common electrode CE. An end of the first encapsulation layer 119a may directly contact the passivation layer 111d and may surround an end of the common electrode CE. Therefore, all of the front surface and lateral surfaces of the light emitting device layer 113 may be surrounded by the first encapsulation layer 119a. For example, the first encapsulation layer 119a may directly contact a top surface of the passivation layer 111d at each of the inner portions of discontinuity portion 115, the dam portion 117, and outer portions of the discontinuity portion 115 and may cover a boundary portion (or an interface) between the common electrode CE and the passivation layer 111d, thereby preventing or minimizing lateral water penetration. The first encapsulation layer 119a according to an embodiment of the present disclosure may include an inorganic material. For example, the first encapsulation layer 119a may be referred to as a first inorganic encapsulation layer.

The second encapsulation layer 119b may be implemented on the first encapsulation layer 119a to have a thickness which is relatively thicker than that of the first encapsulation layer 119a. The second encapsulation layer 119b may have a thickness for sufficiently covering particles (or an undesired material or an undesired structure) which is or may be on the first encapsulation layer 119a. The second encapsulation layer 119b may spread to a periphery portion of the first substrate 100 due to a relatively thick thickness, but the spread of the second encapsulation layer 119b may be blocked by the dam portion 117 (i.e., not extending beyond the dam portion 117).

According to an embodiment of the present disclosure, the second encapsulation layer 119b may be disposed on the first encapsulation layer 119a and surrounded by the dam portion 117. An end of the second encapsulation layer 119b may directly contact the first encapsulation layer 119a on the dam portion 117. Accordingly, the second encapsulation layer 119b may be disposed on only the first encapsulation layer 119a in an internal region (or an inner region) surrounded by the dam portion 117. The second encapsulation layer 119b may be referred to as a particle cover layer. The second encapsulation layer 119b according to an embodiment of the present disclosure may include an organic material such as SiOCz acryl or epoxy-based resin.

The third encapsulation layer 119c may be implemented to primarily prevent oxygen or water from penetrating into the light emitting device layer 113. The third encapsulation layer 119c may be disposed on the second encapsulation layer 119b and the first encapsulation layer 119a on the dam portion 117. The third encapsulation layer 119c may be implemented to surround all of the second encapsulation layer 119b and the first encapsulation layer 119a uncovered by the second encapsulation layer 119b. For example, the third encapsulation layer 119c may directly contact a top surface of the passivation layer 111d and may cover a boundary portion (or an interface) between the first encapsulation layer 119a and the passivation layer 111d, thereby additionally preventing or minimizing lateral water penetration. The third encapsulation layer 119c according to an embodiment of the present disclosure may include an inorganic material. For example, the third encapsulation layer 119c may be referred to as a second inorganic encapsulation layer. For example, the second encapsulation layer 119b may be interposed between the first encapsulation layer 119a and the third encapsulation layer 119c on the light emitting device layer 113 surrounded by the dam portion 117.

The first substrate 100 according to an embodiment of the present disclosure may further include a first margin area MA1, a second margin area MA2, and a dam area DA.

The first margin area MA1 may be disposed between an emission area EA of the outermost pixel Po and the dam portion 117. The first margin area MA1 may be configured to have a first width between an end of the emission area EA (or the bank 114) of the outermost pixel Po and the dam portion 117 based on the reliability margin of the light emitting device layer 113 caused by lateral water penetration of water or moisture. Accordingly, the dam portion 117 may be implemented to be spaced apart from the end of the emission area EA by the first width of the first margin area MA1 with respect to the first direction X.

The second margin area MA2 may be disposed between the outer surface OS of the first substrate 100 and the dam portion 117. The second margin area MA2 may be configured to have a second width between the outer surface OS of the first substrate 100 and the dam portion 117 based on the reliability margin of the light emitting device layer 113 caused by lateral water penetration of water or moisture. Accordingly, the dam portion 117 may be implemented to be spaced apart from the outer surface OS of the first substrate 100 by the second width of the second margin area MA2 with respect to the first direction X.

The dam area DA may be disposed between the first margin area MA1 and the second margin area MA2. The dam area DA may be configured to have a third width corresponding to a width of a lowermost bottom surface (or a bottom surface) of the dam portion 117.

With respect to the first direction X, a width of each of the first margin area MA1, the second margin area MA2, and the dam area DA may be implemented so that a second interval D2 between a center portion of the outermost pixel and the outer surface OS of the first substrate 100 is half or less of a first interval (or a pixel pitch) D1 between two adjacent pixel areas PA.

The light emitting display apparatus (or a light emitting display panel) according to the present disclosure may further include a wavelength conversion layer 121 disposed on the first substrate 100.

The wavelength conversion layer 121 may convert a wavelength of light incident from the emission area EA of each of the plurality of pixel areas PA. For example, the wavelength conversion layer 121 may convert white light (or blue light), which is incident from the emission area EA, into colored light corresponding to a corresponding subpixel or transmit only color light corresponding to a corresponding subpixel. For example, the wavelength conversion layer 121 may include at least one or more of wavelength conversion member and a color filter layer.

The wavelength conversion layer 121 according to an embodiment of the present disclosure may include a plurality of wavelength conversion members 121a and an overcoat layer 121b.

The plurality of wavelength conversion members 121a may be disposed on the encapsulation layer 119 disposed in the emission area EA of each of the plurality of subpixel areas. For example, each of the plurality of wavelength conversion members 121a may be configured to have the same size as the light emitting area EA of each subpixel area or have a size which is wider than the light emitting area EA of each subpixel area.

The overcoat layer (or a protection layer) 121b may be implemented to cover the wavelength conversion members 121a and to provide a flat surface on the wavelength conversion members 121a. For example, the overcoat layer 121b may be disposed to cover the wavelength conversion members 121a and the encapsulation layer 119 where the wavelength conversion members 121a are not disposed. The overcoat layer 121b according to an embodiment of the present disclosure may include an organic material. For example, the overcoat layer 121b may include acryl resin, epoxy resin, phenolic resin, polyamides resin, or polyimides resin, but embodiments of the present disclosure are not limited thereto. Optionally, the overcoat layer 121b may further include a getter material for adsorbing water and/or oxygen.

Optionally, the wavelength conversion layer 121 according to an embodiment of the present disclosure may further include a quantum dot member interposed between the wavelength conversion members 121a and the encapsulation layer 119. The quantum dot member may be configured to re-emit colored light set in a subpixel by re-emitting white light or blue light incident from the light emitting device layer 113.

Alternatively, the wavelength conversion layer 121 may be changed to a wavelength conversion sheet having a sheet form and may be disposed on the encapsulation layer 119. For example, the wavelength conversion sheet (or a quantum dot sheet) may include the wavelength conversion members 121a interposed between a pair of films. For example, the wavelength conversion members 121a of the wavelength conversion sheet may include a quantum dot member configured to re-emit colored light set in the subpixel by re-emitting white or blue light incident from the light emitting device layer 113.

The light emitting display apparatus or the first substrate 100 according to an embodiment of the present disclosure may further include a functional film 123.

The functional film 123 may be disposed on the wavelength conversion layer 121. For example, the functional film 123 may be coupled to the wavelength conversion layer 121 by a transparent adhesive member 122.

The functional film 123 according to an embodiment of the present disclosure may include an anti-reflection layer (or an anti-reflection film) for preventing reflection of external light to enhance outdoor visibility and a contrast ratio with respect to an image displayed by the light emitting display apparatus 10. For example, the anti-reflection layer may include a circular polarization layer (or a circular polarization film) which prevents external light, reflected by TFTs and/or the pixel driving lines disposed on the first substrate 100, from traveling to the outside.

The functional film 123 according to an embodiment of the present disclosure may further include a barrier layer (or a barrier film) for primarily preventing the penetration of water or moisture or oxygen, and the barrier layer may include a material (for example, a polymer material) which is low in water transmission rate.

The functional film 123 according to an embodiment of the present disclosure may further include a light path control layer (or a light path control film) for controlling a path of light output from each pixel P to the outside. The light path control layer may include a stacked structure where a high refraction layer and a low refraction layer are alternately stacked and may change a path of light incident from each pixel P to reduce or minimize a color shift based on a viewing angle.

The light emitting display apparatus or the first substrate 100 according to an embodiment of the present disclosure may further include a side sealing member 125.

The side sealing member (or an edge sealing member) 125 may be formed between the first substrate 100 and the functional film 123 and may cover all of side (or lateral) surfaces of each of the circuit layer 111, the planarization layer 112, and the wavelength conversion layer 121. That is, the side sealing member 125 may cover all of side surfaces of each of the circuit layer 111, the planarization layer 112, and the wavelength conversion layer 121 which are exposed at the outside of the light emitting display apparatus 10, between the functional film 123 and the first substrate 100. For example, each of the outermost outer surface of the first substrate 100, an outer surface of the side sealing member 125, and an outer surface of the functional film 123 may be disposed (or aligned) on the same vertical extension line VL.

The side sealing member 125 according to an embodiment of the present disclosure may include a silicon-based or ultraviolet (UV)-curable sealant (or resin), but considering a takt process time (or tact time), the side sealing member 125 may include the UV-curable sealant. Also, the side sealing member 125 may have a color (for example, blue, red, bluish green, or black), but embodiments of the present disclosure are not limited thereto and may include a colored resin or a light blocking resin for preventing lateral light leakage. Optionally, the side sealing member 125 may further include a getter material for adsorbing water and/or oxygen.

The light emitting display apparatus according to an embodiment of the present disclosure may further include a second substrate 200.

The second substrate 200 may include a metal pattern layer and an insulation layer which insulates the metal pattern layer.

The metal pattern layer (or a conductive pattern layer) may include a plurality of metal layers. The metal pattern layer according to an embodiment of the present disclosure may include a first metal layer 201, a second metal layer 203, and a third metal layer. The insulation layer may include a plurality of insulation layers. For example, the insulation layer may include a first insulation layer 202, a second insulation layer 204, and a third insulation layer 206. The insulation layer may be referred to as a rear insulation layer or a pattern insulation layer.

The first metal layer 201, the second metal layer 203, and the third metal layer may be used as pads 211 of the first pad portion 210, pads of the second pad portion 230, and link lines of the link line portion 250, which are disposed on the rear surface 200b of the second substrate 200. For example, the first metal layer 201 may be used as some link lines of the plurality of link lines, and the third metal layer may be used as pads 211 and the other link lines of the plurality of link lines. The second metal layer 203 may be used as a jumping line (or a bridge line) for electrically connecting link lines disposed on different layers.

The first insulation layer 202 may be implemented on the rear surface 200b of the second substrate 200 to cover the first metal layer 201. The second insulation layer 204 may be implemented on the rear surface 200b of the second substrate 200 to cover the second metal layer 203. The third insulation layer 206 may be implemented on the rear surface 200b of the second substrate 200 to cover the third metal layer.

The second substrate 200 may be coupled to the rear surface of the first substrate 100 by the coupling member 300.

The coupling member 300 may be disposed between the first substrate 100 and the second substrate 200. Therefore, the first substrate 100 and the second substrate 200 may be opposite-bonded to each other by a coupling member 300. The coupling member 300 according to an embodiment of the present disclosure may be a transparent adhesive member or a double-sided tape including an OCA or an OCR. According to another embodiment, the coupling member 300 may include a glass fiber.

The coupling member 300 according to an embodiment of the present disclosure may be disposed in a whole space between the first substrate 100 and the second substrate 200. For example, all of the second surface 100b of the first substrate 100 may be coupled to all of one surface of the coupling member 300, and all of a front surface 200a of the second substrate 200 may be coupled to all of the other surface of the coupling member 300.

The coupling member 300 according to another embodiment may be disposed in a pattern structure between the first substrate 100 and the second substrate 200. For example, the coupling member 300 may have a line pattern structure or a mesh pattern structure. The mesh pattern structure may further include a bent portion which discharges an air bubble, occurring between the first substrate 100 and the second substrate 200 in a process of bonding the first substrate 100 to the second substrate 200, to the outside.

Optionally, the coupling member 300 may further include a heat transfer element. In this case, the coupling member 300 may transfer heat, occurring in the first substrate 100, to the second substrate 200 through the heat transfer element to prevent or minimize an increase in temperature of the first substrate 100. The second substrate 200 may act as a temperature lowering member which prevents or minimizes an increase in temperature of the first substrate 100. For example, the heat transfer element may include a plurality of heat transfer particles or a heat transfer layer including a metal material. When the heat transfer element includes a heat transfer layer including a metal material, the heat transfer layer may be electrically grounded or floated, and thus, may act as a noise blocking layer which prevents frequency noise or static electricity, occurring in a driving circuit disposed on the rear surface 200b of the second substrate 200, from flowing into the pixels, the pixel driving lines, and the gate driving circuit 150, which are disposed on the first substrate 100.

The light emitting display apparatus according to an embodiment of the present disclosure may further include a routing portion 400.

The routing portion 400 may electrically and respectively connect the contact patterns PCP, DCP, RCP, GCP, and CCP of the contact pattern portion 110, disposed at one side periphery portion of the first substrate 100, to pads 211 of the first pad part 210 disposed at one side periphery portion of the second substrate 200. The routing portion 400 may be implemented to surround an outer surface OS1a and a contact pattern portion 110 of the first substrate 100 and an outer surface OS1b and a contact pattern portion 110 of the second substrate 200, and thus, may electrically and directly connect the contact patterns PCP, DCP, RCP, GCP, and CCP of the contact pattern portion 110 to the pads 211 of the first pad part 210. The routing portion 400 may be disposed at the one side periphery portion of each of the first and second substrates 100 and 200 and may be electrically and directly connected to the contact pattern portion 110 through the dam portion 117 or all of the discontinuity portion 115 and the dam portion 117, and thus, may replace a pad part disposed at an outermost periphery portion of the first substrate 100. Accordingly, the light emitting display apparatus according to an embodiment of the present disclosure may not need the pad part disposed at the outermost periphery portion of the first substrate 100 and may have an air bezel structure where a bezel area is not provided.

The routing portion 400 according to an embodiment of the present disclosure may be electrically connected to the contact pattern portion 110 through a routing contact hole CH passing through at least one of the dam portion 117 and the discontinuity portion 115 disposed on the contact pattern portion 110. The discontinuity portion 115 may be on the contact pattern portion 110, wherein at least one of a routing line among the plurality of routing lines 410 may extend through the encapsulation layer and the discontinuity portion 115 to couple to the contact pattern portion 110.

According to a first embodiment of the present disclosure, the routing portion 400 may pass through the third encapsulation layer 119c, the first encapsulation layer 119a, and the dam portion 117 disposed on the contact pattern portion 110 and may be electrically connected to the contact pattern portion 110. For example, the routing portion 400 according to the first embodiment of the present disclosure may be electrically connected to the contact pattern portion 110 through a routing contact hole CH passing through the dam portion 117 disposed on the contact pattern portion 110. For example, the routing portion 400 according to the first embodiment of the present disclosure may be electrically connected to the contact pattern portion 110 through a routing contact hole CH sequentially passing through the third encapsulation layer 119c disposed on the contact pattern portion 110, the first encapsulation layer 119a, an isolated light emitting device layer 113, the dam portion 117, and the circuit layer 111.

According to a second embodiment of the present disclosure, the routing portion 400 may pass through the third encapsulation layer 119c, the first encapsulation layer 119a, and the discontinuity portion 115 disposed on the contact pattern portion 110 and may be electrically connected to the contact pattern portion 110. For example, the routing portion 400 according to the second embodiment of the present disclosure may be electrically connected to the contact pattern portion 110 through a routing contact hole CH passing through the discontinuity portion 115 disposed on the contact pattern portion 110. For example, the routing portion 400 according to the second embodiment of the present disclosure may be electrically connected to the contact pattern portion 110 through a routing contact hole CH sequentially passing through the third encapsulation layer 119c disposed on the contact pattern portion 110, the first encapsulation layer 119a, the isolated light emitting device layer 113, the discontinuity portion 115, and the circuit layer 111.

According to a third embodiment of the present disclosure, the routing portion 400 may be electrically connected to the contact pattern portion 110 through a routing contact hole CH passing through each of the dam portion 117 and the discontinuity portion 115 disposed on the contact pattern portion 110.

The routing contact hole CH may be implemented by an at least one-time hole patterning process of patterning layers disposed on the contact pattern portion 110 of the first substrate 100 to expose at least a portion of each of the contact patterns PCP, DCP, RCP, GCP, and CCP. The routing contact hole CH according to an embodiment of the present disclosure may include at least one first to fifth routing contact holes CH1 to CH5.

The at least one first routing contact hole CH1 may be implemented to pass through the first discontinuity structure 115a of the discontinuity portion 115. The at least one second routing contact hole CH2 may be implemented to pass through the second discontinuity structure 115b of the discontinuity portion 115. The at least one third routing contact hole CH3 may be implemented to pass through the third discontinuity structure 115c of the discontinuity portion 115. The at least one fourth routing contact hole CH4 may be implemented to pass through the fourth discontinuity structure 115d of the discontinuity portion 115. The at least one fifth routing contact hole CH5 may be implemented to pass through the dam portion 117.

The at least one first to fourth routing contact holes CH1 to CH4 may be implemented to pass through layers on the contact pattern portion 110 including the encapsulation layer 119 and each of the first to fourth discontinuity structures 115a to 115d of the discontinuity portion 115. Each of the at least one first to fourth routing contact holes CH1 to CH4 according to an embodiment of the present disclosure may be implemented to sequentially pass through an overcoat layer 121b disposed on the contact pattern portion 110, a second inorganic encapsulation layer 119c and a first inorganic encapsulation layer 119a of the encapsulation layer 119, an isolated common electrode CEa and an isolated light emitting layer ELa of the light emitting device layer 113, the discontinuity structures 115a to 115d, and the buffer layer 111a, in order to expose at least a portion of each of the contact patterns PCP, DCP, RCP, GCP, and CCP. For example, the at least one second routing contact hole CH2 may be implemented to sequentially pass through the overcoat layer 121b disposed on the contact pattern portion 110, the second inorganic encapsulation layer 119c and the first inorganic encapsulation layer 119a of the encapsulation layer 119, the isolated common electrode CEa and the isolated light emitting layer ELa of the light emitting device layer 113, the discontinuity structures 115a to 115d, and the buffer layer 111a, in order to expose at least a portion of the data contact pattern DCP.

The at least one fifth routing contact hole CH5 may be implemented to pass through layers on the contact pattern portion 110 including the dam portion 117 and the encapsulation layer 119. Each of the at least one fifth routing contact hole CH5 according to an embodiment of the present disclosure may be implemented to sequentially pass through the overcoat layer 121b disposed on the contact pattern portion 110, the second inorganic encapsulation layer 119c and the first inorganic encapsulation layer 119a of the encapsulation layer 119, the isolated common electrode CEa and the isolated light emitting layer ELa of the light emitting device layer 113, the dam portion 117, and the buffer layer 111a, in order to expose at least a portion of each of the contact patterns PCP, DCP, RCP, GCP, and CCP.

The routing portion 400 according to an embodiment of the present disclosure may include a plurality of routing lines 410. The plurality of routing lines 410 may be arranged at a certain interval in the first direction X and may be implemented to surround the outer surface OS1a and the contact pattern portion 110 of the first substrate 100 and the outer surface OS1b and the contact pattern portion 110 of the second substrate 200. For example, each of the plurality of routing lines 410 may be formed by a printing process using a conductive paste. For example, the conductive paste may include a silver (Ag) paste, but embodiments of the present disclosure are not limited thereto.

Each of the plurality of routing lines 410 may include a first portion (or a front portion) 410a disposed on the contact pattern portion 110 of the first substrate 100, a second portion (or a rear portion) 410b disposed on the first pad part 210 of the second substrate 200, and a third portion (or a side portion or a center portion) 410c disposed on the outer surface OS1a of the first substrate 100 and the outer surface OS1b of the second substrate 200 between the first portion 410a and the second portion 410b.

The first portion 410a, the second portion 410b, and the third portion 410c of each of the plurality of routing lines 410 may be simultaneously implemented by a printing process using a conductive paste.

The first portion 410a of each of the plurality of routing lines 410 may be directly connected to the contact patterns PCP, DCP, RCP, GCP, and CCP of the contact pattern portion 110 through a routing contact hole CH.

The first portion 410a according to an embodiment of the present disclosure may be directly connected to the contact patterns PCP, DCP, RCP, GCP, and CCP of the contact pattern portion 110 through the routing contact hole CH. For example, the first portion 410a may include at least five connection portions (or contact portions) filled into the at least one first to fifth routing contact holes CH1 to CH5 so as to be directly connected to one of the contact patterns PCP, DCP, RCP, GCP, and CCP.

The second portion 410b of each of the plurality of routing lines 410 may be disposed on the first pad part 210 disposed on a rear surface 200b of the second substrate 200 and may be directly connected to the pads 211 of the first pad part 210. The third portion 410c of each of the plurality of routing lines 410 may be disposed between the first portion 410a and the second portion 410b and may wound or surround the outer surface OS1a of the first substrate 100 and the outer surface OS1b of the second substrate 200.

The contact patterns PCP, DCP, RCP, GCP, and CCP of the contact pattern portion 110 may be electrically connected to the pad 211 of the first pad part 210 through the first portion 410a, the third portion 410c, and the second portion 410b of each of the plurality of routing lines 410.

According to an embodiment, the plurality of routing lines 410 may be classified (or divided) into a plurality of pixel driving power routing lines 411, a plurality of data routing lines 413, a plurality of reference voltage routing lines 415, a plurality of gate routing lines 417, and a plurality of pixel common voltage routing lines 419.

Each of the pixel driving power routing lines 411 may be electrically and directly connected to the pixel driving power contact patterns PCP of the contact pattern portion 110 through a routing contact hole CH sequentially passing through the encapsulation layer 119, the discontinuity portion 115, and the circuit layer 111 and may be electrically and respectively connected to the first power contact pads of the first pad part 210. Therefore, a pixel driving power output from a driving circuit unit may be supplied to each of the pixel driving power lines PL through the second pixel driving power pads, the pixel driving power link lines, the first pixel driving power pads, the pixel driving power routing lines 411, and the pixel driving power contact patterns PCL.

Each of the data routing lines 413 may be electrically and directly connected to the data contact patterns PCP of the contact pattern portion 110 through a routing contact hole CH sequentially passing through the encapsulation layer 119, the discontinuity portion 115, and the circuit layer 111 and may be electrically and respectively connected to the first data pads of the first pad part 210. Therefore, a data signal output from the driving circuit unit may be supplied to each of the data lines DL through the second data pads, the data link lines, the first data pads, the data routing lines 413, and the data contact patterns DCP.

Each of the reference voltage routing lines 415 may be electrically and directly connected to the reference voltage contact patterns RCP of the contact pattern portion 110 through a routing contact hole CH sequentially passing through the encapsulation layer 119, the discontinuity portion 115, and the circuit layer 111 and may be electrically and respectively connected to the first reference voltage pads of the first pad part 210. Therefore, a reference voltage output from the driving circuit unit may be supplied to each of the reference voltage lines RL through the second reference voltage pads, the reference voltage link lines, the first reference voltage pads, the reference voltage routing lines 415, and the reference voltage contact patterns RCP.

Each of the gate routing lines 417 may be electrically and directly connected to the gate contact patterns GCP of the contact pattern portion 110 through a routing contact hole CH sequentially passing through the encapsulation layer 119, the discontinuity portion 115, and the circuit layer 111 and may be electrically and respectively connected to the first gate pads of the first pad part 210. Therefore, a gate control signal output from the driving circuit unit may be supplied to each of the gate control lines GCL through the second gate pads, the gate link lines, the first gate pads, the gate routing lines 417, and the gate contact patterns GCP.

Each of the pixel common voltage routing lines 419 may be electrically and directly connected to the pixel common voltage contact patterns CCP of the contact pattern portion 110 through a routing contact hole CH sequentially passing through the encapsulation layer 119, the discontinuity portion 115, and the circuit layer 111 and may be electrically and respectively connected to the first pixel common voltage pads of the first pad part 210. Therefore, a pixel common voltage output from the driving circuit unit may be supplied to each of the pixel common voltage lines CVL through the second pixel common voltage pads, the pixel common voltage link lines, the first pixel common voltage pads, the pixel common voltage routing lines 419, and the pixel common voltage contact patterns CCP.

In FIGS. 10 to 12, it is described that the routing line 410 of the routing portion 400 is electrically and directly connected to the contact patterns PCP, DCP, RCP, GCP, and CCP through all of the at least one first to fourth routing contact holes CH1 to CH4 respectively formed in the first to fourth discontinuity structures 115a to 115d of the discontinuity portion 115 and the at least one fifth routing contact hole CH5 formed in the dam portion 117, but embodiments of the present disclosure are not limited thereto. For example, the routing line 410 of the routing portion 400 may be electrically and directly connected to the contact patterns PCP, DCP, RCP, GCP, and CCP through at least one of the first to fifth routing contact holes CH1 to CH5.

The second substrate 200 disposed on the rear surface of the first substrate 100 described above with reference to FIGS. 10 to 12 may be omitted. In this case, as illustrated in FIG. 7, each of the first pad part 210, the second pad part 230, and the link line portion 250 disposed on the second substrate 200 may be disposed on the rear surface 100b of the substrate 100, and except for that the routing line 410 of the routing portion 400 is formed to surround one side periphery portion of a front surface of the substrate 100 and one side periphery portion of the rear surface of the substrate 100 and the contact patterns PCP, DCP, RCP, GCP, and CCP of the contact pattern portion 110 are electrically and respectively connected to the pads 211 of the first pad part 210, the routing line 410 of the routing portion 400 may be substantially the same as that of FIG. 7, and thus, its repeated description is omitted.

The light emitting display apparatus (or a routing portion) according to the present disclosure may further include an edge coating layer 450.

The edge coating layer 450 may be implemented to cover the plurality of routing lines 410. The edge coating layer 450 according to an embodiment of the present disclosure may be implemented to cover all of the first periphery portion and the first outer surface OS1a of the first substrate 100 and the first periphery portion and the first outer surface OS1b of the second substrate 200 as well as the plurality of routing lines 410. The edge coating layer 450 may prevent the corrosion of each of the plurality of routing lines 410 including a metal material or electrical short circuit between the plurality of routing lines 410. Also, the edge coating layer 450 may prevent or minimize the reflection of external light caused by the plurality of routing lines 410 and the pads of the first pad portion 210. The edge coating layer 450 according to an embodiment of the present disclosure may include a light blocking material including black ink.

A top surface of the edge coating layer 450 disposed on the first surface 100a of the first substrate 100 may be covered by the side sealing member 125.

An outer surface of the edge coating layer 450 may be an outermost outer surface of the first substrate 100, and thus, each of the outermost outer surface of the first substrate 100, an outer surface of the side sealing member 125, and an outer surface of the functional film 123 may be disposed on the same vertical extension line VL.

As described above, the light emitting display apparatus according to an embodiment of the present disclosure may include the routing portion 400 directly connected to a contact pattern disposed at a periphery portion of the first substrate (or the substrate) 100, and thus, may not need the pad part disposed at the outermost periphery portion of the first substrate 100 and may have the air bezel structure where a bezel area is not provided.

Moreover, the light emitting display apparatus according to an embodiment of the present disclosure may disconnect (or isolate), at least once, the light emitting layer EL disposed at the periphery portion of the first substrate (or the substrate) 100 by the discontinuity portion 115, and thus, may prevent or minimize a degradation in the light emitting layer EL and/or a reduction in reliability thereof caused by the side transmission of water or moisture.

Figure 13:
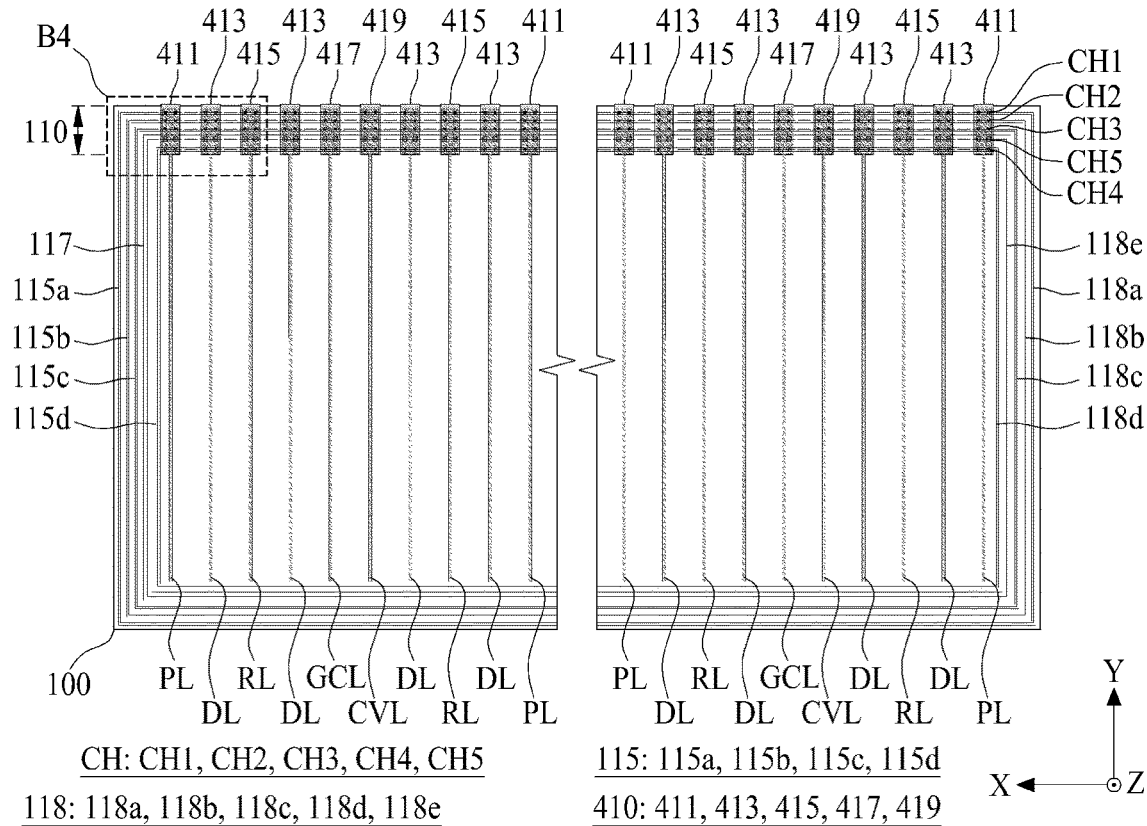
FIG. 13 is a diagram illustrating a connection structure of a pixel driving line and a routing portion according to another embodiment of the present disclosure.
Figure 14:
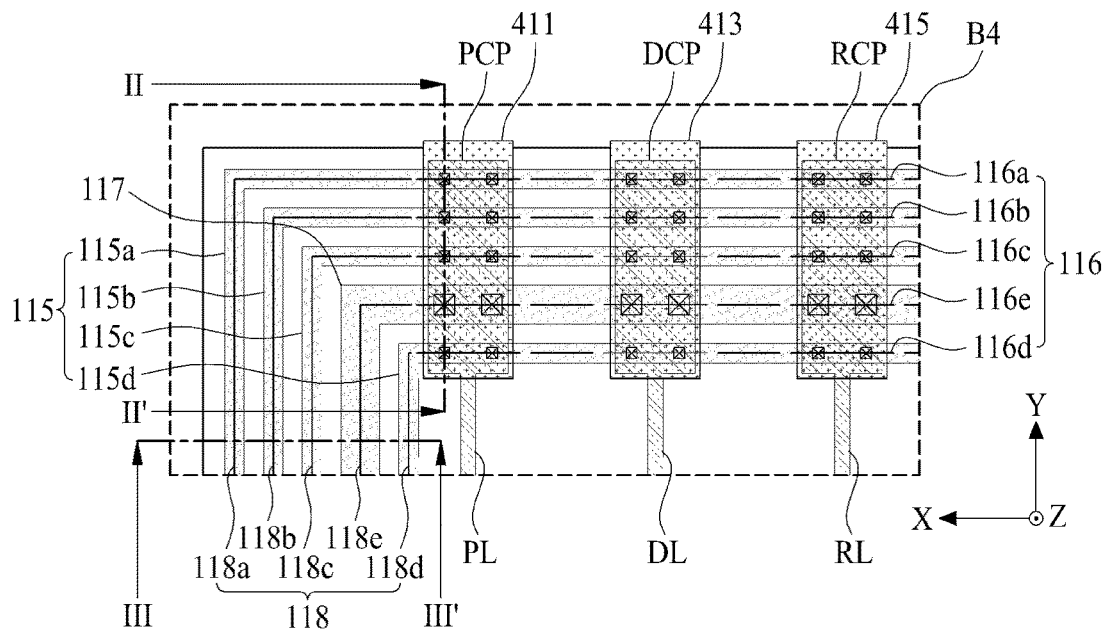
FIG. 14 is an enlarged view of a region B4 illustrated in FIG. 13.
Figure 15:
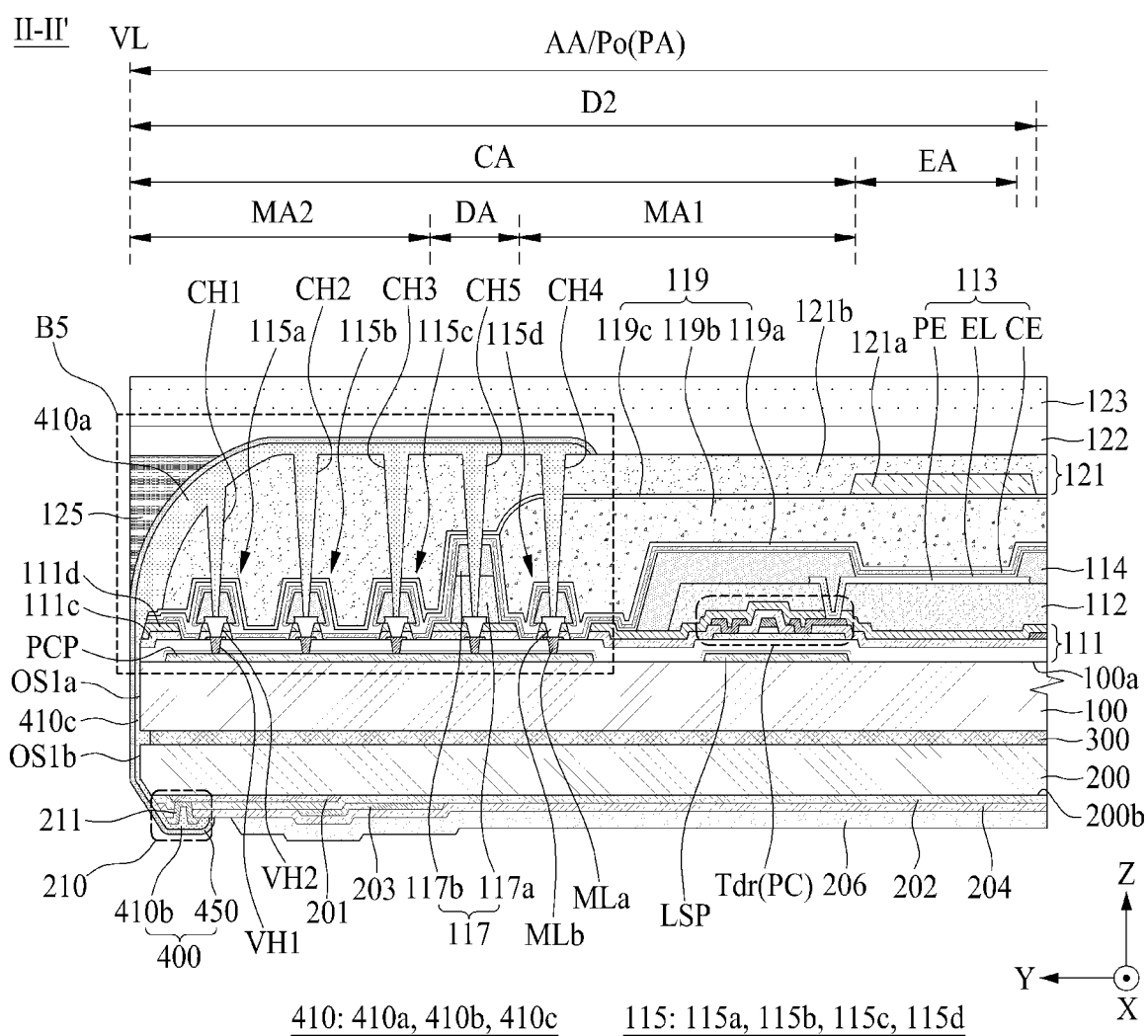
FIG. 15 is a cross-sectional view taken along line II-II' illustrated in FIG. 14.
Figure 16A:
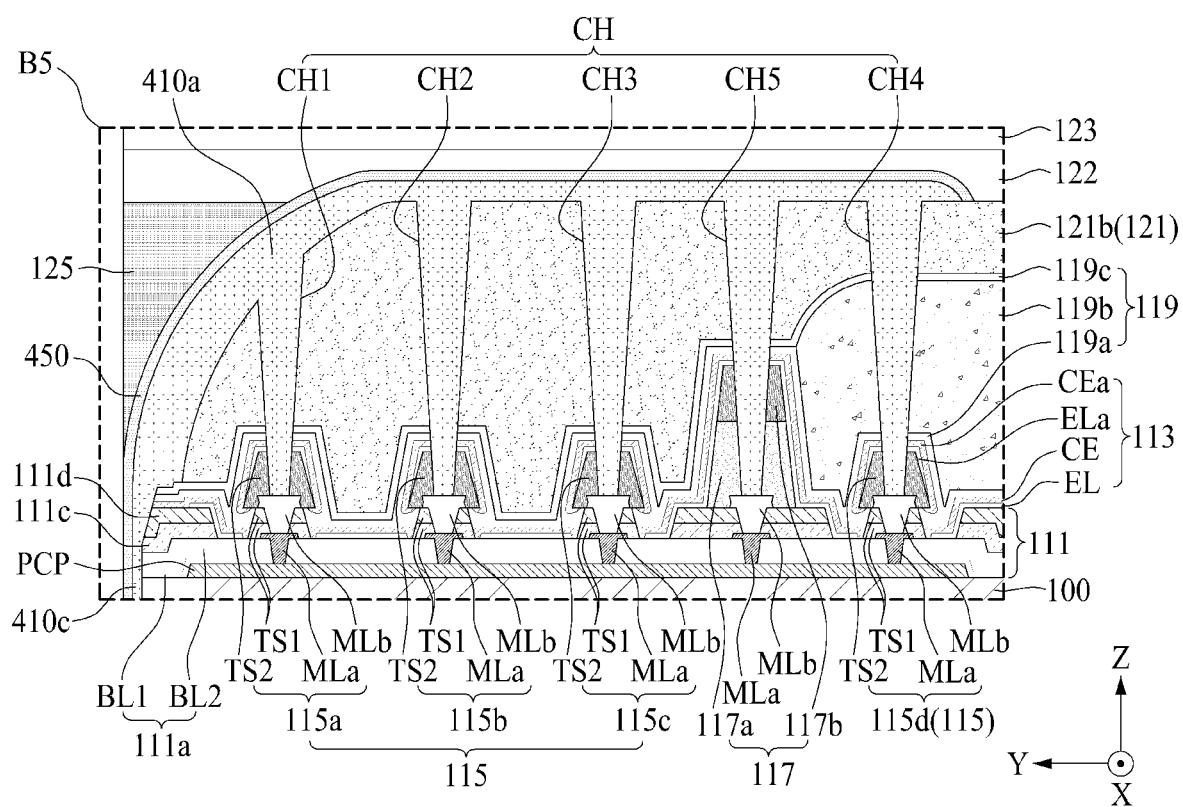
FIG. 16A is an enlarged view of a region B5 illustrated in FIG. 15.
Figure 16B:
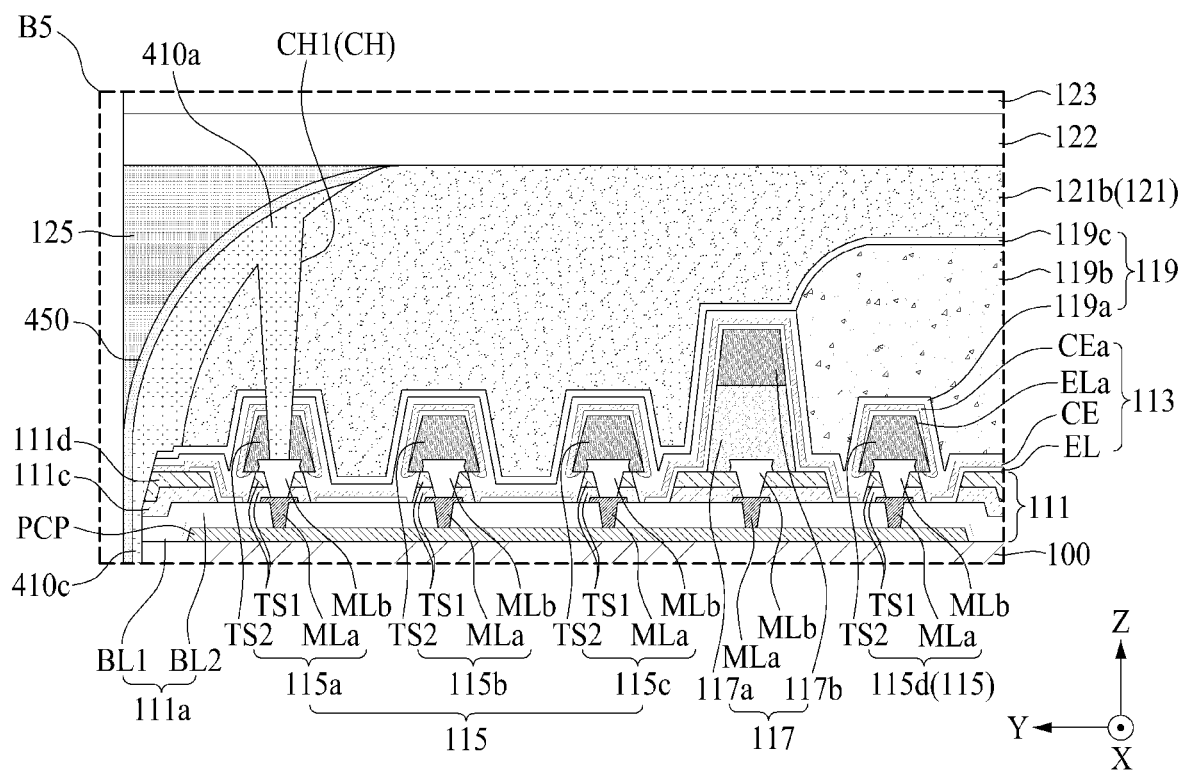
FIG. 16B is an enlarged view of a region B5 illustrated in FIG. 15 according to another embodiment.
Figure 16C:
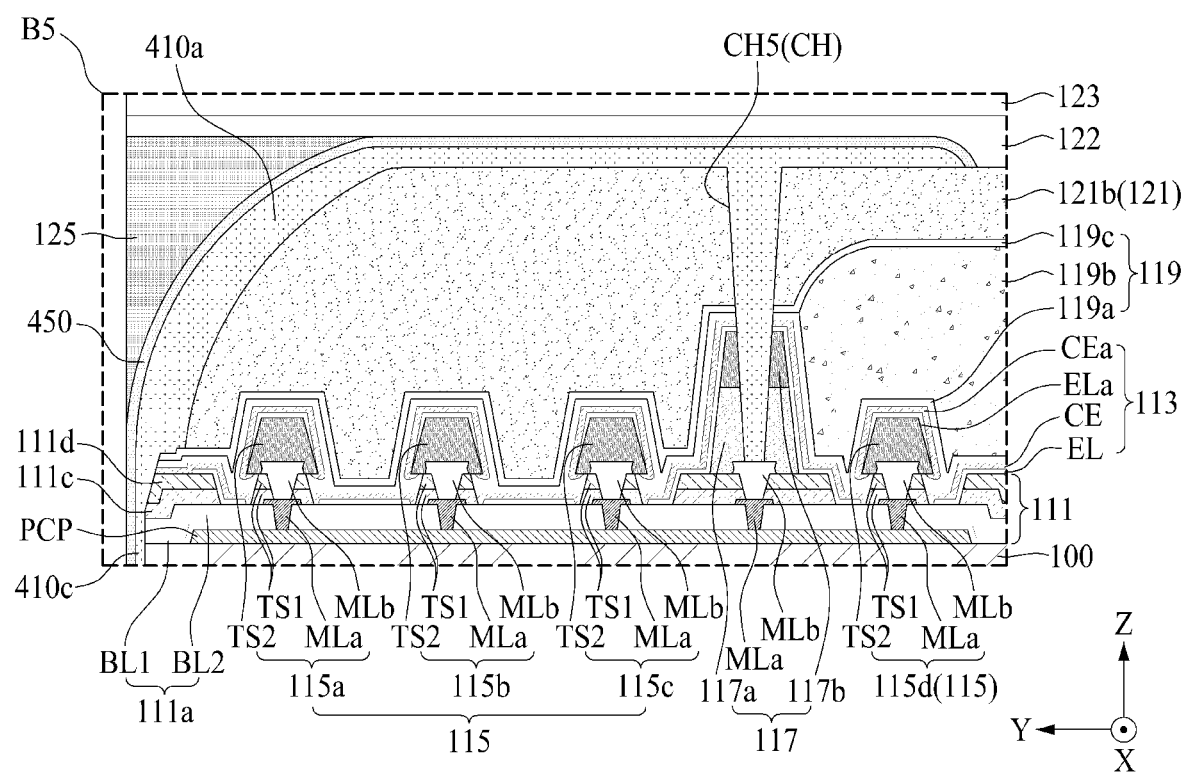
FIG. 16C is an enlarged view of a region B5 illustrated in FIG. 15 according to another embodiment.
Figure 17:
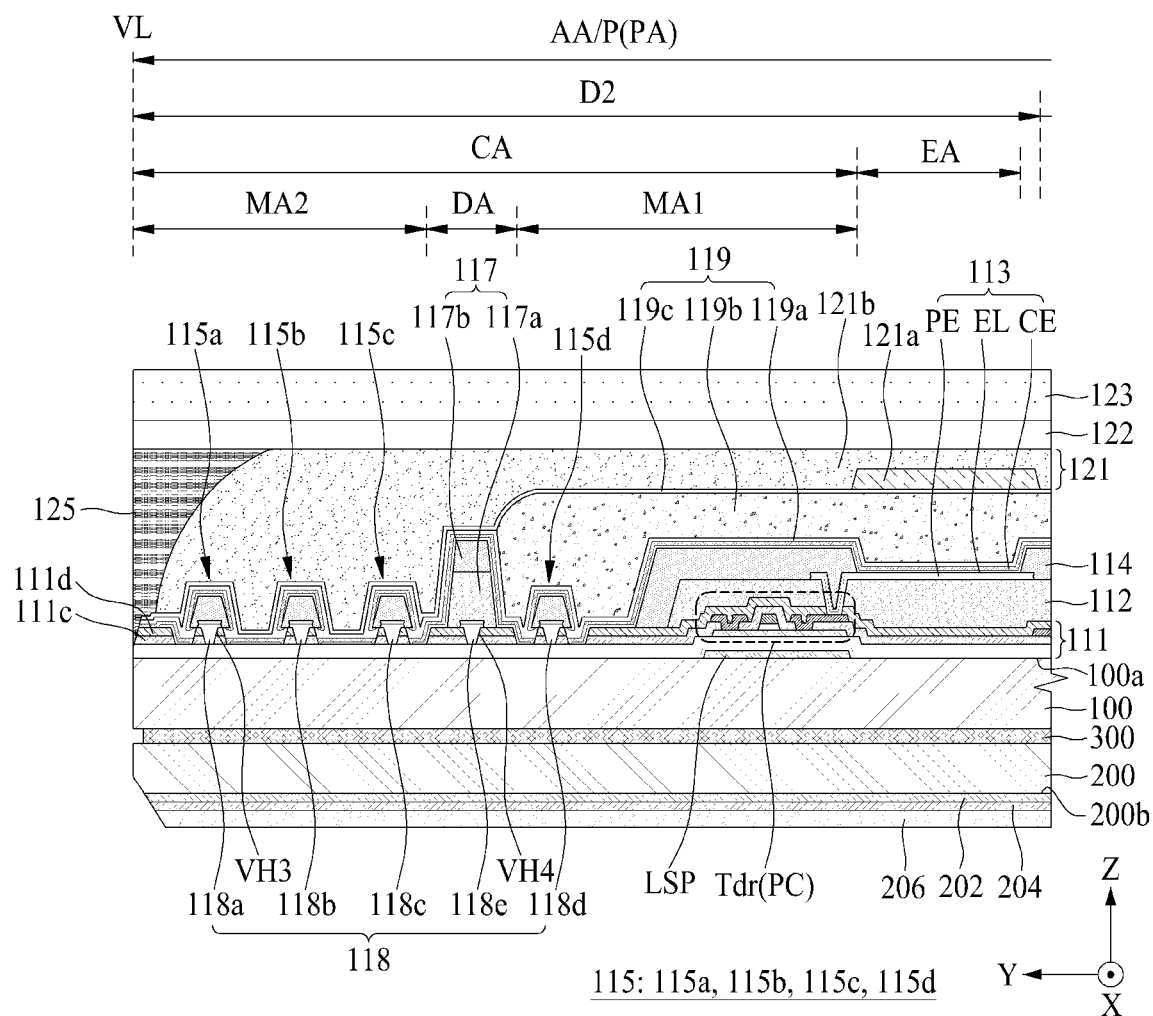
FIG. 17 is a cross-sectional view taken along line III-III' illustrated in FIG. 14.

FIG. 13 is a diagram for describing a connection structure between a pixel driving line and a routing portion according to another embodiment of the present disclosure, FIG. 14 is an enlarged view of a region B4 illustrated in FIG. 13, FIG. 15 is a cross-sectional view taken along line II-IF illustrated in FIG. 14, FIG. 16A is an enlarged view of a region B5 illustrated in FIG. 15, FIG. 16B is an enlarged view of a region B5 illustrated in FIG. 15 according to another embodiment, FIG. 16C is an enlarged view of a region B5 illustrated in FIG. 15 according to another embodiment, and FIG. 17 is a cross-sectional view taken along line illustrated in FIG. 14. Region B5 includes a periphery portion of the substrate which is also adjacent to the outer surfaces (or outermost surfaces) of the substrate. FIG. 15 illustrates that the periphery portion is adjacent to the first outer surface OS1a of the first substrate 100. FIGS. 9 to 12 illustrate an embodiment where an auxiliary line portion is added to the light emitting display apparatus illustrated in FIGS. 9 to 12. In describing FIGS. 13 to 16, only an auxiliary line portion and elements relevant thereto will be described below, the other elements are referred to by like reference numerals, and their repetitive descriptions are omitted.

Referring to FIGS. 13 to 16, a light emitting display apparatus according to another embodiment of the present disclosure may further include an auxiliary pattern portion 116 disposed between a routing portion 400 and a contact pattern portion 110 connected to a plurality of pixel driving lines PL, DL, RL, GCL, and CVL.

The auxiliary pattern portion 116 may be referred to as a middle metal portion or a signal transfer portion. In some embodiments, the auxiliary pattern portion 116 may refer to an auxiliary conductive structure. The auxiliary conductive structure may comprise a first auxiliary conductive structure on the contact pattern portion 110, the first auxiliary conductive structure overlapping a location of either the discontinuity portion 115 or the dam portion, wherein at least one of the plurality of routing lines 410 may extend through the encapsulation layer to couple to the first auxiliary conductive structure. The auxiliary conductive structure may further comprise a second auxiliary conductive structure on the contact pattern portion 110, the second auxiliary conductive structure being on the first auxiliary conductive structure and overlapping a location of either the discontinuity portion 115 or the dam portion, wherein at least one of the plurality of routing lines 410 may extend through the encapsulation layer to couple to the first and second auxiliary conductive structures. The auxiliary pattern portion 116 according to an embodiment of the present disclosure may include first to fifth middle patterns 116a to 116e electrically connected between contact patterns PCP, DCP, RCP, GCP, and CCP of a contact pattern portion 110 and routing lines 410 of a routing portion 400. For example, each of the first to fifth middle patterns 116a to 116e may be referred to as an auxiliary pattern, a conductive auxiliary pattern, or a conductive middle pattern, but embodiments of the present disclosure are not limited thereto.

Each of the first to fourth middle patterns 116a to 116d may be disposed at a discontinuity portion 115. For example, the first middle pattern 116a may be disposed in a first discontinuity structure 115a of the discontinuity portion 115. The second middle pattern 116b may be disposed in a second discontinuity structure 115b of the discontinuity portion 115. The third middle pattern 116c may be disposed in a third discontinuity structure 115c of the discontinuity portion 115. The fourth middle pattern 116d may be disposed in a fourth discontinuity structure 115d of the discontinuity portion 115.

The fifth middle pattern 116e may be disposed in a dam area DA. For example, the fifth middle pattern 116e may be disposed under a dam portion 117. For example, the fifth middle pattern 116e may be disposed between the dam portion 117 and a circuit layer 111.

Each of the first to fifth middle patterns 116a to 116e may act as a middle center layer or a signal transfer layer disposed between the contact patterns PCP, DCP, RCP, GCP, and CCP and the routing lines 410. Each of the first to fifth middle patterns 116a to 116e may prevent an electrical or physical contact defect between the contact patterns PCP, DCP, RCP, GCP, and CCP and the routing line 410 caused by a distance between the contact patterns PCP, DCP, RCP, GCP, and CCP and the routing line 410. Also, each of the first to fifth middle patterns 116a to 116e may be disposed between a first strip structure TS1 and a second strip structure TS2 of each of the first to fourth discontinuity structures 115a to 115d of the discontinuity portion 115, thereby enhancing an adhesive force between the first strip structure TS1 and the second strip structure TS2.

The first to fourth middle patterns 116a to 116d may be respectively disposed in the first to fourth discontinuity structures 115a to 115d of the discontinuity portion 115 overlapping each of the contact patterns PCP, DCP, RCP, GCP, and CCP and may be electrically connected between the contact patterns PCP, DCP, RCP, GCP, and CCP and the routing lines 410 of the routing portion 400. For example, the first to fourth middle patterns 116a to 116d may be respectively disposed in the first to fourth discontinuity structures 115a to 115d overlapping a data contact pattern DCP and may be electrically connected between the data contact pattern DCP and a data routing line 413. For example, each of the first to fourth middle patterns 116a to 116d may be connected to the data contact pattern DCP in common and may be connected to a first portion 410a of the data routing line 413.

The fifth middle pattern 116e may be disposed in a dam portion 117 overlapping each of the contact patterns PCP, DCP, RCP, GCP, and CCP and may be electrically connected between the contact patterns PCP, DCP, RCP, GCP, and CCP and the routing lines 410 of the routing portion 400. For example, the fifth middle pattern 116e may be disposed in the dam portion 117 overlapping the data contact pattern DCP and may be electrically connected between the data contact pattern DCP and the data routing line 413.

In FIGS. 13 to 16, it is described that the auxiliary pattern portion 116 includes the first to fifth middle patterns 116a to 116e, but embodiments of the present disclosure are not limited thereto. For example, the auxiliary pattern portion 116 may include at least one of the first to fifth middle patterns 116a to 116e. For example, the auxiliary pattern portion 116 may include only one middle pattern 116e which is disposed in the dam portion 117 overlapping each of the contact patterns PCP, DCP, RCP, GCP, and CCP and is electrically connected between the contact patterns PCP, DCP, RCP, GCP, and CCP and the routing lines 410 of the routing portion 400. For example, the auxiliary pattern portion 116 may include at least one or more among the first to fourth middle patterns 116a to 116d which are disposed in the discontinuity portion 115 overlapping each of the contact patterns PCP, DCP, RCP, GCP, and CCP and are electrically connected between the contact patterns PCP, DCP, RCP, GCP, and CCP and the routing lines 410 of the routing portion 400.

Each of the first to fifth middle patterns 116a to 116e according to an embodiment of the present disclosure may include a first metal layer MLa and a second metal layer MLb.

The first metal layer MLa may be disposed in the circuit layer 111 overlapping the contact patterns PCP, DCP, RCP, GCP, and CCP. For example, the first metal layer MLa may be disposed between the contact patterns PCP, DCP, RCP, GCP, and CCP and each of the discontinuity portion 115 and the dam portion 117. For example, the first metal layer MLa may be disposed between the contact patterns PCP, DCP, RCP, GCP, and CCP and an interlayer insulation layer 111c.

The first metal layer MLa according to an embodiment of the present disclosure may be implemented on a buffer layer 111a so as to be electrically connected to the contact patterns PCP, DCP, RCP, GCP, and CCP. For example, the first metal layer MLa may be disposed on the buffer layer 111a overlapping the contact patterns PCP, DCP, RCP, GCP, and CCP and may be electrically connected to the contact patterns PCP, DCP, RCP, GCP, and CCP through a first via hole (or a lower via hole) VH1 passing through the buffer layer 111a. For example, the first metal layer MLa may be covered by at least one insulation layer disposed on the buffer layer 111a. For example, the first metal layer MLa may be covered by the interlayer insulation layer 111c.

The first metal layer MLa of the first to fourth middle patterns 116a to 116d according to an embodiment of the present disclosure may be electrically connected to the contact patterns PCP, DCP, RCP, GCP, and CCP through the first via hole VH1 passing through the buffer layer 111a disposed under the discontinuity portion 115.

The first metal layer MLa of the fifth middle pattern 116e according to an embodiment of the present disclosure may be electrically connected to the contact patterns PCP, DCP, RCP, GCP, and CCP through the first via hole VH1 passing through the buffer layer 111a disposed under the dam portion 117.

The first metal layer MLa according to an embodiment of the present disclosure may be implemented in a dot shape overlapping the contact patterns PCP, DCP, RCP, GCP, and CCP, or may be implemented in a line shape overlapping with the contact patterns PCP, DCP, RCP, GCP, and CCP in a first direction X. For example, the first metal layer MLa of the fifth middle pattern 116e may be disposed in the dam portion 117, and thus, may have a size which is relatively greater than that of the first metal layer MLa of the first to fourth middle patterns 116a to 116d, but embodiments of the present disclosure are not limited thereto.

The first metal layer MLa according to an embodiment of the present disclosure may be implemented along with a gate electrode of each of thin film transistors (TFTs) Tdr disposed in a pixel area PA, or may be implemented along with a source/drain electrode of each TFT. For example, the first metal layer MLa may be implemented to have the same material and structure as those of the gate electrode of each TFT Tdr, or may be implemented to have the same material and structure as those of the source/drain electrode of each TFT Tdr.

The second metal layer MLb may be implemented to be electrically connected between the first metal layer MLa and the routing lines 410. For example, the second metal layer MLb may be disposed on a passivation layer 111d overlapping the first metal layer MLa and may be electrically connected to the first metal layer MLa through a second via hole (or an upper via hole) VH2 sequentially passing through the passivation layer 111d and the interlayer insulation layer 111c.

The second metal layer MLb of the first to fourth middle patterns 116a to 116d according to an embodiment of the present disclosure may be disposed on a first strip structure TS1 of each of the first to fourth discontinuity structures 115a to 115d of the discontinuity portion 115 overlapping the first metal layer MLa and may be electrically connected between the first metal layer MLa and the routing lines 410. For example, the second metal layer MLb of the first to fourth middle patterns 116a to 116d may be disposed between the first strip structure TS1 and a second strip structure TS2 of each of the first to fourth discontinuity structures 115a to 115d of the discontinuity portion 115 and may be electrically connected to the first metal layer MLa through the second via hole (or the upper via hole) VH2 sequentially passing through the passivation layer 111d and the interlayer insulation layer 111c. For example, the second metal layer MLb of the first to fourth middle patterns 116a to 116d may be disposed between the first strip structure TS1 and the second strip structure TS2, thereby enhancing an adhesive force between the first strip structure TS1 and the second strip structure TS2.

The second metal layer MLb of the fifth middle pattern 116e according to an embodiment of the present disclosure may be disposed between a first dam 117a of the dam portion 117 and the first metal layer MLa and may be electrically connected between the first metal layer MLa and the routing lines 410. For example, the second metal layer MLb of the fifth middle pattern 116e may be disposed between the first dam 117a of the dam portion 117 and the passivation layer 111d and may be electrically connected to the first metal layer MLa through the second via hole (or the upper via hole) VH2 sequentially passing through the passivation layer 111d and the interlayer insulation layer 111c under the first dam 117a. For example, the second metal layer MLb of the fifth middle pattern 116e may be disposed between the first dam 117a and the passivation layer 111d, thereby enhancing an adhesive force between the first dam 117a and the passivation layer 111d.

The second metal layer MLb according to an embodiment of the present disclosure may be implemented in the same dot shape or line shape as that of the first metal layer MLa. For example, the second metal layer MLb of the fifth middle pattern 116e may be disposed in the dam portion 117, and thus, may have a size which is relatively greater than that of the second metal layer MLb of the first to fourth middle patterns 116a to 116d, but embodiments of the present disclosure are not limited thereto.

The second metal layer MLb according to an embodiment of the present disclosure may be implemented along with a pixel electrode PE disposed in a pixel area PA. For example, the second metal layer MLb may be implemented to have the same material and structure as those of the pixel electrode PE.

Referring to FIGS. 13, 14, and 17, the light emitting display apparatus according to another embodiment of the present disclosure may further include an auxiliary line portion 118 which is disposed in each of the discontinuity portion 115 and the dam portion 117 disposed at a periphery portion other than one side periphery portion of the first substrate 100.

The auxiliary line portion 118 may be referred to as a conductive line portion. The auxiliary line portion 118 according to an embodiment of the present disclosure may include first to fifth auxiliary lines 118a to 118e disposed in the dam portion 117. For example, each of the first to fifth auxiliary lines 118a to 118e may be referred to as a conductive line, an electrical floating line, a conductive auxiliary line, or an electrical floating auxiliary line, but embodiments of the present disclosure are not limited thereto. The plurality of auxiliary lines adjacent to the plurality of routing lines 410 may include a first conductive structure overlapping the discontinuity portion 115, wherein the first conductive structure may be electrically coupled to the plurality of routing lines 410. The plurality of auxiliary lines may further include a second conductive structure on the first conductive structure, the second conductive structure overlapping the discontinuity portion 115, wherein the second conductive structure may be electrically coupled to the plurality of routing lines 410.

Each of the first to fifth auxiliary lines 118a to 118e may be implemented to have the same material and structure as those of the pixel electrode PE disposed in the pixel area PA. For example, each of the first to fifth auxiliary lines 118a to 118e may be formed along with a second metal layer MLb of the auxiliary pattern portion 116.

Each of the first to fifth auxiliary lines 118a to 118e may be disposed in each of the first to fourth discontinuity structures 115a to 115d of the discontinuity portion 115 to have a line shape. For example, the first auxiliary line 118a may be disposed in the first discontinuity structure 115a of the discontinuity portion 115. The second auxiliary line 118b may be disposed in the second discontinuity structure 115b of the discontinuity portion 115. The third auxiliary line 118c may be disposed in the third discontinuity structure 115c of the discontinuity portion 115. The fourth auxiliary line 118c may be disposed in the fourth discontinuity structure 115d of the discontinuity portion 115.

Each of the first to fourth auxiliary lines 118a to 118d according to an embodiment of the present disclosure may be disposed on a passivation layer 111d overlapping each of the first to fourth discontinuity structures 115a to 115d of the discontinuity portion 115. For example, each of the first to fourth auxiliary lines 118a to 118d may be disposed between a first strip structure TS1 and a second strip structure TS2 of each of the first to fourth discontinuity structures 115a to 115d of the discontinuity portion 115, thereby enhancing an adhesive force between the first strip structure TS1 and the second strip structure TS2.

The first strip structure TS1 of each of the first to fourth discontinuity structures 115a to 115d of the discontinuity portion 115 may include a third via hole VH3 overlapping each of the first to fourth auxiliary lines 118a to 118d. For example, the third via hole VH3 may sequentially pass through the passivation layer 111d and the interlayer insulation layer 111c implementing the first strip structure TS1. For example, the third via hole VH3 may be formed along with a first via hole VH1 of the auxiliary pattern portion 116. Accordingly, each of the first to fourth auxiliary lines 118a to 118d may be disposed on the passivation layer 111d of the first strip structure TS1 and may be inserted into the third via hole VH3.

The fifth auxiliary line 118e may be disposed in the dam area DA to have a line shape. For example, the fifth auxiliary line 118e may be disposed under the dam portion 117. For example, the fifth auxiliary line 118e may be disposed between the dam portion 117 and the circuit layer 111.

The fifth auxiliary line 118e according to an embodiment of the present disclosure may be disposed on the passivation layer 111d overlapping the dam portion 117. For example, the fifth auxiliary line 118e may be disposed between the passivation layer 111d and a first dam 117a of the dam portion 117, thereby enhancing an adhesive force between the passivation layer 111d and the first dam 117a.

The dam area DA or the dam portion 117 may include a fourth via hole VH4 overlapping the fifth auxiliary line 118e. For example, the fourth via hole VH4 may sequentially pass through the passivation layer 111d and the interlayer insulation layer 111c disposed under the first dam 117a of the dam portion 117. For example, the fourth via hole VH4 may be formed along with a second via hole VH2 of the auxiliary pattern portion 116. Accordingly, the fifth auxiliary line 118e may be disposed on the passivation layer 111d under the dam portion 117 and may be inserted into the fourth via hole VH4.

As described above, like the light emitting display apparatus according to an embodiment of the present disclosure, the light emitting display apparatus according to another embodiment of the present disclosure may have the air bezel structure where a bezel area is not provided and may prevent or minimize a degradation in the light emitting layer EL and/or a reduction in reliability thereof caused by the side transmission of water or moisture. Also, the light emitting display apparatus according to another embodiment of the present disclosure may further include the auxiliary pattern portion 116 disposed between the contact patterns PCP, DCP, RCP, GCP, and CCP and the routing line 410, thereby preventing an electrical or physical contact defect between the contact patterns PCP, DCP, RCP, GCP, and CCP and the routing line 410. Also, the light emitting display apparatus according to another embodiment of the present disclosure may further include the auxiliary pattern portion 116 which is disposed between the first strip structure TS1 and the second strip structure TS2 of each of the first to fourth discontinuity structures 115a to 115d of the discontinuity portion 115 and is disposed between the dam portion 117 and the circuit layer 111, and thus, may enhance an adhesive force between the first strip structure TS1 and the second strip structure TS2 and an adhesive force between the dam portion 117 and the circuit layer 111.

Referring to FIGS. 16B and 16C, these figures are variations of an embodiment shown in FIG. 16A. In FIG. 16A, the routing lines extend into the contact holes CH (e.g., CH1, CH2, CH3, CH4, and CH5). However, in some embodiments, the routing lines may extend into only one of the contact holes CH. For example, FIG. 16B is an embodiment showing the routing line extending into the first contact hole CH1. FIG. 16C, on the other hand, is an embodiment showing the routing line extending into the fifth contact hole CH5. Based on the design of the circuit and the specific need for certain circuit arrangements, various combinations of routing lines extending through the contact holes may be contemplated. For example, in some circuit arrangements, the routing lines may extend through 2 contact holes (e.g., CH2 and CH4). In other circuit arrangements, the routing lines may extend through 3 contact holes (e.g., CH1, CH3, and CH4). For instance, arranging the routing lines to extend through all contact holes CH1 to CH5 may have some technical benefits of ensuring the operation of the display device. For example, in case some of the signal lines are disconnected for various reasons (e.g., manufacturing error, consumer error, etc.), the display device may still maintain stable operation without experiencing any electrical disconnection of signals. Further benefits include reducing the resistivity of contacts within the display.

There are also benefits of contacting through the dam portion 117 as shown in FIG. 16C. That is, the dam portion 117 is relatively larger and higher than the discontinuity portion 115 located adjacent to the dam portion 117. Accordingly, extending the routing line to electrically connect to the contact pattern portion through the dam portion 117 is relatively easier than establishing electrical connection through the discontinuity portion 115. Based on weighing the technical benefits, various connections of the routing lines may be considered. As shown in, FIG. 16B, by extending a routing line through a contact hole that is farthest away from the active area, such as the first contact hole CH1, may have the technical benefit from a resistance standpoint as well as the benefit of reducing the amount of material used for the routing line. Referring to FIG. 14, FIG. 14 shows that some of the signal lines are electrically disconnected as shown inside region 'B4.' Depending on the required specific circuit arrangement for connecting certain lines (e.g., high potential voltage EVDD line, reference voltage line, data line, low potential voltage EVSS, or the like), some signal lines may be disconnected and the electrical connection of other signal lines can be established through using contact holes as needed.

A person of ordinary skill in the art would readily appreciate the anticipated technical benefits based on the connections, the arrangements, and the number of routing lines extending through the hole.

Figure 18:
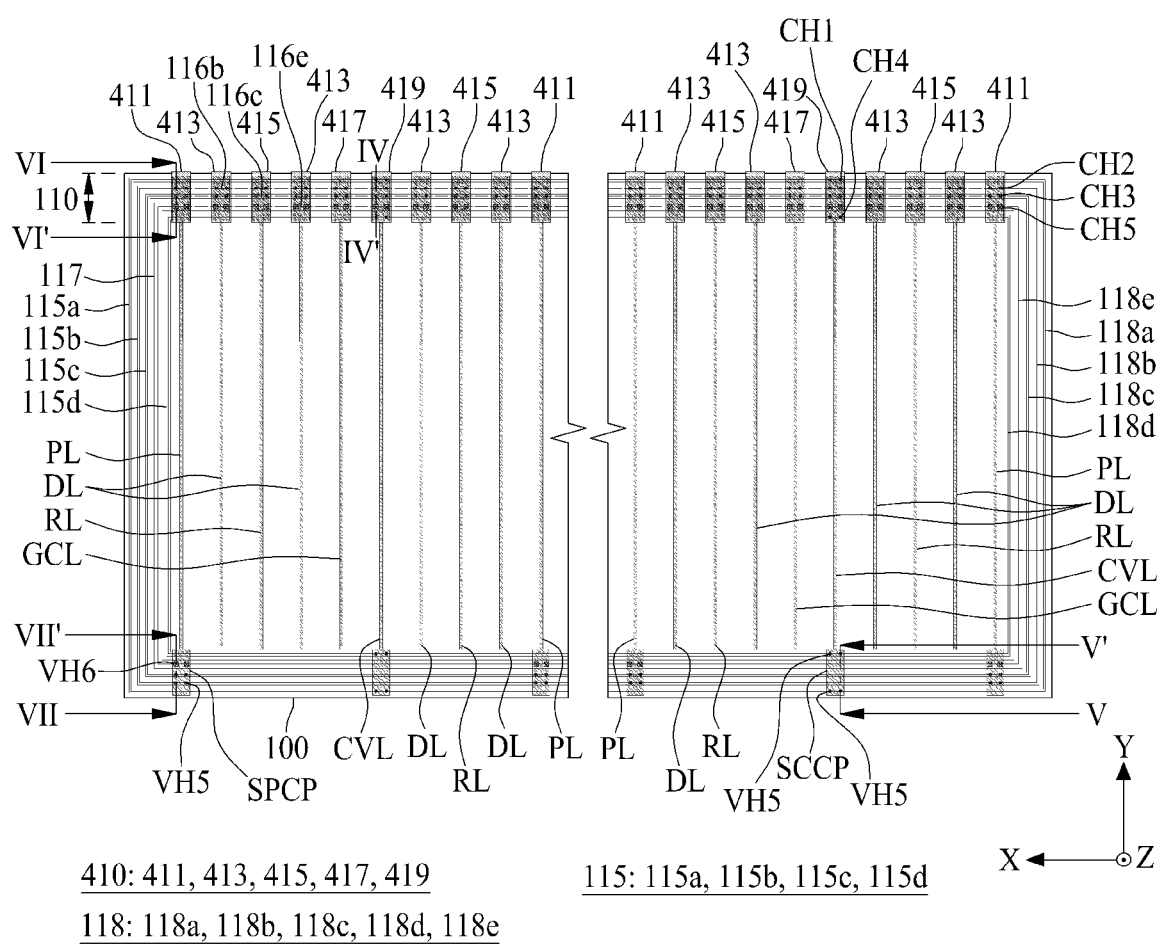
FIG. 18 is a diagram illustrating a connection structure of a pixel driving line, a routing portion, and an auxiliary line portion according to another embodiment of the present disclosure.
Figure 19:
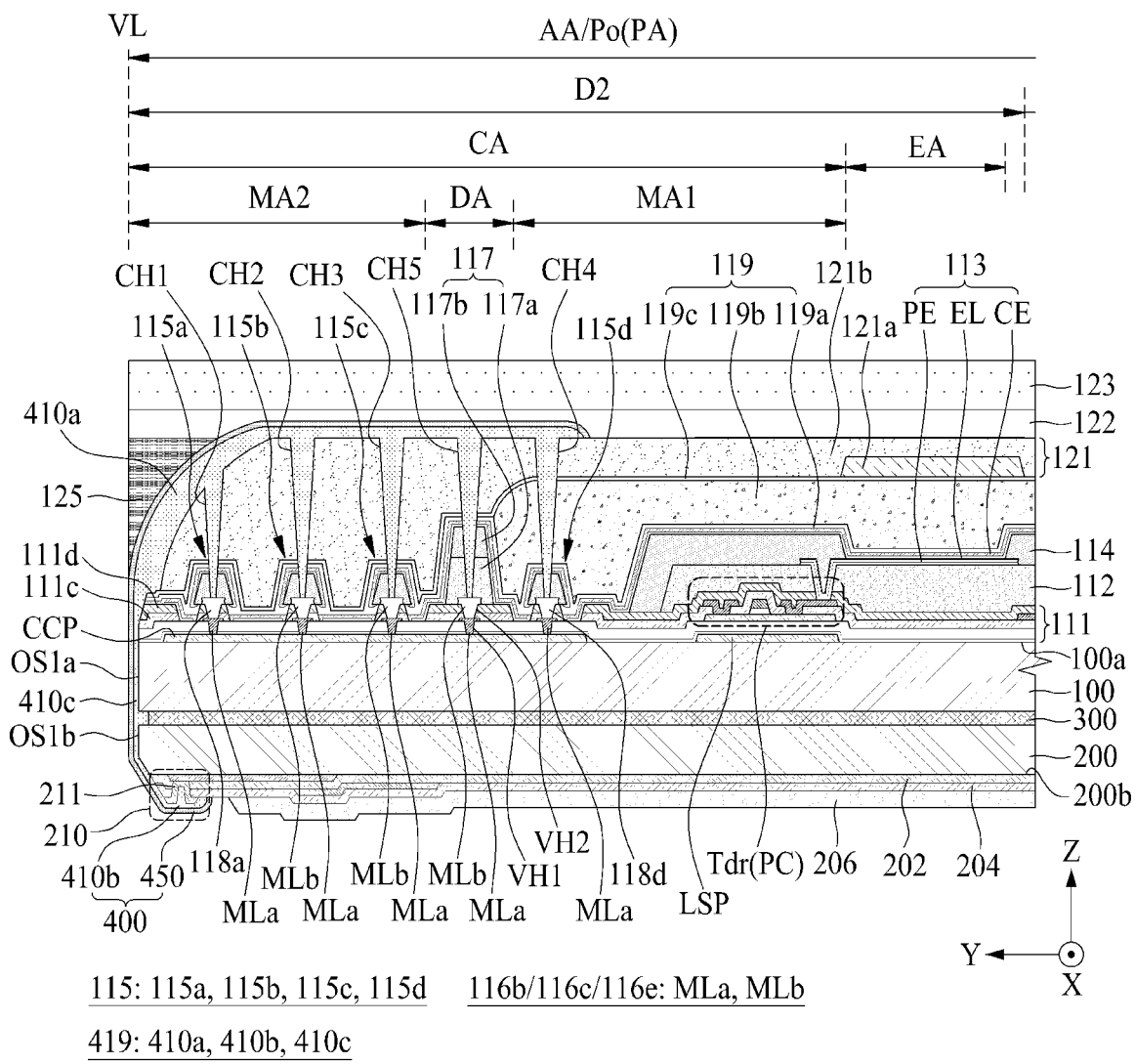
FIG. 19 is a cross-sectional view taken along line IV-IV' illustrated in FIG. 18.
Figure 20:
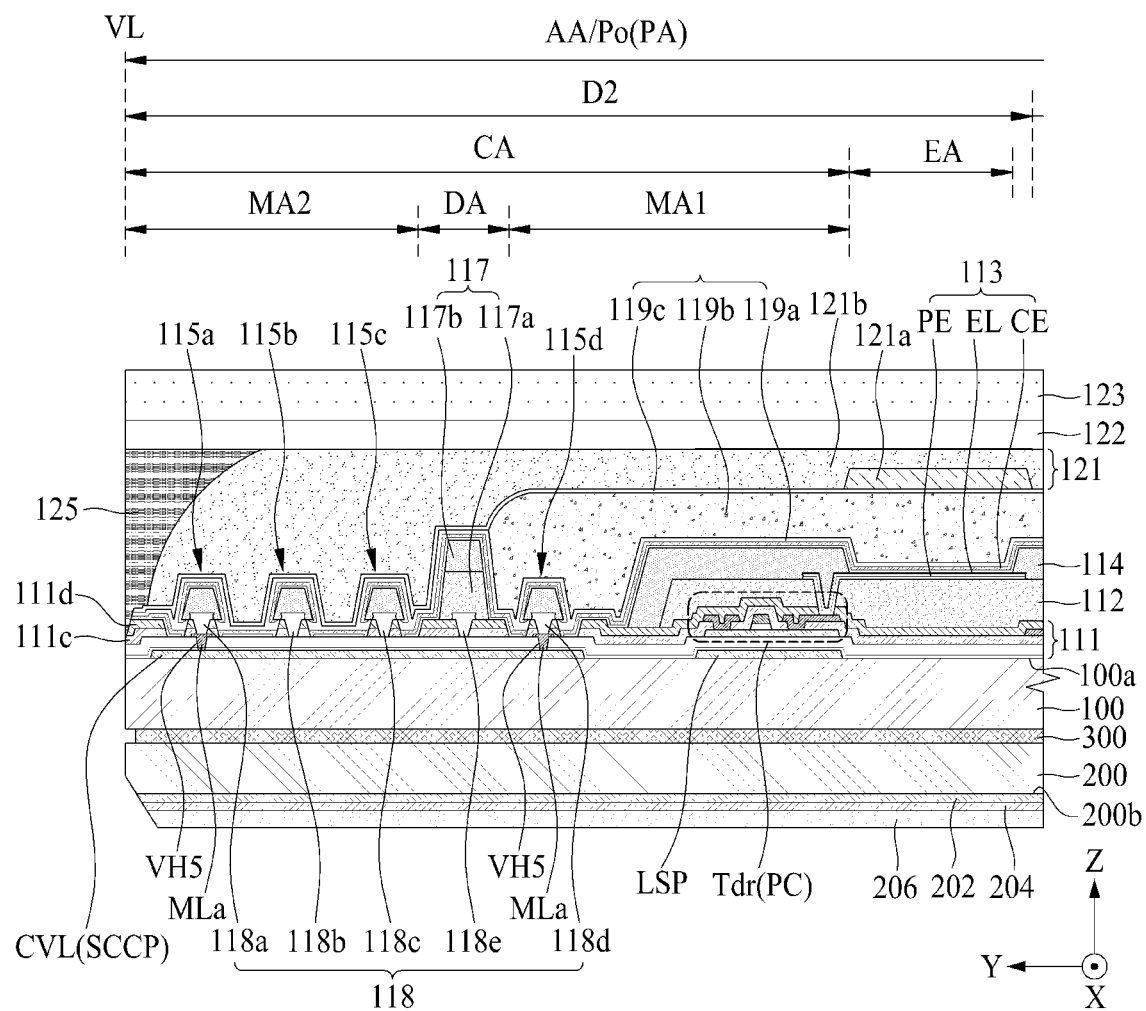
FIG. 20 is a cross-sectional view taken along line V-V' illustrated in FIG. 18.
Figure 21:
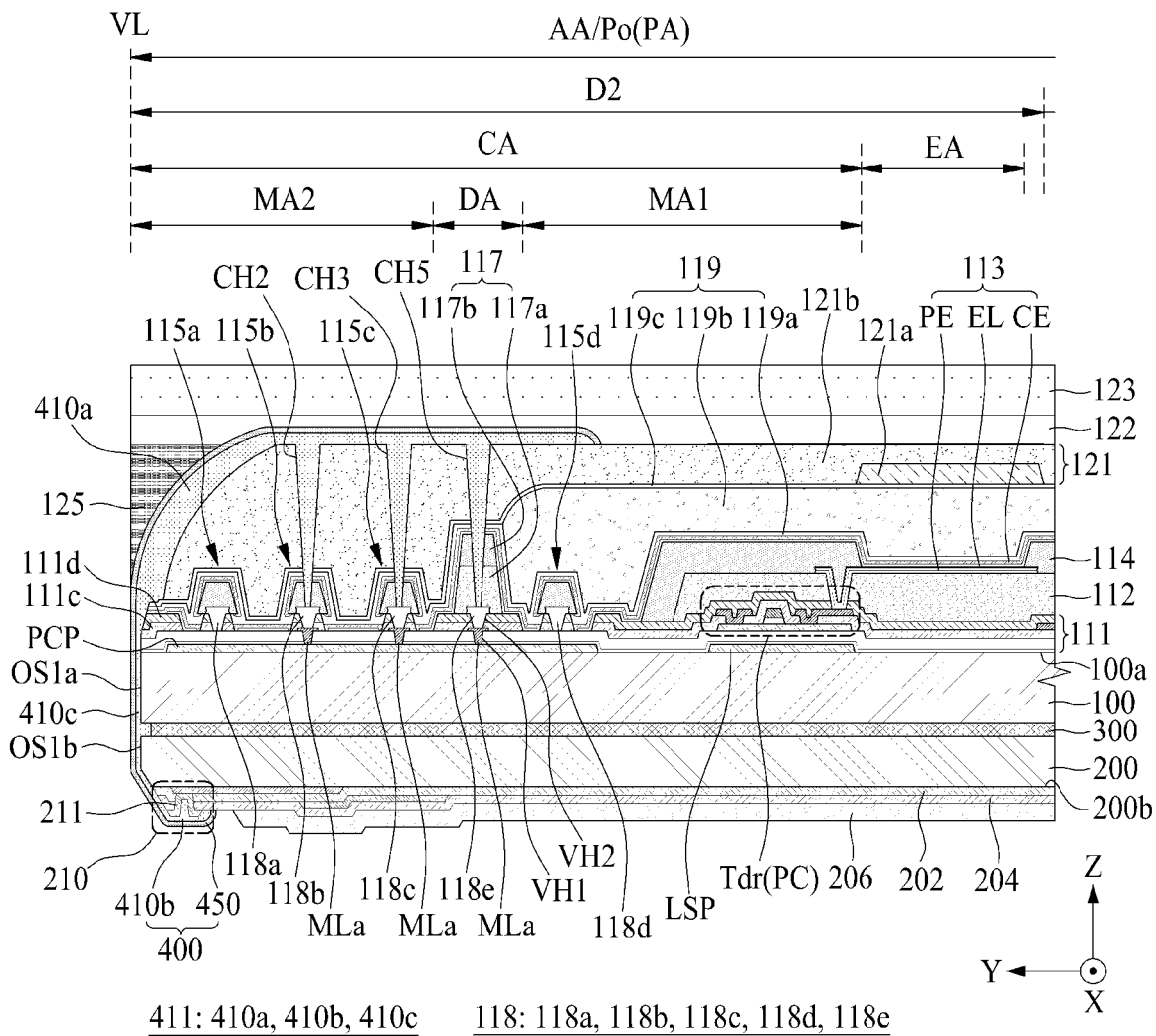
FIG. 21 is a cross-sectional view taken along line VI-VI' illustrated in FIG. 18.
Figure 22:
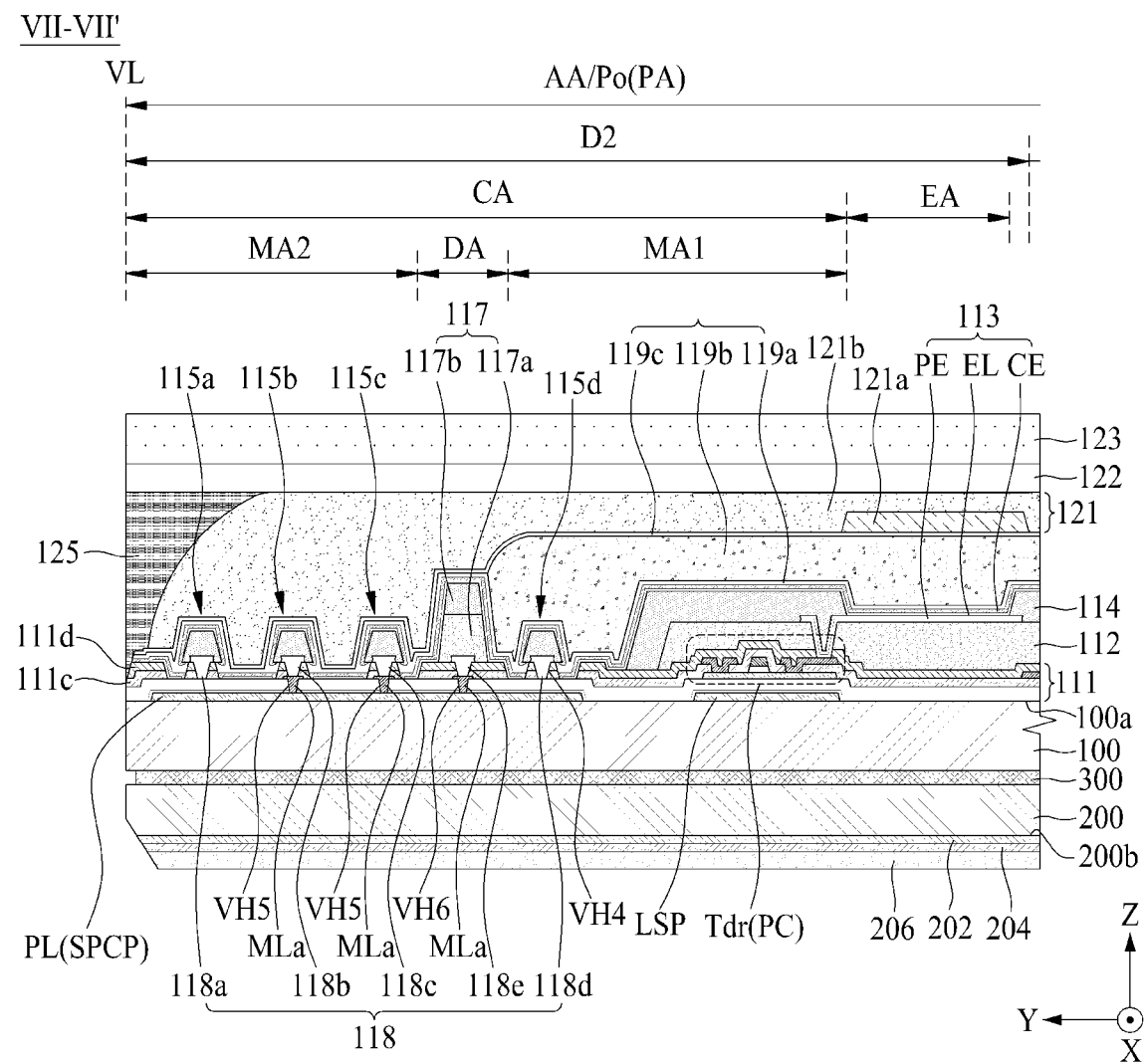
FIG. 22 is a cross-sectional view taken along line VII-VII' illustrated in FIG. 18.

FIG. 18 is a diagram for describing a connection structure between a pixel driving line, a routing portion, and an auxiliary line portion according to another embodiment of the present disclosure, FIG. 19 is a cross-sectional view taken along line IV-IV' illustrated in FIG. 18, FIG. 20 is a cross-sectional view taken along line V-V' illustrated in FIG. 18, FIG. 21 is a cross-sectional view taken along line VI-VI' illustrated in FIG. 18, and FIG. 22 is a cross-sectional view taken along line VII-VII' illustrated in FIG. 18. FIGS. 18 to 22 illustrate an embodiment where the auxiliary line portion illustrated in FIGS. 13 to 17 is configured as a signal supply line. In describing FIGS. 18 to 22, only an auxiliary line portion and elements relevant thereto will be described below, the other elements are referred to by the same reference numerals as FIGS. 13 to 17, and their repetitive descriptions are omitted.

Referring to FIG. 18, an auxiliary line portion 118 according to another embodiment of the present disclosure may include first to fifth auxiliary lines 118a to 118e disposed in a discontinuity portion 115 and a dam portion 117.

The first auxiliary line 118a may be formed to have a closed loop line form on a first substrate 100. For example, a first middle pattern of an auxiliary pattern portion 116 disposed at one side periphery portion of the first substrate 100 and the first auxiliary line 118a of the auxiliary line portion 118 disposed at a periphery portion other than the one side periphery portion of the first substrate 100 may be electrically connected to each other to have a closed loop line form. For example, the first auxiliary line 118a may be referred to as a first closed loop auxiliary line or a first conductive closed loop line, but embodiments of the present disclosure are not limited thereto.

The first auxiliary line 118a disposed at the one side periphery portion of the first substrate 100 may be disposed to cross a contact pattern portion 110 in a first direction X. For example, the first auxiliary line 118a disposed at the one side periphery portion of the first substrate 100 may be disposed in a first discontinuity structure 115a between the contact pattern portion 110 and a routing portion 400.

The first auxiliary line 118a may be electrically connected to a plurality of pixel common voltage lines CVL at the one side periphery portion of the first substrate 100. Also, the first auxiliary line 118a may be electrically (or in common) connected to only a plurality of pixel common voltage routing lines 419 among a plurality of routing lines 411, 413, 415, 417, and 419 disposed in the routing portion 400. For example, the first auxiliary line 118a may be electrically (or in common) connected to a first portion 410a of each of the pixel common voltage routing lines 419 through at least one first routing contact hole CH1.

Additionally, the first auxiliary line 118a may be electrically connected to each of the plurality of pixel common voltage lines CVL at the other side periphery portion of the first substrate 100 parallel to the one side periphery portion of the first substrate 100. For example, the first auxiliary line 118a may be electrically (or in common) connected to the other side of each of the pixel common voltage lines CVL through a fifth via hole VH5 at the other side periphery portion of the first substrate 100.

The first auxiliary line 118a may be disposed at an outermost periphery portion of the first substrate 100 and may maintain the same electrical potential as that of the pixel common voltage lines CVL, and thus, may primarily cut off static electricity flowing into a display portion AA from the outside, thereby preventing a defect caused by the static electricity. For example, the first auxiliary line 118a may discharge the static electricity, flowing in from the outside, to the pixel common voltage routing lines 419 and/or the pixel common voltage lines CVL, thereby preventing a defect caused by the static electricity.

Each of second and third auxiliary lines 118b and 118c may be disposed at the other side periphery portion, except the one side periphery portion, of the first substrate 100. Each of second and third auxiliary lines 118*b* and 118*c* may be electrically connected to first and last pixel driving power lines PL among a plurality of pixel driving power lines PL at one side (or one side corner portion) and the other side (or the other side corner portion) of the one side periphery portion of the first substrate 100. Also, each of second and third auxiliary lines 118*b* and 118*c* may be electrically connected to a first portion 410*a* of each of first and last pixel driving power routing lines 411 among a plurality of pixel driving power routing lines 411 through at least one routing contact holes CH2 and CH3.

Additionally, each of the second and third auxiliary lines 118*b* and 118*c* may be electrically connected to each of the plurality of pixel driving power lines PL at the other side periphery portion of the first substrate 100. For example, each of the second and third auxiliary lines 118*b* and 118*c* may be electrically (or in common) connected to the other side of each of the pixel driving power lines PL through the fifth via hole VH5 at the other side periphery portion of the first substrate 100.

Each of the second and third auxiliary lines 118*b* and 118*c* may maintain the same electrical potential as that of the pixel driving power lines PL. Each of the second and third auxiliary lines 118*b* and 118*c* may be electrically connected to the pixel driving power lines PL, and thus, the voltage drop (IR drop) of a pixel driving power caused by a line resistance of each of the pixel driving power lines PL may be reduced.

The fourth auxiliary line 118*d* may be formed to have a closed loop line form on the first substrate 100. For example, a fourth middle pattern of an auxiliary pattern portion 116 disposed at one side periphery portion of the first substrate 100 and the fourth auxiliary line 118*d* of the auxiliary line portion 118 disposed at a periphery portion other than the one side periphery portion of the first substrate 100 may be electrically connected to each other to have a closed loop line form. For example, the fourth auxiliary line 118*d* may be referred to as a second closed loop auxiliary line or a second conductive closed loop line, but embodiments of the present disclosure are not limited thereto.

The fourth auxiliary line 118*d* disposed at the one side periphery portion of the first substrate 100 may be disposed to cross the contact pattern portion 110 in the first direction X. For example, the fourth auxiliary line 118*d* disposed at the one side periphery portion of the first substrate 100 may be disposed in a fourth discontinuity structure 115*d* between the contact pattern portion 110 and the routing portion 400.

The fourth auxiliary line 118*d* may be electrically connected to a plurality of pixel common voltage lines CVL at the one side periphery portion of the first substrate 100. Also, the fourth auxiliary line 118*d* may be electrically connected to only the pixel common voltage routing lines 419 among the plurality of routing lines 411, 413, 415, 417, and 419 disposed in the routing portion 400. For example, the fourth auxiliary line 118*d* may be electrically (or in common) connected to a first portion 410*a* of each of the pixel common voltage routing lines 419 through at least one fourth routing contact hole CH4.

Additionally, the fourth auxiliary line 118*d* may be electrically connected to each of the plurality of pixel common voltage lines CVL at the other side periphery portion of the first substrate 100 parallel to the one side periphery portion of the first substrate 100. For example, the fourth auxiliary line 118*d* may be electrically (or in common) connected to the other side of each of the pixel common voltage lines CVL through the fifth via hole VH5 at the other side periphery portion of the first substrate 100.

The fourth auxiliary line 118*d* may be disposed at an inner portion of the dam portion 117 and may maintain the same electrical potential as that of the pixel common voltage lines CVL, and thus, may secondarily cut off static electricity flowing into the display portion AA from the outside, thereby preventing a defect caused by the static electricity. For example, the fourth auxiliary line 118*d* may discharge the static electricity, flowing in from the outside, to the pixel common voltage routing lines 419 and/or the pixel common voltage lines CVL, thereby preventing a defect caused by the static electricity.

The fifth auxiliary line 118*e* may be disposed at the other side periphery portion, except the one side periphery portion, of the first substrate 100. The fifth auxiliary line 118*e* may be electrically connected to the first and last pixel driving power lines PL among the plurality of pixel driving power lines PL at the one side (or one side corner portion) and the other side (or the other side corner portion) of the one side periphery portion of the first substrate 100. Also, the fifth auxiliary line 118*e* may be electrically connected to a first portion 410*a* of each of the first and last pixel driving power routing lines 411 among the plurality of pixel driving power routing lines 411 through at least one fifth routing contact hole CH5.

Additionally, the fifth auxiliary line 118*e* may be electrically connected to each of the plurality of pixel driving power lines PL at the other side periphery portion of the first substrate 100. For example, the fifth auxiliary line 118*e* may be electrically (or in common) connected to the other side of each of the pixel driving power lines PL through a sixth via hole VH6 at the other side periphery portion of the first substrate 100.

The fifth auxiliary line 118*e* may maintain the same electrical potential as that of the pixel driving power lines PL. The fifth auxiliary line 118*e* may be electrically connected to the pixel driving power lines PL, and thus, the voltage drop (IR drop) of the pixel driving power caused by a line resistance of each of the pixel driving power lines PL may be reduced.

Referring to FIGS. 18 and 19, in another embodiment of the present disclosure, the first auxiliary line 118*a* may be electrically connected to a first portion 410*a* of each of the pixel common voltage routing lines 419 of the routing portion 400 through at least one first routing contact hole CH1 on the pixel common voltage contact patterns CCP disposed in the contact pattern portion 110. Also, the first auxiliary line 118*a* may be electrically connected to the pixel common voltage contact patterns CCP through a first via hole VH1 formed in the buffer layer 111*a* disposed on the pixel common voltage contact patterns CCP. Additionally, the first auxiliary line 118*a* may be electrically connected to the pixel common voltage contact patterns CCP through a metal layer MLa disposed in the first via hole VH1 of the buffer layer 111*a*.

In another embodiment of the present disclosure, the fourth auxiliary line 118*d* may be electrically connected to the first portion 410*a* of each of the pixel common voltage routing lines 419 of the routing portion 400 through at least one fourth routing contact hole CH4 on the pixel common voltage contact patterns CCP disposed in the contact pattern portion 110. Also, the fourth auxiliary line 118*d* may be electrically connected to the pixel common voltage contact patterns CCP through the first via hole VH1 formed in the buffer layer 111*a* disposed on the pixel common voltage contact patterns CCP. Additionally, the fourth auxiliary line 118d may be electrically connected to the pixel common voltage contact patterns CCP through the metal layer MLa disposed in the first via hole VH1 of the buffer layer 111a.

The first portion 410a of each of the pixel common voltage routing lines 419 disposed in the routing portion 400 may be electrically (or in common) connected to the first auxiliary line 118a through at least one first routing contact hole CH1 and to the fourth auxiliary line 118d through at least one fourth routing contact hole CH4 and may be electrically (or in common) connected to the pixel common voltage contact patterns CCP through the first auxiliary line 118a and the fourth auxiliary line 118d. Also, the first portion 410a of each of the pixel common voltage routing lines 419 disposed in the routing portion 400 may be electrically (or in common) connected to the second, third, and fifth middle patterns 116b, 116c, and 116e through all of at least one second routing contact hole CH2, at least one third routing contact hole CH3, and at least one fourth routing contact hole CH4 and may be electrically (or in common) connected to the pixel common voltage contact patterns CCP through the second, third, and fifth middle patterns 116b, 116c, and 116e.

Therefore, in the light emitting display apparatus according to another embodiment of the present disclosure, a uniform pixel common voltage may be supplied to the pixel common voltage lines CVL disposed in the display portion AA of the first substrate 100, and thus, the uniformity of the pixel common voltage may be enhanced. Also, in the light emitting display apparatus according to another embodiment of the present disclosure, because the first and fourth auxiliary lines 118a and 118d having a closed loop line form on the first substrate 100 are electrically connected to the pixel common voltage lines CVL, a defect caused by static electricity flowing in from the outside may be prevented or minimized.

Referring to FIGS. 18 and 20, in another embodiment of the present disclosure, the first auxiliary line 118a may be electrically (or in common) connected to the other side of each of the pixel common voltage lines CVL through at least one fifth via hole VH5 at the other side periphery portion of the first substrate 100. The at least one fifth via hole VH5 may be formed in the buffer layer 111a disposed in an overlapping region between the other side of each of the pixel common voltage lines CVL and the first auxiliary line 118a. The at least one fifth via hole VH5 may be formed along with at least one first via hole VH1. Additionally, the first auxiliary line 118a may be electrically (or in common) connected to the other side of each of the pixel common voltage lines CVL through a metal layer MLa disposed in the fifth via hole VH5 of the buffer layer 111a.

The fourth auxiliary line 118d may be electrically (or in common) connected to the other side of each of the pixel common voltage lines CVL through at least one fifth via hole VH5 at the other side periphery portion of the first substrate 100. The at least one fifth via hole VH5 may be formed in the buffer layer 111a disposed in an overlapping region between the other side of each of the pixel common voltage lines CVL and the fourth auxiliary line 118d. Additionally, the fourth auxiliary line 118d may be electrically (or in common) connected to the other side of each of the pixel common voltage lines CVL through a metal layer MLa disposed in the fifth via hole VH5 of the buffer layer 111a.

The light emitting display apparatus another embodiment of the present disclosure may further include a plurality of first auxiliary contact patterns SCCP. For example, the first auxiliary contact pattern SCCP may be referred to as a pixel common voltage auxiliary contact pattern, but embodiments of the present disclosure are not limited thereto.

The first auxiliary contact patterns SCCP according to an embodiment of the present disclosure may be disposed on the same layer as the pixel common voltage lines CVL and may extend (or enlarge) from an end of each of the pixel common voltage lines CVL, disposed at the other side periphery portion of the substrate 100, to an outer surface OS of the substrate 100 to have a relatively wide width. According to another embodiment of the present disclosure, each of the first auxiliary contact patterns SCCP may be disposed under the pixel common voltage lines CVL to overlap an end of each of the pixel common voltage lines CVL disposed at the other side periphery portion of the substrate 100 and to have a relatively wide width and may be electrically connected to the end of each of the pixel common voltage lines CVL through an inner contact hole.

The first auxiliary line 118a may be electrically (or in common) connected to the first auxiliary contact patterns SCCP through at least one fifth via hole VH5 at the other side periphery portion of the first substrate 100. Additionally, the first auxiliary line 118a may be electrically (or in common) connected to the first auxiliary contact patterns SCCP through a metal layer MLa disposed in the fifth via hole VH5 of the buffer layer 111a.

The fourth auxiliary line 118d may be electrically (or in common) connected to the first auxiliary contact patterns SCCP through at least one fifth via hole VH5 at the other side periphery portion of the first substrate 100. Additionally, the fourth auxiliary line 118d may be electrically (or in common) connected to the first auxiliary contact patterns SCCP through a metal layer MLa disposed in the fifth via hole VH5 of the buffer layer 111a.

Therefore, in the light emitting display apparatus according to another embodiment of the present disclosure, the pixel common voltage may be simultaneously supplied to the one side and the other side of each of the pixel common voltage lines CVL through the first and fourth auxiliary lines 118a and 118d having a closed loop line form, and thus, the uniformity of the pixel common voltage may be more enhanced. Also, in the light emitting display apparatus according to another embodiment of the present disclosure, because the first and fourth auxiliary lines 118a and 118d having a closed loop line form on the first substrate 100 are electrically connected to the one sides and the other sides of the pixel common voltage lines CVL, a defect caused by static electricity flowing in from the outside may be prevented or minimized.

Referring to FIGS. 18 and 21, in another embodiment of the present disclosure, the second auxiliary line 118b may be electrically connected to a first portion 410a of each of first and last pixel driving power routing lines 411 among the routing portion 400 through at least one second routing contact holes CH2 on first and last pixel driving power contact patterns PCP disposed in the contact pattern portion 110. Also, the second auxiliary line 118b may be electrically connected to the first and last pixel driving power contact patterns PCP through a first via hole VH1 formed in the buffer layer 111a disposed on the first and last pixel driving power contact patterns PCP. Additionally, the second auxiliary line 118b may be electrically connected to the first and last pixel driving power contact patterns PCP through a metal layer MLa disposed in the first via hole VH1 of the buffer layer 111a.

The third auxiliary line 118c may be electrically connected to the first portion 410a of each of the first and last pixel driving power routing lines 411 of the routing portion 400 through at least one third routing contact holes CH3 on the first and last pixel driving power contact patterns PCP disposed in the contact pattern portion 110. Also, the third auxiliary line 118c may be electrically connected to the first and last pixel driving power contact patterns PCP through the first via hole VH1 formed in the buffer layer 111a disposed on the first and last pixel driving power contact patterns PCP. Additionally, the third auxiliary line 118c may be electrically connected to the first and last pixel driving power contact patterns PCP through the metal layer MLa disposed in the first via hole VH1 of the buffer layer 111a.

The fifth auxiliary line 118e may be electrically connected to a first portion 410a of each of first and last pixel driving power routing lines 411 of the routing portion 400 through at least one fifth routing contact holes CH5 on the first and last pixel driving power contact patterns PCP disposed in the contact pattern portion 110. Also, the fifth auxiliary line 118e may be electrically connected to the first and last pixel driving power contact patterns PCP through the first via hole VH1 formed in the buffer layer 111a disposed on the first and last pixel driving power contact patterns PCP. Additionally, the fifth auxiliary line 118e may be electrically connected to the first and last pixel driving power contact patterns PCP through the metal layer MLa disposed in the first via hole VH1 of the buffer layer 111a.

Therefore, in the light emitting display apparatus according to another embodiment of the present disclosure, first and last pixel driving voltage lines PL disposed in the display portion AA of the first substrate 100 may be electrically connected to each of the second, third, and fifth auxiliary lines 118b, 118c, and 118e, and thus, the voltage drop (IR drop) of a pixel driving power caused by a line resistance of each of the pixel driving power lines PL may be reduced.

Referring to FIGS. 18 and 22, in another embodiment of the present disclosure, the second auxiliary line 118b may be electrically (or in common) connected to the other side of each of the pixel driving power lines PL through at least one fifth via hole VH5 at the other side periphery portion of the first substrate 100. The at least one fifth via hole VH5 may be formed in the buffer layer 111a disposed in an overlapping region between the other side of each of the pixel driving power lines PL and the second auxiliary line 118b. Additionally, the second auxiliary line 118b may be electrically (or in common) connected to the other side of each of the pixel driving power lines PL through a metal layer MLa disposed in the fifth via hole VH5 of the buffer layer 111a.

The third auxiliary line 118c may be electrically (or in common) connected to the other side of each of the pixel driving power lines PL through at least one fifth via hole VH5 at the other side periphery portion of the first substrate 100. The at least one fifth via hole VH5 may be formed in the buffer layer 111a disposed in an overlapping region between the other side of each of the pixel driving power lines PL and the fourth auxiliary line 118d. Additionally, the third auxiliary line 118c may be electrically (or in common) connected to the other side of each of the pixel driving power lines PL through a metal layer MLa disposed in the fifth via hole VH5 of the buffer layer 111a.

The fifth auxiliary line 118e may be electrically (or in common) connected to the other side of each of the pixel driving power lines PL through at least one sixth via hole VH6 at the other side periphery portion of the first substrate 100. The at least one sixth via hole VH6 may be formed in the buffer layer 111a disposed in an overlapping region between the other side of each of the pixel driving power lines PL and the fourth auxiliary line 118d. The at least one sixth via hole VH6 may be formed along with at least one fifth via hole VH5. Additionally, the fifth auxiliary line 118e may be electrically (or in common) connected to the other side of each of the pixel driving power lines PL through a metal layer MLa disposed in the sixth via hole VH6 of the buffer layer 111a.

The light emitting display apparatus another embodiment of the present disclosure may further include a plurality of second auxiliary contact patterns SPCP. For example, the second auxiliary contact pattern SPCP may be referred to as a pixel driving power auxiliary contact pattern.

The second auxiliary contact pattern SPCP according to an embodiment of the present disclosure may be disposed on the same layer as the pixel driving power lines PL and may extend (or enlarge) from an end of each of the pixel driving power lines PL, disposed at the other side periphery portion of the substrate 100, to an outer surface OS of the substrate 100 to have a relatively wide width. According to another embodiment of the present disclosure, each of the second auxiliary contact patterns SPCP may be disposed under the pixel driving power lines PL to overlap an end of each of the pixel driving power lines PL disposed at the other side periphery portion of the substrate 100 and to have a relatively wide width and may be electrically connected to the end of each of the pixel driving power lines PL through an inner contact hole.

The second auxiliary line 118b may be electrically (or in common) connected to the second auxiliary contact pattern SPCP through at least one fifth via hole VH5 at the other side periphery portion of the first substrate 100. Additionally, the second auxiliary line 118b may be electrically (or in common) connected to the second auxiliary contact pattern SPCP through a metal layer MLa disposed in the fifth via hole VH5 of the buffer layer 111a.

The third auxiliary line 118c may be electrically (or in common) connected to the second auxiliary contact pattern SPCP through at least one fifth via hole VH5 at the other side periphery portion of the first substrate 100. Additionally, the third auxiliary line 118c may be electrically (or in common) connected to the second auxiliary contact pattern SPCP through a metal layer MLa disposed in the fifth via hole VH5 of the buffer layer 111a.

The fifth auxiliary line 118e may be electrically (or in common) connected to the second auxiliary contact pattern SPCP through at least one sixth via hole VH6 at the other side periphery portion of the first substrate 100. Additionally, the fifth auxiliary line 118e may be electrically (or in common) connected to the second auxiliary contact pattern SPCP through a metal layer MLa disposed in the sixth via hole VH6 of the buffer layer 111a.

Therefore, in the light emitting display apparatus according to another embodiment of the present disclosure, the pixel driving power may be simultaneously supplied to the one side and the other side of each of the pixel driving power lines PL, and thus, the voltage drop (IR drop) of the pixel driving power caused by a line resistance of each of the pixel driving power lines PL may be reduced and the uniformity of the pixel driving power may be more enhanced.

Additionally, in FIGS. 18 to 22, the third auxiliary line 118c may be implemented not to be electrically connected to the pixel driving power line PL and to be formed in a closed loop line form like the first and fourth auxiliary lines 118a and 118d and electrically connected to the pixel common voltage line CVL.

Figure 23:
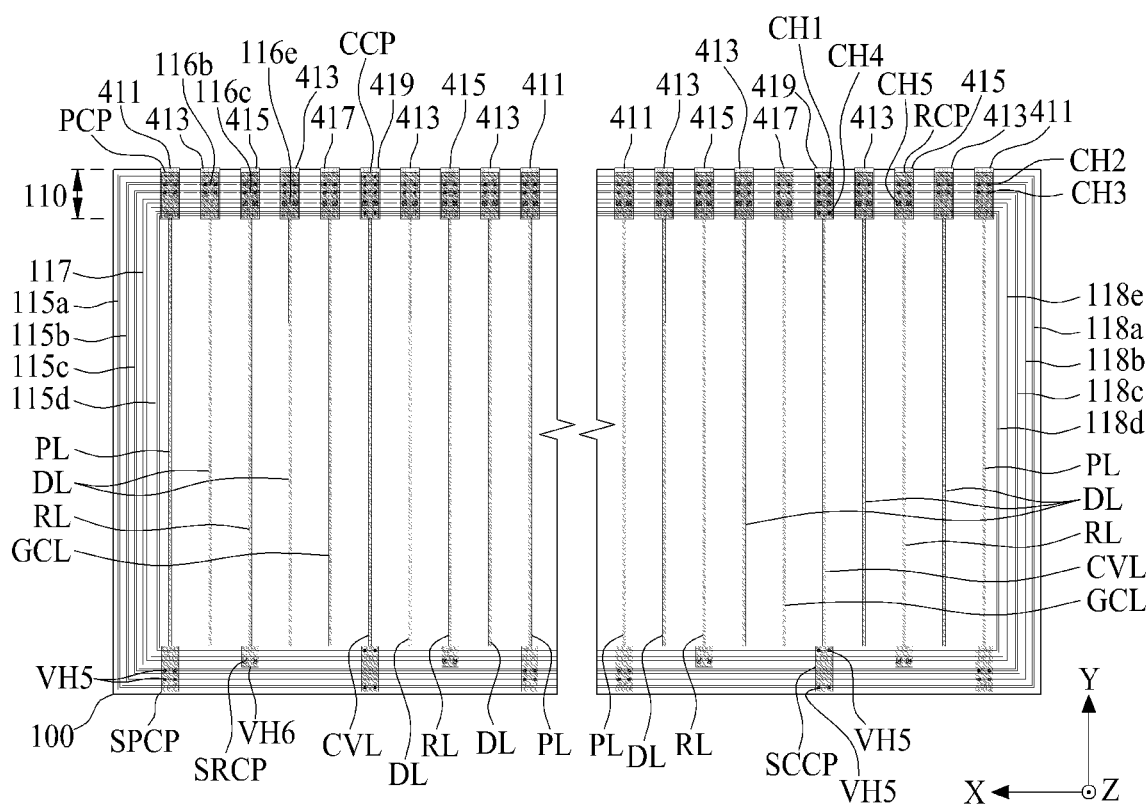
FIG. 23 is a diagram illustrating a connection structure of a pixel driving line, a routing portion, and an auxiliary line portion according to another embodiment of the present disclosure.

FIG. 23 is a diagram for describing a connection structure between a pixel driving line, a routing portion, and an auxiliary line portion according to another embodiment of the present disclosure and illustrates an embodiment implemented by modifying the fifth auxiliary lines illustrated in FIGS. 18 to 22. In describing FIG. 23, only a fifth auxiliary line and elements relevant thereto will be described below, the other elements are referred to by the same reference numerals as FIGS. 18 to 22, and their repetitive descriptions are omitted.

Referring to FIG. 23, in another embodiment of the present disclosure, a fifth auxiliary line 118e may be used as a reference voltage supply line for secondarily supplying a reference voltage to a plurality of reference voltage lines RL.

The fifth auxiliary line 118e according to an embodiment of the present disclosure may be formed to be electrically connected to first and last reference voltage contact patterns RCP among a plurality of reference contact patterns RCP disposed in a contact pattern portion 110.

The fifth auxiliary line 118e may be electrically connected to a first portion of each of first and last reference voltage routing lines 415 among a plurality of reference voltage routing lines 415 through at least one fifth routing contact hole CH5. Also, the fifth auxiliary line 118e may be electrically connected to the first and last reference voltage contact patterns RCP through a first via hole formed in a buffer layer 111a disposed on the first and last reference voltage contact patterns RCP. Additionally, the fifth auxiliary line 118e may be electrically connected to the first and last reference voltage contact patterns RCP through a metal layer disposed in the first via hole of the buffer layer 111a.

Additionally, the fifth auxiliary line 118e may be electrically (or in common) connected to the reference voltage lines RL at the other side periphery portion of the first substrate 100. For example, the fifth auxiliary line 118e may be electrically (or in common) connected to the other side of each of the reference voltage lines RL through a sixth via hole VH6 at the other side periphery portion of the first substrate 100.

The fifth auxiliary line 118e may maintain the same electrical potential as that of each of the reference voltage lines RL. The fifth auxiliary line 118e may be electrically connected to the reference voltage lines RL, and thus, the voltage drop (IR drop) of a reference voltage caused by a line resistance of each of the reference voltage lines RL may be reduced.

The light emitting display apparatus according to another embodiment of the present disclosure may further include a plurality of third auxiliary contact patterns SRCP. For example, the third auxiliary contact patterns SRCP may be referred to as a reference voltage auxiliary contact pattern, but embodiments of the present disclosure are not limited thereto.

The third auxiliary contact patterns SRCP according to an embodiment of the present disclosure may be disposed on the same layer as the reference voltage lines RL and may extend (or enlarge) from an end of each of the reference voltage lines RL, disposed at the other side periphery portion of the substrate 100, to an outer surface OS of the substrate 100 to have a relatively wide width. According to another embodiment of the present disclosure, each of the third auxiliary contact patterns SRCP may be disposed under the reference voltage lines RL to overlap an end of each of the reference voltage lines RL disposed at the other side periphery portion of the substrate 100 and to have a relatively wide width and may be electrically connected to the end of each of the reference voltage lines RL through an inner contact hole.

The fifth auxiliary line 118e may be electrically (or in common) connected to the third auxiliary contact pattern SRCP through at least one sixth via hole VH6 at the other side periphery portion of the first substrate 100. Additionally, the fifth auxiliary line 118e may be electrically (or in common) connected to the third auxiliary contact pattern SRCP through a metal layer MLa disposed in the sixth via hole VH6 of the buffer layer 111a.

Therefore, in the light emitting display apparatus according to another embodiment of the present disclosure, the reference voltage may be simultaneously supplied to the one side and the other side of each of the reference voltage lines RL, and thus, the voltage drop (IR drop) of the reference voltage caused by a line resistance of each of the reference voltage lines RL may be reduced and the uniformity of the reference voltage may be more enhanced.

Figure 24:
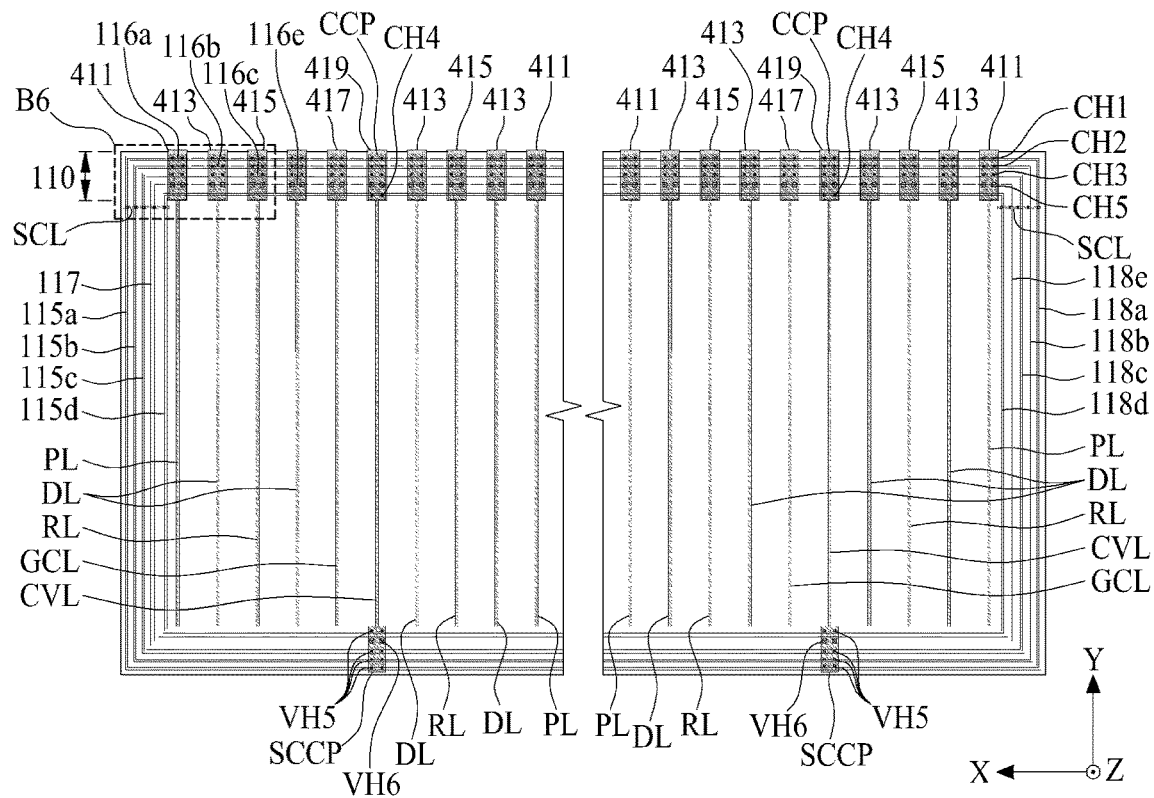
FIG. 24 is a diagram illustrating a connection structure of a pixel driving line, a routing portion, and an auxiliary line portion according to another embodiment of the present disclosure.
Figure 25:
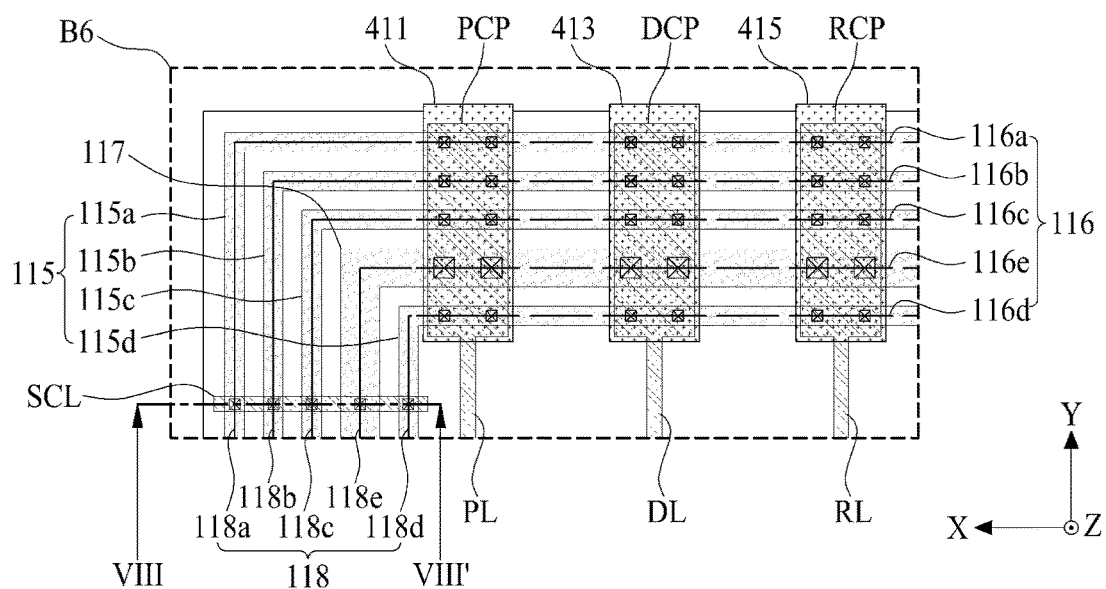
FIG. 25 is an enlarged view of a region B6 illustrated in FIG. 24.
Figure 26:
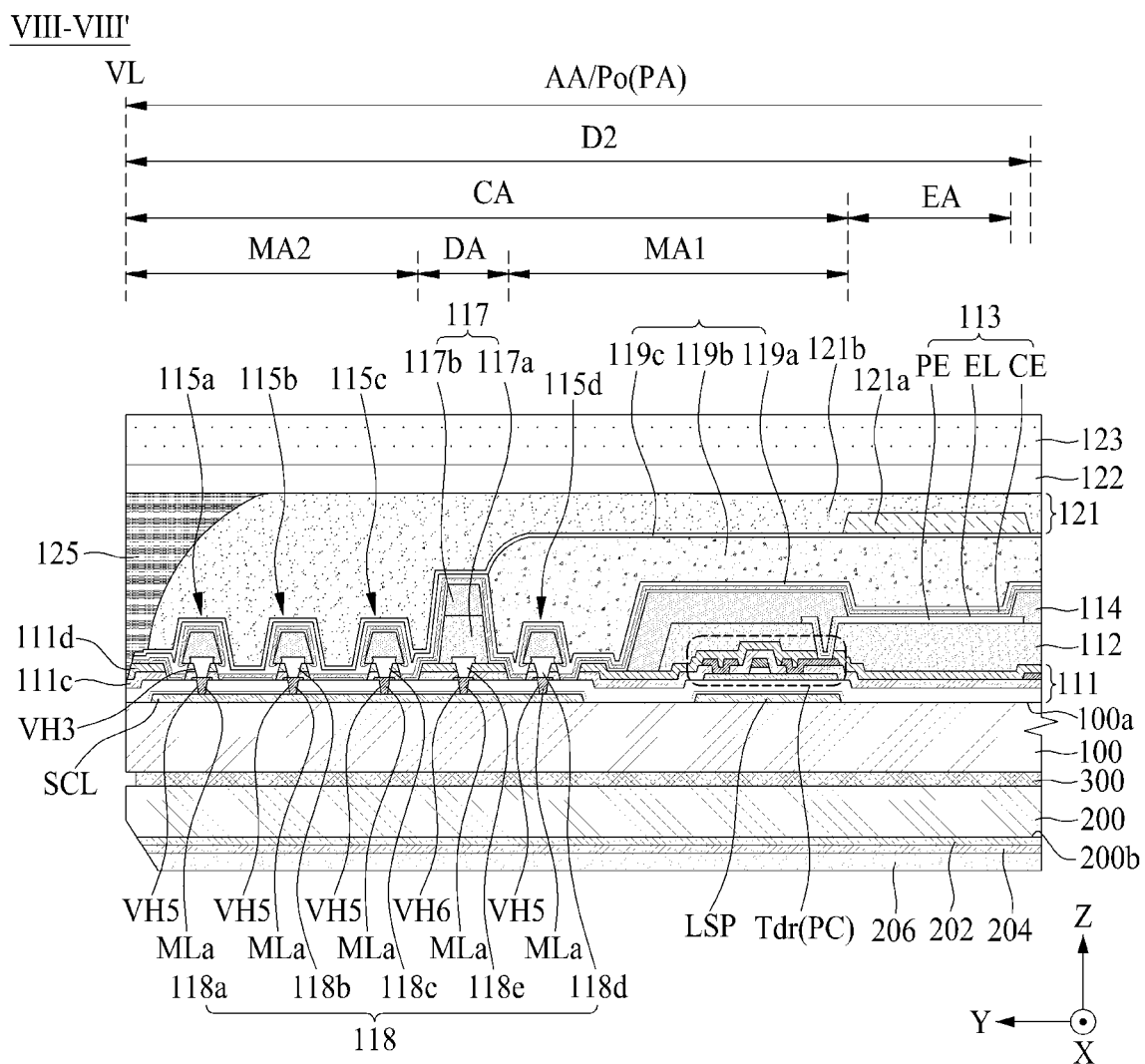
FIG. 26 is a cross-sectional view taken along line VIII-VIII' illustrated in FIG. 25.

FIG. 24 is a diagram for describing a connection structure between a pixel driving line, a routing portion, and an auxiliary line portion according to another embodiment of the present disclosure, FIG. 25 is an enlarged view of a region B6 illustrated in FIG. 24, and FIG. 26 is a cross-sectional view taken along line VIII-VIII' illustrated in FIG. 25. FIGS. 24 to 26 illustrate an embodiment where the auxiliary line portion illustrated in FIGS. 13 to 17 is configured as a pixel common voltage supply line. In describing FIGS. 24 to 26, only an auxiliary line portion and elements relevant thereto will be described below, the other elements are referred to by the same reference numerals as FIGS. 13 to 17, and their repetitive descriptions are omitted.

Referring to FIGS. 24 to 26, a light emitting display apparatus according to another embodiment of the present disclosure may further include at least one auxiliary connection line SCL disposed on a first substrate 100.

The at least one auxiliary connection line SCL may be disposed in parallel with a second direction Y and may be disposed to cross an auxiliary line portion 118. For example, the at least one auxiliary connection line SCL may be disposed in parallel with the second direction Y and may be disposed to cross first to fifth auxiliary lines 118a to 118e of the auxiliary line portion 118.

The at least one auxiliary connection line SCL may be disposed on the same layer as a pixel common voltage line CVL.

The at least one auxiliary connection line SCL may be electrically (or in common) connected to each of the first to fifth auxiliary lines 118a to 118e of the auxiliary line portion 118.

The at least one auxiliary connection line SCL may be electrically (or in common) connected to each of the first to fourth auxiliary lines 118a to 118d through at least one fifth via hole VH5. The at least one fifth via hole VH5 may be formed in a buffer layer 111a disposed in an overlapping region between the at least one auxiliary connection line SCL and each of the first to fourth auxiliary lines 118a to 118d. The at least one fifth via hole VH5 may be formed along with at least one first via hole VH1. Additionally, the at least one auxiliary connection line SCL may be electrically (or in common) connected to each of the first to fourth auxiliary lines 118a to 118d through a metal layer MLa disposed in the fifth via hole VH5 of the buffer layer 111a.

The at least one auxiliary connection line SCL may be electrically (or in common) connected to the fifth auxiliary line 118e through at least one sixth via hole VH6. The at least one sixth via hole VH6 may be formed along with the at least one fifth via hole VH5. Additionally, the at least one auxiliary connection line SCL may be electrically (or in common) connected to the fifth auxiliary line 118e through a metal layer MLa disposed in the sixth via hole VH6 of the buffer layer 111a.

In another embodiment of the present disclosure, the fourth auxiliary line 118d may be formed to have a closed loop line form on the first substrate 100. For example, a fourth middle pattern of an auxiliary pattern portion 116 disposed at one side periphery portion of the first substrate 100 and the fourth auxiliary line 118d of the auxiliary line portion 118 disposed at a periphery portion other than the one side periphery portion of the first substrate 100 may be electrically connected to each other to have a closed loop line form. The fourth auxiliary line 118d may be substantially the same as the fourth auxiliary line 118d described above with reference to FIGS. 18 and 19, and thus, its repetitive description is omitted. For example, in the present embodiment, the fourth auxiliary line 118d may be referred to as a closed loop auxiliary line or a conductive closed loop line, but embodiments of the present disclosure are not limited thereto.

Each of the first to fifth auxiliary lines 118a to 118e of the auxiliary line portion 118 may maintain the same electrical potential as that of the pixel common voltage lines CVL, and thus, may cut off static electricity flowing into a display portion AA from the outside, thereby preventing a defect caused by the static electricity.

In another embodiment of the present disclosure, each of the first to fifth auxiliary lines 118a to 118e of the auxiliary line portion 118 may be electrically (or in common) connected to the other side of each of the pixel common voltage lines CVL at the other side periphery portion of the first substrate 100.

Each of the first to fourth auxiliary lines 118a to 118d may be electrically (or in common) connected to the other side of each of the pixel common voltage lines CVL through at least one fifth via hole VH5 at the other side periphery portion of the first substrate 100. The at least one fifth via hole VH5 may be formed in a buffer layer 111a disposed in an overlapping region between the other side of each of the pixel common voltage lines CVL and each of the first to fourth auxiliary lines 118a to 118d. Additionally, each of the first to fourth auxiliary lines 118a to 118d may be electrically (or in common) connected to the other side of each of the pixel common voltage lines CVL through a metal layer disposed in the fifth via hole VH5 of the buffer layer 111a.

The fifth auxiliary line 118e may be electrically (or in common) connected to the other side of each of the pixel common voltage lines CVL through at least one sixth via hole VH6 at the other side periphery portion of the first substrate 100. The at least one sixth via hole VH6 may be formed in the buffer layer 111a disposed in an overlapping region between the other side of each of the pixel common voltage lines CVL and the fifth auxiliary line 118e. Additionally, the fifth auxiliary line 118e may be electrically (or in common) connected to the other side of each of the pixel common voltage lines CVL through a metal layer disposed in the sixth via hole VH6 of the buffer layer 111a.

Therefore, in the light emitting display apparatus according to another embodiment of the present disclosure, the pixel common voltage may be simultaneously supplied to the one side and the other side of each of the pixel common voltage lines CVL through the auxiliary line portion 118, and thus, the uniformity of the pixel common voltage may be more enhanced. Also, the light emitting display apparatus according to another embodiment of the present disclosure may include the fifth auxiliary line 118e having a closed loop line form on the first substrate 100 and the first and fourth auxiliary lines 118a and 118d electrically connected to the fifth auxiliary line 118e, and thus, a defect caused by static electricity flowing in from the outside may be better prevented or more minimized.

Figure 27:
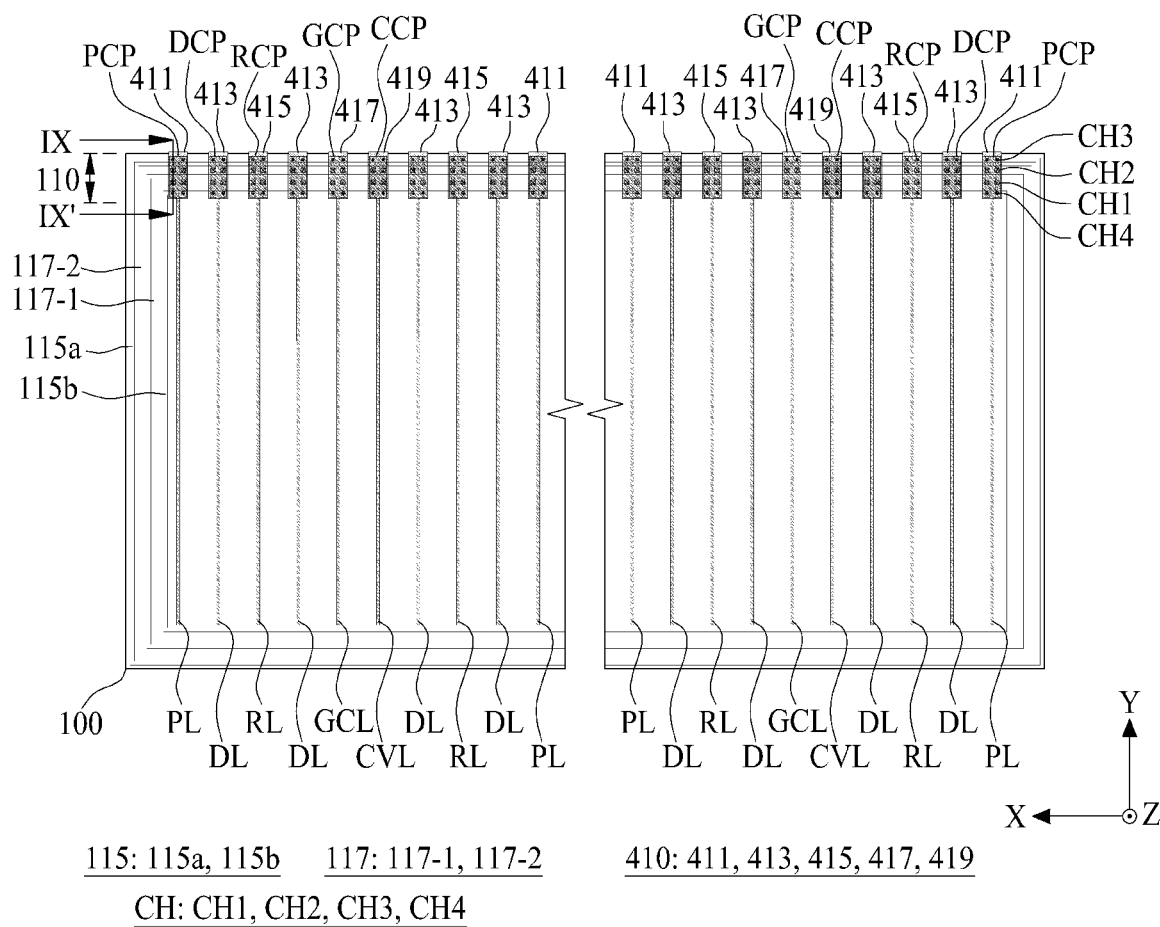
FIG. 27 is a diagram illustrating a light emitting display apparatus according to another embodiment of the present disclosure.
Figure 28:
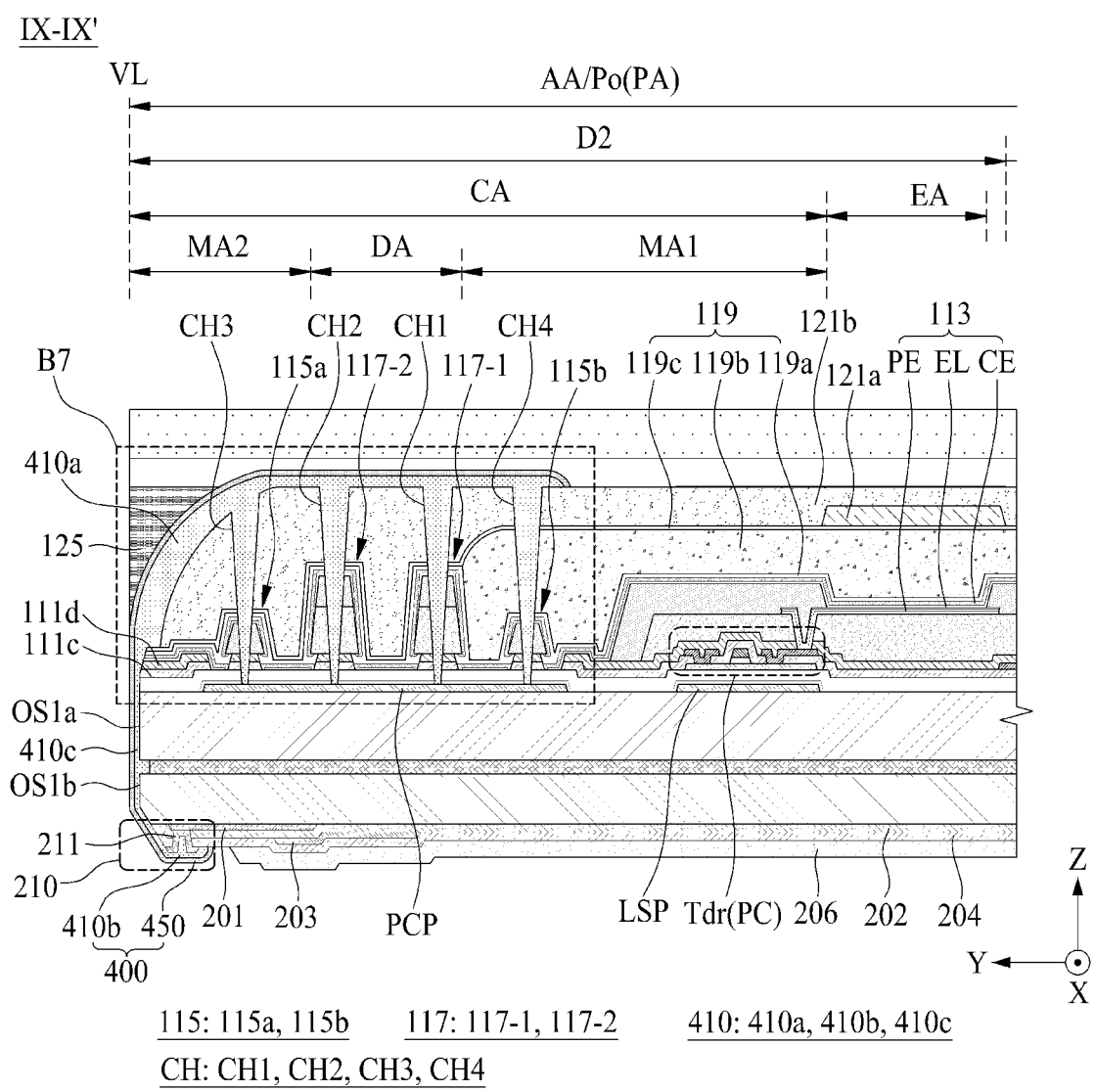
FIG. 28 is a cross-sectional view taken along line IX-IX' illustrated in FIG. 27.
Figure 29:
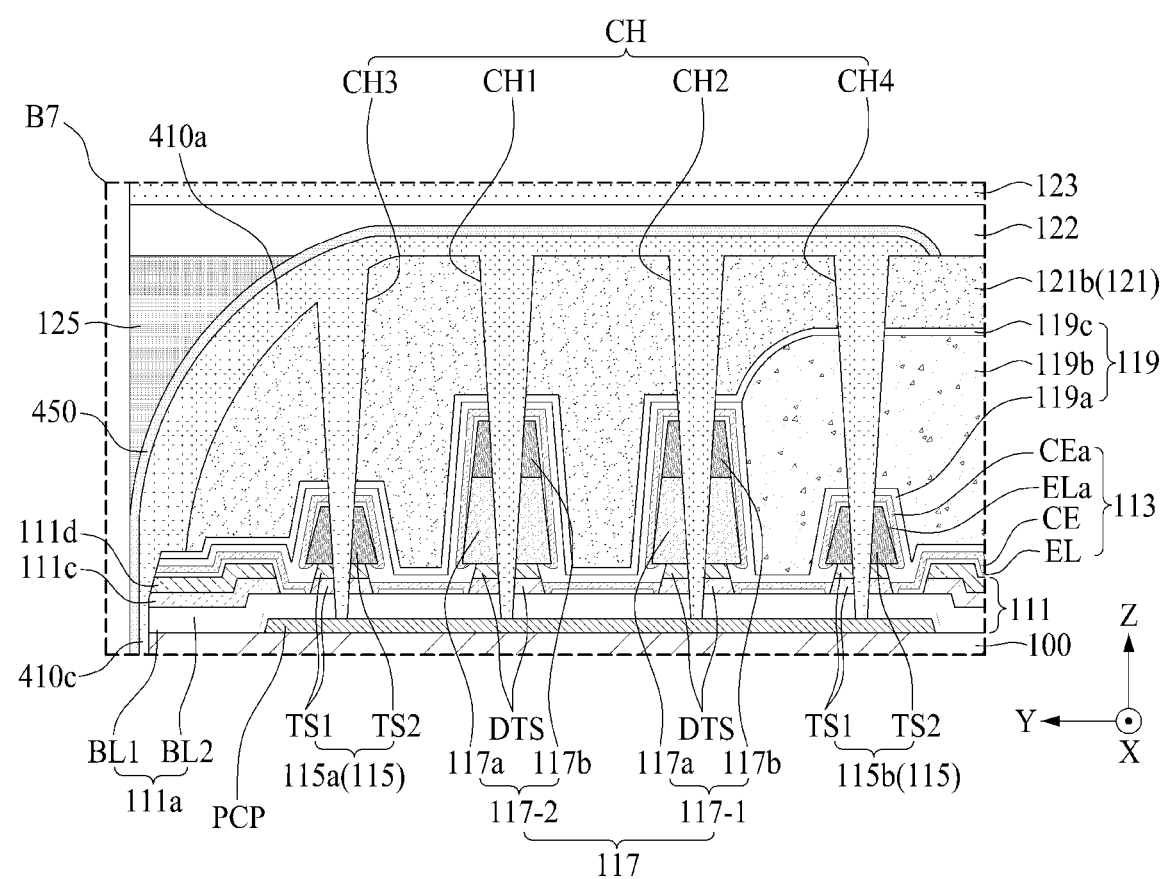
FIG. 29 is an enlarged view of a region B7 illustrated in FIG. 28.

FIG. 27 is a diagram for describing a light emitting display apparatus according to another embodiment of the present disclosure, FIG. 28 is a cross-sectional view taken along line IX-IX' illustrated in FIG. 27, and FIG. 29 is an enlarged view of a region B7 illustrated in FIG. 28. Region B7 includes a periphery portion of the substrate which is also adjacent to the outer surfaces (or outermost surfaces) of the substrate. FIG. 28 illustrates that the periphery portion is adjacent to the first outer surface OS1a of the first substrate 100. FIGS. 27 to 29 illustrate an embodiment implemented by modifying a dam portion in the light emitting display apparatus illustrated in FIGS. 9 to 12. In describing FIGS. 27 to 29, only a dam portion and elements relevant thereto will be described below, the other elements are referred to by the same reference numerals as FIGS. 9 to 12, and their repetitive descriptions are omitted.

Referring to FIGS. 27 to 29, in the light emitting display apparatus according to another embodiment of the present disclosure, a dam portion 117 may include a first dam portion 117-1 and a second dam portion 117-2 disposed in parallel.

The first dam portion 117-1 may be disposed on a circuit layer 111 to have a closed loop line form in a second region of a first substrate 100. The first dam portion 117-1 according to an embodiment of the present disclosure may be disposed on a buffer layer 111a of the circuit layer 111. The first dam portion 117-1 may primarily prevent the spread or overflow of an encapsulation layer 119. Also, the first dam portion 117-1 may disconnect (or isolate) a light emitting device layer 113.

The second dam portion 117-2 may be disposed on the circuit layer 111 to have a closed loop line form surrounding the first dam portion 117-1 in the second region of the first substrate 100. The second dam portion 117-2 according to an embodiment of the present disclosure may be disposed on the buffer layer 111a of the circuit layer 111. The second dam portion 117-2 may secondarily prevent the spread or overflow of the encapsulation layer 119. Also, the second dam portion 117-2 may additionally disconnect (or isolate) the light emitting device layer 113.

Each of the first dam portion 117-1 and the second dam portion 117-2 according to an embodiment of the present disclosure may include a dam strip structure DTS, a first dam 117a, and a second dam 117b.

The dam strip structure DTS may be disposed in the circuit layer 111. The dam strip structure DTS according to an embodiment of the present disclosure may be implemented in a stack structure of an interlayer insulation layer 111c and a passivation layer 111d disposed in a dam area DA of the first substrate 100. The dam strip structure DTS may be formed by a patterning process performed on the interlayer insulation layer 111c and the passivation layer 111d.

A side surface of the dam strip structure DTS according to an embodiment of the present disclosure may be implemented in an inclined structure or a forward tapered structure. A bottom surface of the dam strip structure DTS may directly contact a top surface (or a surface) of the buffer layer 111a, and a top surface of the dam strip structure DTS may be disposed on the bottom surface of the dam strip structure DTS and may have a width which is narrower than that of the bottom surface of the dam strip structure DTS. A side surface of the dam strip structure DTS may be formed to be inclined between the top surface and the bottom surface of the dam strip structure DTS. In the dam strip structure DTS, an included angle between the bottom surface and the side surface may be an acute angle, and an included angle between the top surface and the side surface may be an obtuse angle. For example, a cross-sectional surface of the dam strip structure DTS taken along a width direction may have a cross-sectional structure having a trapezoid shape where the top surface is narrower than the bottom surface.

According to another embodiment of the present disclosure, when the interlayer insulation layer 111c is not disposed at a periphery portion of the first substrate 100, the dam strip structure DTS may be implemented with only the passivation layer 111d. The dam strip structure DTS may be formed by a patterning process performed on the passivation layer 111d disposed in the second region of the first substrate 100.

The first dam (or a lower dam) 117a may be disposed on the dam strip structure DTS. The first dam 117a may have a width which is wider than that of the top surface of the dam strip structure DTS. The first dam 117a may have a width which is wider than or equal to that of the bottom surface of the dam strip structure DTS. For example, a side surface of the first dam 117a may be implemented in an inclined structure or a tapered structure. For example, a cross-sectional surface of the first dam 117a taken along a width direction may have a cross-sectional structure having the same trapezoid shape as that of the dam strip structure DTS. With respect to the width direction, each of one side periphery portion and the other side periphery portion of the first dam 117a may protrude to the outside of the side surface of the dam strip structure DTS.

According to an embodiment of the present disclosure, the side surface of the dam strip structure DTS may have an undercut structure with respect to the first dam 117a. For example, each of the first dam portion 117-1 and the second dam portion 117-2 may include a boundary portion between the dam strip structure DTS and the first dam 117a or an undercut region disposed on an upper side surface of the dam strip structure DTS. The first dam 117a may protrude to the outside of the side surface of the dam strip structure DTS on the basis of the undercut structure of the dam strip structure DTS, and thus, may cover the side surface of the dam strip structure DTS. Accordingly, the first dam 117a may have an eaves structure with respect to the dam strip structure DTS.

The first dam 117a according to an embodiment of the present disclosure may have the same height (or thickness) as that of a planarization layer 112, or may have a height which is higher than the planarization layer 112. For example, a height (or a thickness) of the first dam 117a may be twice the height (or thickness) of the planarization layer 112.

The second dam (or an upper dam) 117b may be disposed on the first dam 117a. The second dam 117b according to an embodiment of the present disclosure may include the same material as that of a bank 114 and may be stacked on the first dam 117a. For example, a side surface of the second dam 117b may be implemented in an inclined structure or a forward tapered structure. For example, a cross-sectional surface of the second dam 117b taken along a width direction may have a cross-sectional structure having the same trapezoid shape as that of the first dam 117a.

Each of the first dam portion 117-1 and the second dam portion 117-2 according to an embodiment of the present disclosure may disconnect (or isolate) a light emitting layer EL of a light emitting device layer 113, or may disconnect (or isolate) the light emitting layer EL and a common electrode CE. For example, the light emitting layer EL formed (or deposited) on the dam portion 117 may be automatically disconnected (or isolated) by an undercut structure (or an eaves structure) of each of the first dam portion 117-1 and the second dam portion 117-2 in performing a deposition process, without a separate cutting process. Therefore, the light emitting layer EL disposed on the first substrate 100 may be disconnected (or isolated) twice in a dam area DA of the first substrate 100 and may include two discontinuity regions (or isolation regions). For example, a deposition material of the light emitting layer EL may have linearity, and thus, may not be deposited on a side surface of the dam strip structure DTS covered by the first dam 117a on the basis of the undercut structure (or the eaves structure) of each of the first dam portion 117-1 and the second dam portion 117-2. Therefore, the light emitting layer EL formed (or deposited) on the first dam portion 117-1 and the second dam portion 117-2 may be disconnected (or isolated) between the dam strip structure DTS and the first dam 117a. Accordingly, the light emitting layer EL may be automatically disconnected (or isolated) by the first dam portion 117-1 and the second dam portion 117-2 of the dam portion 117 in performing a deposition process, and thus, a separate patterning process of disconnecting (or isolating) the light emitting layer EL disposed at a periphery portion of the first substrate 100 for preventing the side transmission of water or moisture may be omitted.

Optionally, the common electrode CE disposed on the light emitting layer EL may be automatically disconnected (or isolated) by the first dam portion 117-1 and the second dam portion 117-2 of the dam portion 117 in performing a deposition process based on deposition, or may be deposited on a side surface of the dam strip structure DTS covered by the first dam 117a and may be continuously formed without a discontinuity region.

In the light emitting display apparatus according to another embodiment of the present disclosure, a discontinuity portion 115 may be implemented to disconnect (or isolate), at least once, the light emitting device layer 113 disposed in the second region of the first substrate 100.

The discontinuity portion 115 according to an embodiment of the present disclosure may include a first discontinuity portion 115a, which has a closed loop line form and surrounds the dam portion 117, and a second discontinuity portion 115b which is surrounded by the dam portion 117 and has a closed loop line form.

The first discontinuity portion 115a may include a first strip structure TS1 and a second strip structure TS2. The first discontinuity portion 115a may be substantially the same as the first discontinuity portion 115a described above with reference to FIGS. 9 to 12, and thus, like reference numerals refer to like elements and their repetitive descriptions are omitted.

The second discontinuity portion 115b may include a first strip structure TS1 and a second strip structure TS2. The second discontinuity portion 115b may be substantially the same as the fourth discontinuity portion 115d described above with reference to FIGS. 9 to 12, and thus, like reference numerals refer to like elements and their repetitive descriptions are omitted.

In the light emitting display apparatus according to another embodiment of the present disclosure, a routing portion 400 may be electrically connected to a contact pattern portion 110 through a routing contact hole CH passing through at least one of the dam portion 117 and the discontinuity portion 115 disposed on the contact pattern portion 110. Except for that the routing portion 400 is electrically connected to contact patterns PCP, DCP, RCP, GCP, and CCP of the contact pattern portion 110 through a plurality of routing contact holes (for example, first to fourth routing contact holes) CH1 to CH4 passing through each of the first dam portion 117-1 and the second dam portion 117-2 of the dam portion 117 and the first and second discontinuity portions 115a and 115b of the discontinuity portion 115, the routing portion 400 may be substantially the same as the routing portion described above with reference to FIGS. 9 to 12, and thus, its repeated description is omitted.

Additionally, the routing portion 400 may be electrically connected to the contact patterns PCP, DCP, RCP, GCP, and CCP of the contact pattern portion 110 through only first and second routing contact holes CH1 and CH2 passing through each of the first dam portion 117-1 and the second dam portion 117-2 of the dam portion 117, and in this case, each of the third and fourth routing contact holes CH3 and CH4 passing through each of the first and second discontinuity portions 115a and 115b of the discontinuity portion 115 may be omitted.

As described above, in the light emitting display apparatus according to another embodiment of the present disclosure, the overflow of an encapsulation layer 119 caused by the first dam portion 117-1 and the second dam portion 117-2 of the dam portion 117 may be more certainly prevented, and the light emitting device layer 113 may be disconnected (or isolated) by the undercut structure of the first dam portion 117-1 and the second dam portion 117-2 of the dam portion 117, whereby the number of discontinuity portions 115 may be reduced or minimized.

Figure 30:
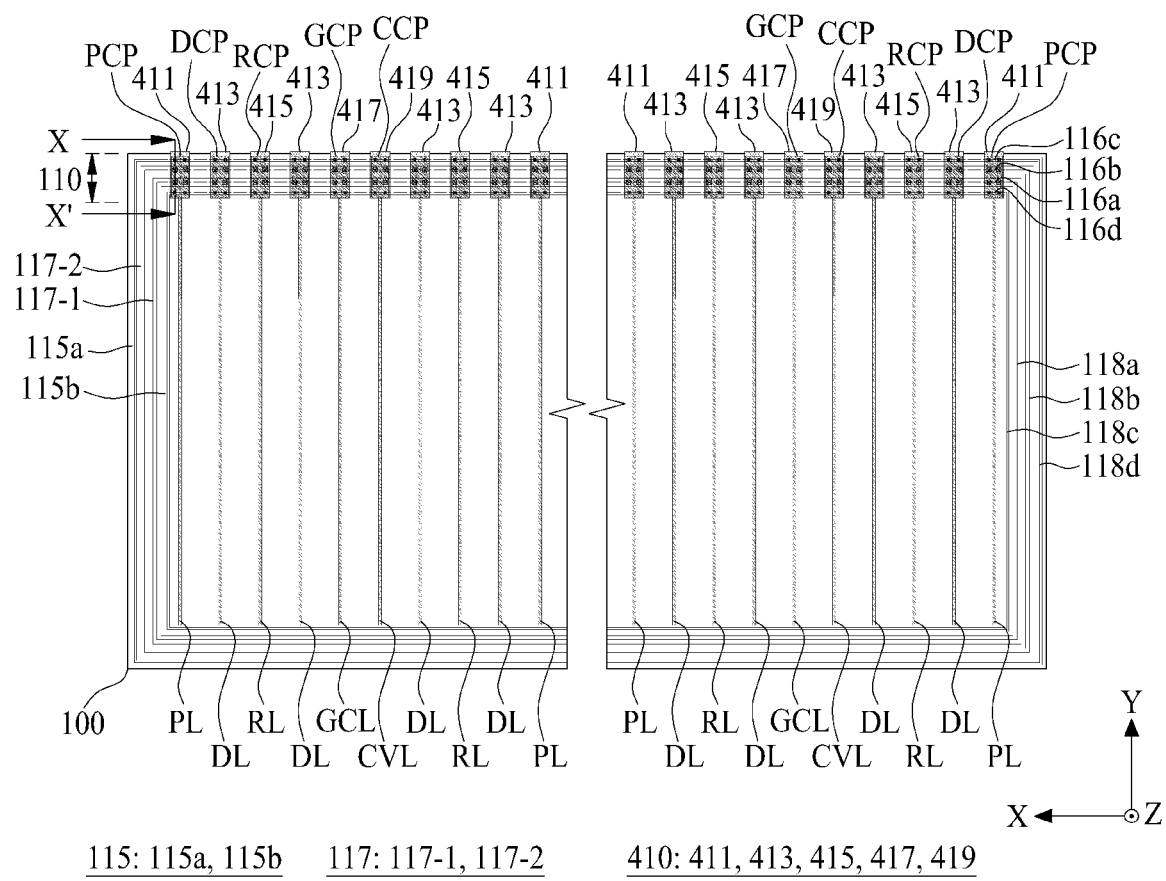
FIG. 30 is a diagram illustrating a light emitting display apparatus according to another embodiment of the present disclosure.
Figure 31:
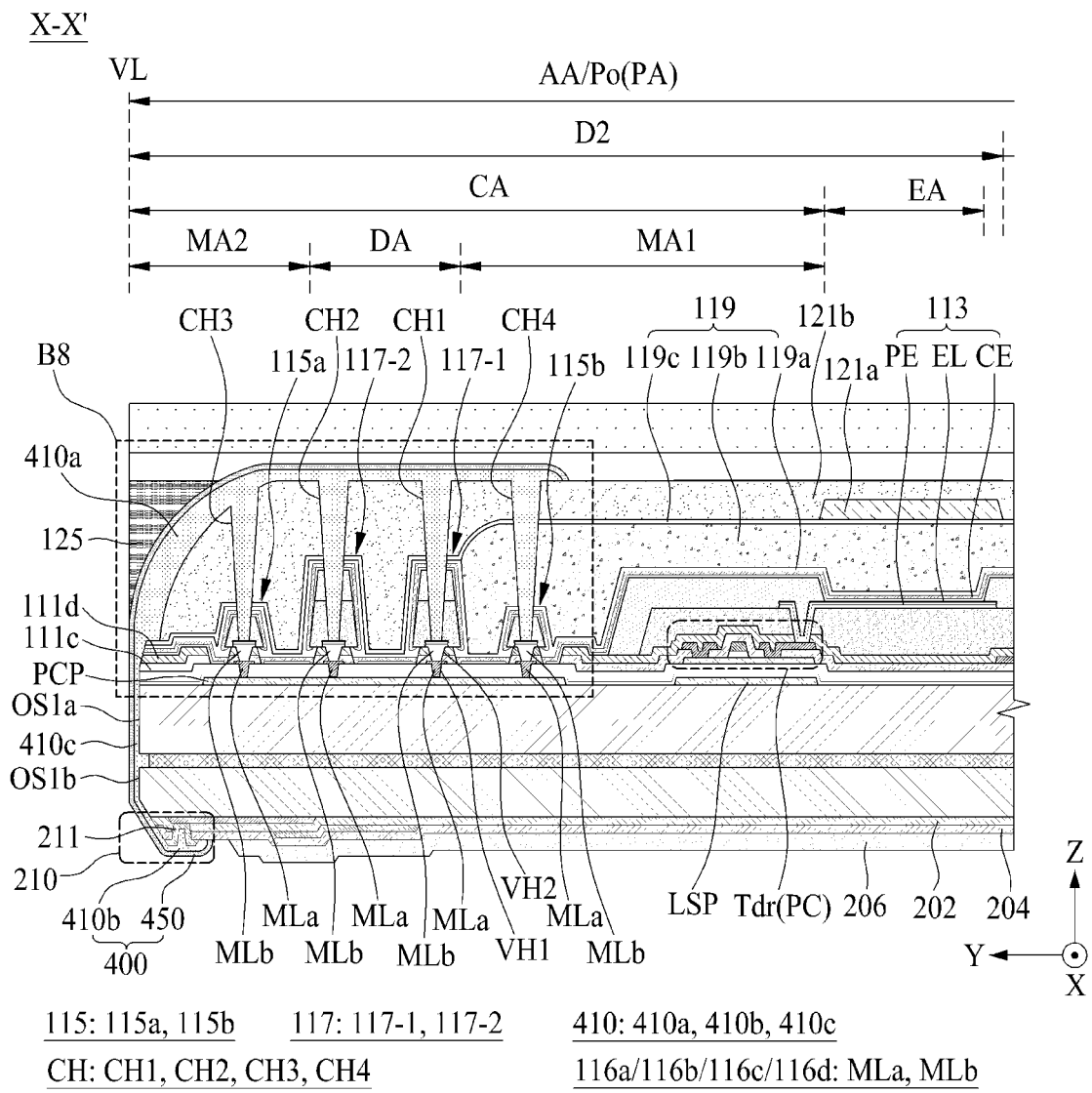
FIG. 31 is a cross-sectional view taken along line X-X' illustrated in FIG. 30.
Figure 32:
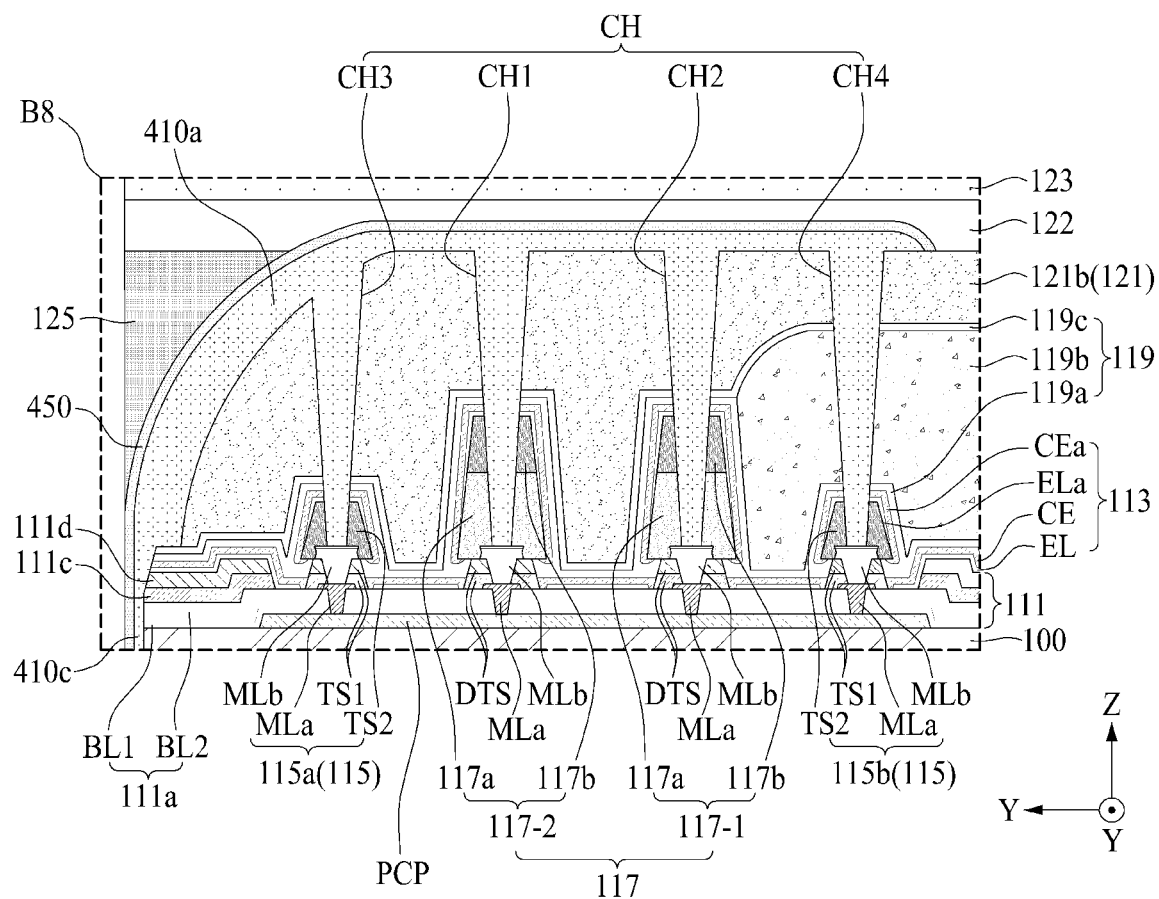
FIG. 32 is an enlarged view of a region B8 illustrated in FIG. 31.

FIG. 30 is a diagram for describing a light emitting display apparatus according to another embodiment of the present disclosure, FIG. 31 is a cross-sectional view taken along line X-X' illustrated in FIG. 30, and FIG. 32 is an enlarged view of a region B8 illustrated in FIG. 31. Region B8 includes a periphery portion of the substrate which is also adjacent to the outer surfaces (or outermost surfaces) of the substrate. FIG. 31 illustrates that the periphery portion is adjacent to the first outer surface OS1a of the first substrate 100. FIGS. 30 to 32 illustrate an embodiment where an auxiliary line portion is added to the light emitting display apparatus illustrated in FIGS. 27 to 29. In describing FIGS. 30 to 32, only a dam portion and elements relevant thereto will be described below, the other elements are referred to by the same reference numerals as FIGS. 27 to 29, and their repetitive descriptions are omitted.

Referring to FIGS. 30 to 32, the light emitting display apparatus according to another embodiment of the present disclosure may further include an auxiliary pattern portion 116 disposed between a routing portion 400 and a contact pattern portion 110 connected to a plurality of pixel driving lines PL, DL, RL, GCL, and CVL. The auxiliary pattern portion 116 may have substantially the same structure as that of the auxiliary pattern portion 116 illustrated in FIGS. 13 to 16, and thus, its repeated description is omitted or will be briefly given below.

The auxiliary pattern portion 116 according to the present embodiment may include first to fourth middle patterns 116a to 116d electrically connected between contact patterns PCP, DCP, RCP, GCP, and CCP of a contact pattern portion 110 and routing lines 410 of a routing portion 400.

Each of the first and second middle patterns 116a and 116b may be disposed in a dam portion 117.

The first middle pattern 116a may be disposed in a first dam portion 117-1 of the dam portion 117. For example, the first middle pattern 116a may be disposed between a first dam 117a and a dam strip structure DTS of the first dam portion 117-1 and may be electrically connected between the contact patterns PCP, DCP, RCP, GCP, and CCP and the routing lines 410.

The second middle pattern 116b may be disposed in a second dam portion 117-2 of the dam portion 117. For example, the second middle pattern 116b may be disposed between a first dam 117a and a dam strip structure DTS of the second dam portion 117-2 and may be electrically connected between the contact patterns PCP, DCP, RCP, GCP, and CCP and the routing lines 410.

Each of the third and fourth middle patterns 116c and 116d may be disposed in a discontinuity portion 115.

The third middle pattern 116c may be disposed in a first discontinuity structure 115a of the discontinuity portion 115. For example, the third middle pattern 116c may be disposed on a first strip structure TS1 of the first discontinuity structure 115a and may be electrically connected between the contact patterns PCP, DCP, RCP, GCP, and CCP and the routing lines 410.

The fourth middle pattern 116d may be disposed in a second discontinuity structure 115b of the discontinuity portion 115. For example, the fourth middle pattern 116d may be disposed on a first strip structure TS1 of the second discontinuity structure 115b and may be electrically connected between the contact patterns PCP, DCP, RCP, GCP, and CCP and the routing lines 410.

Each of the first to fourth middle patterns 116a to 116d may prevent an electrical or physical contact defect between the contact patterns PCP, DCP, RCP, GCP, and CCP and the routing line 410 caused by a distance between the contact patterns PCP, DCP, RCP, GCP, and CCP and the routing line 410.

Each of the first to fourth middle patterns 116a to 116d according to the present embodiment may include a first metal layer MLa and a second metal layer MLb.

The first metal layer MLa according to an embodiment of the present disclosure may be implemented on a buffer layer 111a so as to be electrically connected to the contact patterns PCP, DCP, RCP, GCP, and CCP. For example, the first metal layer MLa may be disposed on the buffer layer 111a overlapping the contact patterns PCP, DCP, RCP, GCP, and CCP and may be electrically connected to the contact patterns PCP, DCP, RCP, GCP, and CCP through a first via hole VH1 passing through the buffer layer 111a. For example, the first metal layer MLa according to an embodiment of the present disclosure may be implemented in a dot shape overlapping the contact patterns PCP, DCP, RCP, GCP, and CCP, or may be implemented in a line shape overlapping with the contact patterns PCP, DCP, RCP, GCP, and CCP in a first direction X. The first metal layer MLa according to an embodiment of the present disclosure may be implemented to have the same material and structure as those of a gate electrode of each TFT Tdr disposed in a pixel area PA, or may be implemented to have the same material and structure as those of the source/drain electrode of each TFT Tdr.

The second metal layer MLb may be implemented to be electrically connected between the first metal layer MLa and the routing lines 410. For example, the second metal layer MLb may be disposed on a passivation layer 111d overlapping the first metal layer MLa and may be electrically connected to the first metal layer MLa through a second via hole VH2 sequentially passing through the passivation layer 111d and the interlayer insulation layer 111c. The second metal layer MLb according to an embodiment of the present disclosure may be implemented in the same dot shape or line shape as that of the first metal layer MLa. The second metal layer MLb according to an embodiment of the present disclosure may be implemented to have the same material and structure as those of a pixel electrode PE disposed in the pixel area PA.

The second metal layer MLb of each of the first and second middle patterns 116a and 116b may enhance an adhesive force between a dam strip structure DTS and a first dam of the dam portion 117. The second metal layer MLb of each of the third and fourth middle patterns 116c and 116d may enhance an adhesive force between a first strip structure TS1 and a second strip structure TS2 of the discontinuity portion 115.

The light emitting display apparatus according to another embodiment of the present disclosure may further include an auxiliary line portion 118 disposed in each of the discontinuity portion 115 and the dam portion 117 disposed at the other portion, except a periphery portion, of the first substrate 100. The auxiliary line portion 118 may have substantially the same structure as that of the auxiliary line portion 118 illustrated in FIGS. 13, 14, and 17, and thus, its repetitive description is omitted or will be briefly given below.

The auxiliary line portion 118 according to the present embodiment may include first to fourth auxiliary lines 118a to 118d disposed in the discontinuity portion 115 and the dam portion 117.

Each of the first to fourth auxiliary lines 118a to 118d may be electrically floated. Each of the first to fourth auxiliary lines 118a to 118d according to an embodiment of the present disclosure may be implemented to have the same material and structure as those of the pixel electrode PE disposed in the pixel area PA. For example, each of the first to fourth auxiliary lines 118a to 118d may be formed along with the second metal layer MLb of the auxiliary pattern portion 116.

Each of the first and second auxiliary lines 118a and 118b may be disposed in the dam portion 117.

The first auxiliary line 118a may be disposed in the first dam portion 117-1 of the dam portion 117. For example, the first auxiliary line 118a may be disposed between a first dam 117a and a dam strip structure DTS of the first dam portion 117-1.

The second auxiliary line 118b may be disposed in the second dam portion 117-2 of the dam portion 117. For example, the second auxiliary line 118b may be disposed between a first dam 117a and a dam strip structure DTS of the second dam portion 117-2.

The first and second auxiliary lines 118a and 118b may enhance an adhesive force between the first dam 117a and the dam strip structure DTS of the dam portion 117.

Each of the third and fourth auxiliary lines 118c and 118d may be disposed in the discontinuity portion 115.

The third auxiliary line 118c may be disposed in the first discontinuity structure 115a of the discontinuity portion 115. For example, the third auxiliary line 118c may be disposed on a first strip structure TS1 of the first discontinuity structure 115a.

The fourth auxiliary line 118d may be disposed in the second discontinuity structure 115b of the discontinuity portion 115. For example, the fourth auxiliary line 118d may be disposed on a first strip structure TS1 of the second discontinuity structure 115b.

The third and fourth auxiliary lines 118c and 118d may enhance an adhesive force between the first strip structure TS1 and the second strip structure TS2 of the discontinuity portion 115.

As described above, the light emitting display apparatus according to another embodiment of the present disclosure may further include the auxiliary pattern portion 116 disposed between the contact patterns PCP, DCP, RCP, GCP, and CCP and the routing line 410, thereby preventing an electrical or physical contact defect between the contact patterns PCP, DCP, RCP, GCP, and CCP and the routing line 410.

Additionally, in the light emitting display apparatus according to another embodiment of the present disclosure, the auxiliary line portion 118 may be used as a signal supply line like the light emitting display apparatus illustrated in FIGS. 18 to 26.

According to an embodiment of the present disclosure, as illustrated in FIGS. 18 to 22, each of the first and second auxiliary lines 118a and 118b may be electrically connected to first and last pixel driving power lines PL among a plurality of pixel driving power lines PL at one side (or one side corner portion) and the other side (or the other side corner portion) of one side periphery portion of the first substrate 100 and may be electrically connected to a first portion 410a of each of first and last pixel driving power routing lines 411 among a plurality of pixel driving power routing lines 411 through at least one routing contact holes CH2 and CH3. Additionally, each of the first and second auxiliary lines 118a and 118b may be electrically (or in common) connected to the other side of each of the pixel driving power lines PL at the other side periphery portion of the first substrate 100. Accordingly, because the pixel driving power lines PL are connected to the first and second auxiliary lines 118a and 118b, the voltage drop (IR drop) of a pixel driving power caused by a line resistance of each of the pixel driving power lines PL may be reduced, and thus, the uniformity of the pixel driving power may be enhanced.

According to an embodiment of the present disclosure, as illustrated in FIGS. 18 to 22, each of the third and fourth auxiliary lines 118c and 118d may be formed to have a closed loop line form on the first substrate 100. Each of the third and fourth auxiliary lines 118c and 118d may be electrically connected to a plurality of pixel common voltage lines CVL at the one side periphery portion of the first substrate 100 and may be electrically connected to only a first portion 410a of each of a plurality of pixel common voltage routing lines 419 through at least one routing contact holes CH3 and CH4. Additionally, each of the third and fourth auxiliary lines 118c and 118d may be electrically (or in common) connected to the other side of each of the pixel common voltage lines CVL at the other side periphery portion of the first substrate 100. Accordingly, each of the third and fourth auxiliary lines 118c and 118d may maintain the same electrical potential as that of the pixel common voltage lines CVL, and thus, may cut off static electricity flowing into a display portion AA from the outside, thereby preventing a defect caused by the static electricity.

According to an embodiment of the present disclosure, as illustrated in FIG. 23, one of the first and second auxiliary lines 118a and 118b or the fourth auxiliary line 118d may be formed to be electrically connected to first and last reference voltage contact patterns RCP among a plurality of reference voltage contact patterns RCP disposed in the contact pattern portion 110. Additionally, one of the first and second auxiliary lines 118a and 118b or the fourth auxiliary line 118d may be electrically (or in common) connected to the other side of each of a plurality of reference voltage lines RL at the other side periphery portion of the first substrate 100. Accordingly, because the reference voltage lines RL are connected to one of the first and second auxiliary lines 118a and 118b or the fourth auxiliary line 118d, the voltage drop (IR drop) of the reference voltage caused by a line resistance of each of the reference voltage lines RL may be reduced, and thus, the uniformity of the reference voltage may be enhanced.

According to an embodiment of the present disclosure, as illustrated in FIGS. 24 to 26, the first to fourth auxiliary lines 118a to 118d may be electrically (or in common) connected to one another through an auxiliary connection line SCL. Also, the fourth auxiliary line 118d may be formed to have a closed loop line form on the first substrate 100 and may be formed to be electrically connected to only the pixel common voltage contact patterns CCP disposed in the contact pattern portion 110. Accordingly, each of the first to fourth auxiliary lines 118a to 118d may maintain the same electrical potential as that of the pixel common voltage lines CVL, and thus, may cut off static electricity flowing into the display portion AA from the outside, thereby preventing a defect caused by the static electricity.

Figure 33:
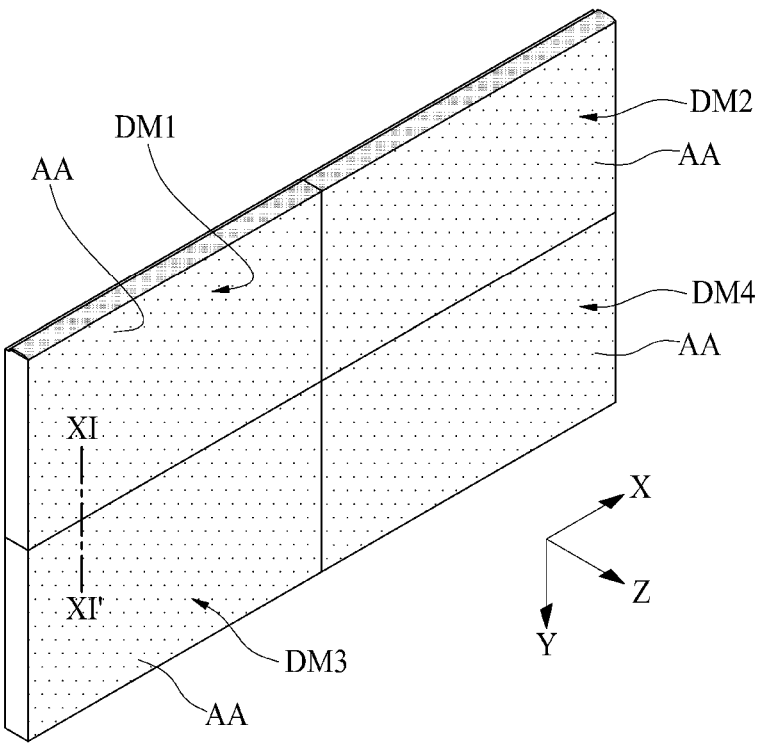
FIG. 33 is a diagram illustrating a multi-screen light emitting display apparatus according to an embodiment of the present disclosure.
Figure 34:
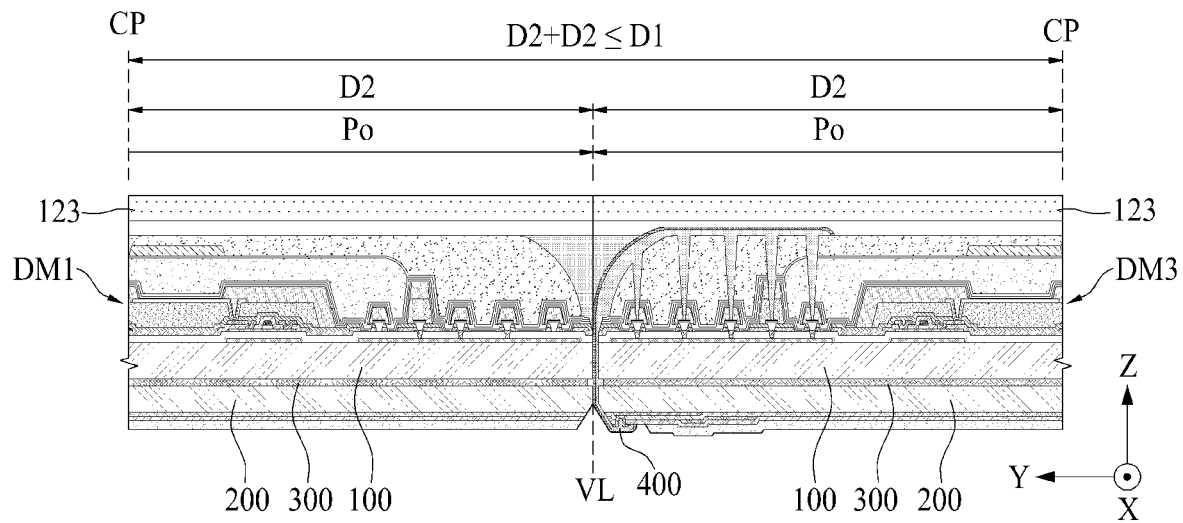
FIG. 34 is a cross-sectional view taken along line XI-XI' illustrated in FIG. 33.

FIG. 33 is a diagram illustrating a multi-screen display apparatus according to an embodiment of the present disclosure, and FIG. 34 is a cross-sectional view taken along line XI-XI' illustrated in FIG. 33. FIGS. 33 and 34 illustrate a multi-screen display apparatus implemented by tiling the light emitting display apparatus according to an embodiment of the present disclosure illustrated in FIGS. 1 to 30.

Referring to FIGS. 33 and 34, the multi-screen display apparatus (or a tiling display apparatus) according to an embodiment of the present disclosure may include a plurality of display devices DM1 to DM4.

The plurality of display devices DM1 to DM4 may each display an individual image or may divisionally display one image. Each of the plurality of display devices DM1 to DM4 may include the light emitting display apparatus according to an embodiment of the present disclosure illustrated in FIGS. 1 to 30, and thus, their repetitive descriptions are omitted or will be briefly given. Each of the plurality of display devices DM1 to DM4 illustrated in FIG. 34 illustrates the light emitting display apparatus illustrated in FIGS. 13 to 17, but embodiments of the present disclosure are not limited thereto.

The plurality of display devices DM1 to DM4 may be tiled on a separate tiling frame to contact each other at a side surface thereof. For example, the plurality of display devices DM1 to DM4 may be tiled to have an N×M form, thereby implementing a multi-screen display apparatus having a large screen. For example, N is a positive integer of 1 or more and M is a positive integer of 2 or more, but embodiments of the present disclosure are not limited thereto, for example, N is a positive integer of 2 or more and M is a positive integer of 1 or more.

Each of the plurality of display devices DM1 to DM4 may not include a bezel area (or a non-display area) surrounding all of a display area AA where an image is displayed, and may have an air-bezel structure where the display area AA is surrounded by air. For example, in each of the plurality of display devices DM1 to DM4, all of a first surface of a first substrate 100 may be implemented as the display area AA.

According to the present embodiment, in each of the plurality of display devices DM1 to DM4, a second interval D2 between a center portion CP of an outermost pixel Po and an outermost outer surface of the first substrate 100 (or a vertical extension line VL vertically extending from the outer surface of the first substrate 100) may be implemented to be half or less of a first interval D1 (or a pixel pitch) between adjacent pixels. Accordingly, in two adjacent display devices connected to (or contacting) each other at side surfaces thereof along the first direction X and the second direction Y based on a lateral coupling manner, an interval "D2+D2" between adjacent outermost pixel areas PAo may be equal to or less than the first interval D1 between two adjacent pixels.

Referring to FIG. 34, in first and third display devices DM1 and DM3 connected to (or contacting) each other at side surfaces thereof along the second direction Y, the interval "D2+D2" between a center portion CP of an outermost pixel Po of the first display device DM1 and a center portion CP of an outermost pixel Po of the third display device DM3 may be equal to or less than the first interval D1 (or a pixel pitch) between two adjacent pixels disposed in each of the first and third display devices DM1 and DM3.

Therefore, the interval "D2+D2" between center portions CP of outermost pixels Po of two adjacent display devices connected to (or contacting) each other at side surfaces thereof along the first direction X and the second direction Y may be equal to or less than the first interval D1 between two adjacent pixels disposed in each of the display devices DM1 to DM4, and thus, there may be no seam or boundary portion between two adjacent display devices, whereby there may be no dark area caused by a boundary portion provided between the display devices DM1 to DM4. As a result, the image displayed on the multi-screen display device in which the plurality of display devices DM1, DM2, DM3, and DM4 are tiled in an NxM form may be displayed continuously without a sense of disconnection (or discontinuity) at boundary between the plurality of display devices DM1, DM2, DM3, and DM4.

In FIGS. 33 and 34, it is illustrated that the plurality of display devices DM1 to DM4 are tiled in a 2×2 form, but embodiments of the present disclosure are not limited thereto and the plurality of display devices DM1 to DM4 may be tiled in an x×1 form, a 1×y form, or an x×y form. For example, x and y may be two or more natural numbers equal to or different from each other.

As described above, in a case where the display area AA of each of the plurality of display devices DM1 to DM4 is one screen and displays one image, a multi-screen display apparatus according to the present disclosure may display an image which is not disconnected and is continuous at a boundary portion between the plurality of display devices DM1 to DM4, and thus, the immersion of a viewer watching an image displayed by the multi-screen display apparatus may be enhanced.

The present disclosure can also provide a number of additional features and embodiments as stated below and elsewhere herein.

In some embodiments, a light emitting display apparatus may comprise a substrate having a front periphery portion and an outer surface; a display portion including a plurality of pixel areas disposed on the substrate; a circuit layer including a plurality of pixel driving lines disposed in the plurality of pixel areas; a light emitting device layer including a light emitting layer disposed on the circuit layer in the plurality of pixel areas; an encapsulation layer disposed on the light emitting device layer; and a routing portion surrounding the front periphery portion and the outer surface of the substrate and including a plurality of routing lines which pass through the encapsulation layer disposed at the front periphery portion of the substrate to be connected to the plurality of pixel driving lines.

The light emitting display apparatus may further comprise a contact pattern portion including a plurality of contact patterns disposed on the circuit layer and connected to the plurality of pixel driving lines, wherein the plurality of routing lines pass through the encapsulation layer disposed at a periphery portion of the substrate and are electrically coupled to the plurality of contact patterns.

The light emitting display apparatus may have each of the plurality of contact patterns is disposed on a same layer as the plurality of pixel driving lines and extend from each of the plurality of pixel driving lines.

The light emitting display apparatus may further comprise a plurality of auxiliary patterns electrically coupled between the plurality of contact patterns and the plurality of routing lines.

The light emitting display apparatus may have each of the plurality of auxiliary patterns comprises: a first metal layer electrically coupled to a corresponding contact pattern of the plurality of contact patterns; and a second metal layer disposed on the first metal layer and electrically coupled to a corresponding routing line of the plurality of routing lines.

The light emitting display apparatus may have the circuit layer comprising a buffer layer disposed on the plurality of pixel driving lines and the plurality of contact patterns; and at least one insulation layer disposed on the buffer layer; and each of the plurality of auxiliary patterns comprises: a first metal layer disposed on the buffer layer overlapping the plurality of contact patterns and electrically coupled to the plurality of contact patterns through a first via hole formed at the buffer layer; and a second metal layer disposed on the at least one insulation layer overlapping the first metal layer and electrically coupled to the first metal layer through a second via hole formed at the at least one insulation layer, and the plurality of routing lines are electrically coupled to the second metal layer of each of the plurality of auxiliary patterns through a routing contact hole passing through the encapsulation layer.

The light emitting display apparatus may further comprise a dam portion disposed on the circuit layer along the periphery portion of the substrate, wherein the encapsulation layer comprises: a first encapsulation layer disposed on the light emitting device layer and the dam portion; a second encapsulation layer disposed on the first encapsulation layer and surrounded by the dam portion; and a third encapsulation layer disposed on the second encapsulation layer and the first encapsulation layer on the dam portion, wherein the plurality of routing lines are electrically coupled to the plurality of contact patterns through a routing contact hole passing through the third encapsulation layer, the first encapsulation layer, and the dam portion.

The light emitting display apparatus may further comprise a plurality of auxiliary patterns disposed in the dam portion and electrically coupled between the plurality of contact patterns and the plurality of routing lines.

The light emitting display apparatus may have the dam portion comprises: a first dam portion disposed on the circuit layer along the periphery portion of the substrate; and a second dam portion disposed on the circuit layer to surround the first dam portion, wherein the plurality of routing lines are electrically coupled to the plurality of contact patterns through at least one first routing contact hole passing through the third encapsulation layer, the first encapsulation layer, and the first dam portion and are electrically coupled to the plurality of contact patterns through at least one second routing contact hole passing through the third encapsulation layer, the first encapsulation layer, and the second dam portion.

The light emitting display apparatus may further comprise a plurality of auxiliary patterns disposed in each of the first dam portion and the second dam portion and electrically coupled between the plurality of contact patterns and the plurality of routing lines.

The light emitting display apparatus may have each of the first dam portion and the second dam portion comprises: a dam strip structure disposed at the circuit layer; a first dam disposed on the dam strip structure; a second dam disposed on the first dam; and an undercut region disposed at a boundary portion between the dam strip structure and the first dam.

The light emitting display apparatus may further comprise a dam portion disposed on the circuit layer along the periphery portion of the substrate; and a discontinuity portion disposed on the circuit layer along the periphery portion of the substrate to isolate the light emitting layer, wherein the encapsulation layer comprises: a first encapsulation layer disposed on the light emitting device layer, the dam portion, and the discontinuity portion; a second encapsulation layer disposed on the first encapsulation layer and surrounded by the dam portion; and a third encapsulation layer disposed on the second encapsulation layer and the first encapsulation layer on the dam portion, wherein the plurality of routing lines are electrically coupled to the plurality of contact patterns through a routing contact hole passing through the third encapsulation layer and the first encapsulation layer and additionally passing through at least one of the dam portion and the discontinuity portion.

The light emitting display apparatus may have the discontinuity portion comprises at least one discontinuity structure disposed on the circuit layer along the periphery portion of the substrate, and the at least one discontinuity structure comprises: a first strip structure disposed at the circuit layer; a second strip structure disposed on the first strip structure; and an undercut region at a boundary portion between the first strip structure and the second strip structure.

The light emitting display apparatus may further comprise a plurality of auxiliary patterns disposed at one or more of the dam portion and the discontinuity portion and electrically coupled between the plurality of contact patterns and the plurality of routing lines.

The light emitting display apparatus may have each of the plurality of auxiliary patterns comprises: a first metal layer electrically coupled to a corresponding contact pattern of the plurality of contact patterns; and a second metal layer disposed on the first metal layer and electrically coupled to a corresponding routing line of the plurality of routing lines.

The light emitting display apparatus may further comprise an auxiliary line portion disposed at the other side periphery portion, except one side periphery portion, of the substrate on which the plurality of contact patterns are disposed, wherein the auxiliary line portion includes an auxiliary line disposed at one or more of the dam portion and the discontinuity portion.

The light emitting display apparatus may have the plurality of pixel driving lines comprise a data line, a pixel driving power line, and a pixel common voltage line; and the auxiliary line is electrically coupled to either the pixel driving power line or the pixel common voltage line.

The light emitting display apparatus may further comprise an auxiliary line portion disposed at the periphery portion of the substrate, wherein the auxiliary line portion includes: a plurality of auxiliary lines disposed at the other side periphery portion, except one side periphery portion, of the substrate on which the plurality of contact patterns are disposed; and at least one closed loop line disposed in a closed loop line form along the periphery portion of the substrate.

The light emitting display apparatus may have the plurality of pixel driving lines comprise a data line, a pixel driving power line, and a pixel common voltage line, and wherein the at least one closed loop line is electrically coupled to the pixel common voltage line.

The light emitting display apparatus may have the plurality of auxiliary lines are electrically coupled to the pixel driving power line.

The light emitting display apparatus may further comprise an auxiliary connection line coupled to the plurality of auxiliary lines and the at least one closed loop line in common.

The light emitting display apparatus may have a size of the display portion is the same as a size of the substrate.

In some embodiments, a display apparatus may comprise a substrate including a periphery portion adjacent to outer surfaces of the substrate, at least one of the outer surfaces including an outermost surface of the substrate; a plurality of pixels on the substrate defining a display area; a plurality of signal lines coupled to the plurality of pixels; a light emitting device layer included in each of the plurality of pixels; an encapsulation layer on the light emitting device layer; and a plurality of routing lines extending to the periphery portion and at least partially covering the outermost surface of the substrate.

The display apparatus may have the periphery portion is located within the display area.

The display apparatus may have the encapsulation layer and at least one of the plurality of routing lines overlap with each other at the periphery portion.

The display apparatus may have at least one of the plurality of routing lines is on and contacting the outer surface of the substrate.

The display apparatus may have at least one of the plurality of routing lines is extending through the encapsulation layer disposed at the periphery portion of the substrate.

The display apparatus may further comprise a discontinuity wall in the periphery portion of the substrate to disconnect the light emitting device layer, wherein the encapsulation layer is on the discontinuity wall, and wherein at least one of the plurality of routing lines extends into the encapsulation layer and the discontinuity wall.

The display apparatus may further comprise a discontinuity wall in the periphery portion of the substrate to disconnect the light emitting device layer, and a dam portion adjacent to the discontinuity wall in the periphery portion of the substrate, wherein the dam portion has a height different from the discontinuity wall, and wherein at least one of the plurality of routing lines extends into the encapsulation layer and the dam portion.

The display apparatus may have the encapsulation layer includes: a first encapsulation layer disposed on the light emitting device layer and the dam portion; and a second encapsulation layer disposed on the first encapsulation layer and not extending beyond the dam portion, wherein the plurality of routing lines overlap with the second encapsulation layer.

The display apparatus may further comprise a plurality of auxiliary lines adjacent to the plurality of routing lines, the plurality of auxiliary lines including: a first conductive structure overlapping the discontinuity wall, wherein the first conductive structure is electrically coupled to the plurality of routing lines.

The display apparatus may have the plurality of auxiliary lines further includes: a second conductive structure on the first conductive structure, the second conductive structure overlapping the discontinuity wall, wherein the second conductive structure is electrically coupled to the plurality of routing lines.

In some embodiments, a display apparatus may comprise a first substrate having a first surface adjacent to an edge of the first substrate; a second substrate facing the first substrate, the second substrate having a second surface adjacent to an edge of the second substrate, the second surface and the first surface being adjacent to each other; a plurality of pixels on the first substrate; a plurality of signal lines coupled to the plurality of pixels; a light emitting device layer on each of the plurality of pixels and the edge of the first substrate; and a plurality of routing lines extending from the first substrate, at least one of the plurality of routing lines extending over the first surface of the first substrate and the second surface of the second substrate forming an electrical connection between the first substrate and the second substrate.

The display apparatus may have the plurality of pixels on the first substrate defining a display area which extends to the edge of the first substrate.

The display apparatus may further comprise an encapsulation layer on the light emitting device layer, wherein the plurality of routing lines are adjacent to the edge of the first substrate and on the encapsulation layer.

The display apparatus may further comprise a contact pattern portion on the first substrate adjacent to an outermost pixel of the plurality of pixels, the contact pattern portion electrically coupled to the plurality of signal lines, wherein at least one routing line among the plurality of routing lines extends through the encapsulation layer to couple to the contact pattern portion.

The display apparatus may further comprise a discontinuity wall adjacent to the edge of the first substrate to disconnect the light emitting device layer, the discontinuity wall on the contact pattern portion, wherein the at least one routing line among the plurality of routing lines extends through the encapsulation layer and the discontinuity wall to couple to the contact pattern portion.

The display apparatus may further comprise a dam adjacent to the discontinuity wall, the dam having a higher height than the discontinuity wall, wherein the at least one routing line among the plurality of routing lines extends through the encapsulation layer and the dam to couple to the contact pattern portion.

The display apparatus may further comprise a first auxiliary conductive structure on the contact pattern portion, the first auxiliary conductive structure overlapping a location of either the discontinuity wall or the dam, wherein the at least one routing line among the plurality of routing lines extends through the encapsulation layer to couple to the first auxiliary conductive structure.

The display apparatus may further comprise a second auxiliary conductive structure on the contact pattern portion, the second auxiliary conductive structure on the first auxiliary conductive structure and overlapping a location of either the discontinuity wall or the dam, wherein the at least one routing line among the plurality of routing lines extends through the encapsulation layer to couple to the first and second auxiliary conductive structures.

In addition, the concepts provided herein can be part of a multi-screen display apparatus comprising: a plurality of display devices disposed along at least one direction of a first direction and a second direction crossing the first direction, wherein each of the plurality of display devices comprises the light emitting display apparatus or the display apparatus as described herein.

The multi-screen display apparatus may have the display portion comprise a plurality of pixels arranged at a pixel pitch in the first direction and the second direction, wherein the pixel pitch is a distance between center portions of pixels adjacent to each other in each of the first direction and the second direction, and wherein in a first display device and a second display device adjacent to each other in each of the first direction and the second direction, a distance between a center portion of an outermost pixel of the first display device and a center portion of an outermost pixel of the second display device is less than or equal to the pixel pitch.

The multi-screen display apparatus may have in each of the plurality of display devices, the plurality of pixels are arranged at a pixel pitch in the first direction and the second direction, wherein the pixel pitch is a distance between a center of pixels adjacent to each other in each of the first direction and the second direction, and wherein in a first display device and a second display device adjacent to each other in each of the first direction and the second direction, a distance between a center portion of an outermost pixel of the first display device and a center portion of an outermost pixel of the second display device is less than or equal to the pixel pitch.

The light emitting display apparatus according to the present disclosure may be applied to all electronic devices including a light emitting display panel. For example, the light emitting display apparatus according to the present disclosure may be applied to mobile apparatuses, video phones, smart watches, watch phones, wearable apparatuses, foldable apparatuses, rollable apparatuses, bendable apparatuses, flexible apparatuses, curved apparatuses, electronic organizers, electronic books, portable multimedia players (PMPs), personal digital assistants (PDAs), MP3 players, mobile medical apparatuses, desktop personal computers (PCs), laptop PCs, netbook computers, workstations, navigation apparatuses, automotive navigation apparatuses, automotive light emitting display apparatuses, automotive apparatuses, theater apparatuses, theater light emitting display apparatuses, TVs, wall paper display apparatuses, signage apparatuses, game machines, notebook computers, monitors, cameras, camcorders, home appliances, etc.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the embodiments.

The invention claimed is:

1. A display apparatus comprising:
   a substrate including a periphery portion adjacent to outer surfaces of the substrate, at least one of the outer surfaces including an outermost surface of the substrate;
   a plurality of pixels on the substrate defining a display area;
   a plurality of signal lines coupled to the plurality of pixels;
   a light emitting device layer included in each of the plurality of pixels;
   an encapsulation layer on the light emitting device layer; and
   a plurality of routing lines extending to the periphery portion and at least partially covering the outermost surface of the substrate,
   wherein at least one of the plurality of routing lines extends through a routing contact hole provided in the encapsulation layer.

2. The display apparatus of claim 1, wherein the periphery portion is located within the display area.

3. The display apparatus of claim 1, wherein the encapsulation layer and at least one of the plurality of routing lines overlap with each other at the periphery portion.

4. The display apparatus of claim 1, wherein at least one of the plurality of routing lines is on and contacting the outer surface of the substrate.

5. The display apparatus of claim 1, wherein at least one of the plurality of routing lines is extending through the encapsulation layer disposed at the periphery portion of the substrate.

6. The display apparatus of claim 1, further comprising a discontinuity wall in the periphery portion of the substrate to disconnect the light emitting device layer,
   wherein the encapsulation layer is on the discontinuity wall, and
   wherein at least one of the plurality of routing lines extends into the encapsulation layer and the discontinuity wall.

7. The display apparatus of claim 1, further comprising a discontinuity wall in the periphery portion of the substrate to disconnect the light emitting device layer, and a dam portion adjacent to the discontinuity wall in the periphery portion of the substrate,
   wherein the dam portion has a height different from the discontinuity wall, and
   wherein at least one of the plurality of routing lines extends into the encapsulation layer and the dam portion.

8. The display apparatus of claim 7, wherein the encapsulation layer includes:
   a first encapsulation layer disposed on the light emitting device layer and the dam portion; and
   a second encapsulation layer disposed on the first encapsulation layer and not extending beyond the dam portion,
   wherein the plurality of routing lines overlap with the second encapsulation layer.

9. The display apparatus of claim 6, further comprising a plurality of auxiliary lines adjacent to the plurality of routing lines, the plurality of auxiliary lines including:

a first conductive structure overlapping the discontinuity wall,
wherein the first conductive structure is electrically coupled to the plurality of routing lines.

10. The display apparatus of claim 9, wherein the plurality of auxiliary lines further includes:
a second conductive structure on the first conductive structure, the second conductive structure overlapping the discontinuity wall,
wherein the second conductive structure is electrically coupled to the plurality of routing lines.

11. A multi-screen display apparatus comprising:
a plurality of display devices disposed along at least one direction of a first direction and a second direction transverse to the first direction,
wherein each of the plurality of display devices includes the display apparatus of claim 1.

12. The multi-screen display apparatus of claim 11, wherein, in each of the plurality of display devices, the plurality of pixels are arranged at a pixel pitch in the first direction and the second direction,
wherein the pixel pitch is a distance between a center of pixels adjacent to each other in each of the first direction and the second direction, and
wherein in a first display device and a second display device adjacent to each other in each of the first direction and the second direction, a distance between a center portion of an outermost pixel of the first display device and a center portion of an outermost pixel of the second display device is less than or equal to the pixel pitch.

13. A display apparatus comprising:
a first substrate having a first surface adjacent to an edge of the first substrate;
a second substrate facing the first substrate, the second substrate having a second surface adjacent to an edge of the second substrate, the second surface and the first surface being adjacent to each other;
a plurality of pixels on the first substrate;
a plurality of signal lines coupled to the plurality of pixels;
a light emitting device layer on each of the plurality of pixels and the edge of the first substrate;
an encapsulation layer on the light emitting device layer,
a plurality of routing lines extending from the first substrate, at least one of the plurality of routing lines extending over the first surface of the first substrate and the second surface of the second substrate forming an electrical connection between the first substrate and the second substrate,
wherein the plurality of routing lines is adjacent to the edge of the first substrate and on the encapsulation layer.

14. The display apparatus of claim 13, wherein the plurality of pixels on the first substrate defines a display area which extends to the edge of the first substrate.

15. The display apparatus of claim 13, further comprising a contact pattern portion on the first substrate adjacent to an outermost pixel of the plurality of pixels, the contact pattern portion electrically coupled to the plurality of signal lines, wherein at least one routing line among the plurality of routing lines extends through the encapsulation layer to couple to the contact pattern portion.

16. The display apparatus of claim 15, further comprising a discontinuity wall adjacent to the edge of the first substrate to disconnect the light emitting device layer, the discontinuity wall being on the contact pattern portion, wherein the at least one routing line among the plurality of routing lines extends through the encapsulation layer and the discontinuity wall to couple to the contact pattern portion.

17. The display apparatus of claim 16, further comprising a dam adjacent to the discontinuity wall, the dam having a higher height than the discontinuity wall, wherein the at least one routing line among the plurality of routing lines extends through the encapsulation layer and the dam to couple to the contact pattern portion.

18. The display apparatus of claim 17, further comprising a first auxiliary conductive structure on the contact pattern portion, the first auxiliary conductive structure overlapping a location of either the discontinuity wall or the dam, wherein the at least one routing line among the plurality of routing lines extends through the encapsulation layer to couple to the first auxiliary conductive structure.

19. The display apparatus of claim 18, further comprising a second auxiliary conductive structure on the contact pattern portion, the second auxiliary conductive structure being on the first auxiliary conductive structure and overlapping a location of either the discontinuity wall or the dam, wherein the at least one routing line among the plurality of routing lines extends through the encapsulation layer to couple to the first and second auxiliary conductive structures.

* * * * *